United States Patent
Sugisaki et al.

(10) Patent No.: US 10,381,081 B2
(45) Date of Patent: Aug. 13, 2019

(54) THREE DIMENSIONAL MEMORY DEVICE WITH MULTIPLE STACKED ELECTRODE LAYERS

(71) Applicant: Toshiba Memory Corporation, Minato-ku (JP)

(72) Inventors: Tsuyoshi Sugisaki, Yokkaichi (JP); Yasuhito Nakajima, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/919,250

(22) Filed: Mar. 13, 2018

(65) Prior Publication Data

US 2019/0080764 A1 Mar. 14, 2019

(30) Foreign Application Priority Data

Sep. 8, 2017 (JP) .................. 2017-173536

(51) Int. Cl.
| | |
|---|---|
| *G11C 16/04* | (2006.01) |
| *G11C 16/24* | (2006.01) |
| *G11C 11/56* | (2006.01) |
| *G11C 16/08* | (2006.01) |
| *G11C 16/26* | (2006.01) |

(52) U.S. Cl.
CPC ...... *G11C 16/0483* (2013.01); *G11C 11/5642* (2013.01); *G11C 16/08* (2013.01); *G11C 16/24* (2013.01); *G11C 16/26* (2013.01)

(58) Field of Classification Search
CPC ..... G11C 16/0483; G11C 16/26; G11C 16/24; G11C 16/08; G11C 16/0491; G11C 11/5642
See application file for complete search history.

(56) References Cited

U.S. PATENT DOCUMENTS

| | | | | |
|---|---|---|---|---|
| 8,163,616 B2* | 4/2012 | Kang | .................. | H01L 27/115 257/326 |
| 9,122,568 B2 | 9/2015 | Aritome | | |
| 9,208,891 B2 | 12/2015 | Tanzawa | | |
| 2011/0286275 A1* | 11/2011 | Jeon | ................... | G11C 16/0483 365/185.17 |
| 2016/0027793 A1* | 1/2016 | Yip | ...................... | H01L 27/115 365/185.18 |

* cited by examiner

*Primary Examiner* — Richard Elms
*Assistant Examiner* — Sultana Begum
(74) *Attorney, Agent, or Firm* — Oblon, McClelland, Maier & Neustadt, L.L.P.

(57) ABSTRACT

A memory device includes first and second electrode layers, first and second semiconductor pillars, an interconnect, and a first connecting conductor. The first and second electrode layers are stacked in a first direction. The second electrode layers are positioned in the first direction when viewed from the first electrode layers. The first semiconductor pillar extends in the first direction through the first electrode layers. The second semiconductor pillar extends in the first direction through the second electrode layers. The interconnect is provided between the first and second electrode layers, and is electrically connected to the first and second semiconductor pillars. The first connecting conductor extends in the first direction, is connected to one of the first electrode layers and one of the second electrode layers. The first connecting conductor extends in the first direction, and crosses at least one of the second electrode layers.

13 Claims, 51 Drawing Sheets

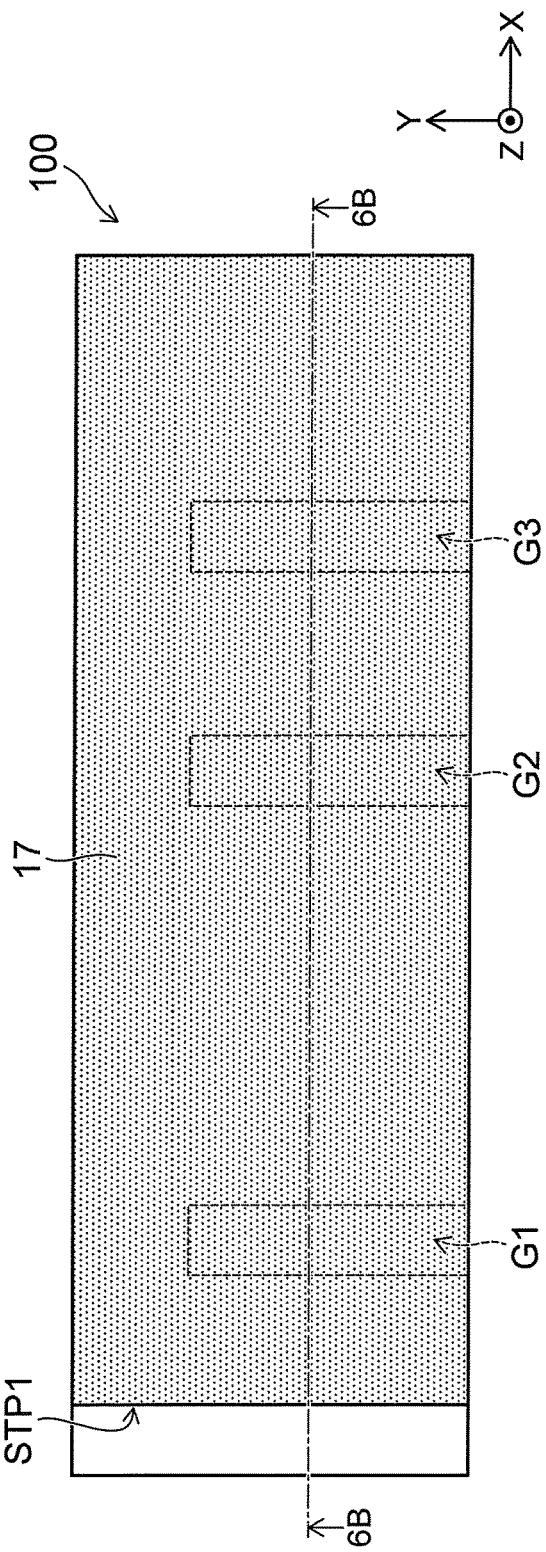
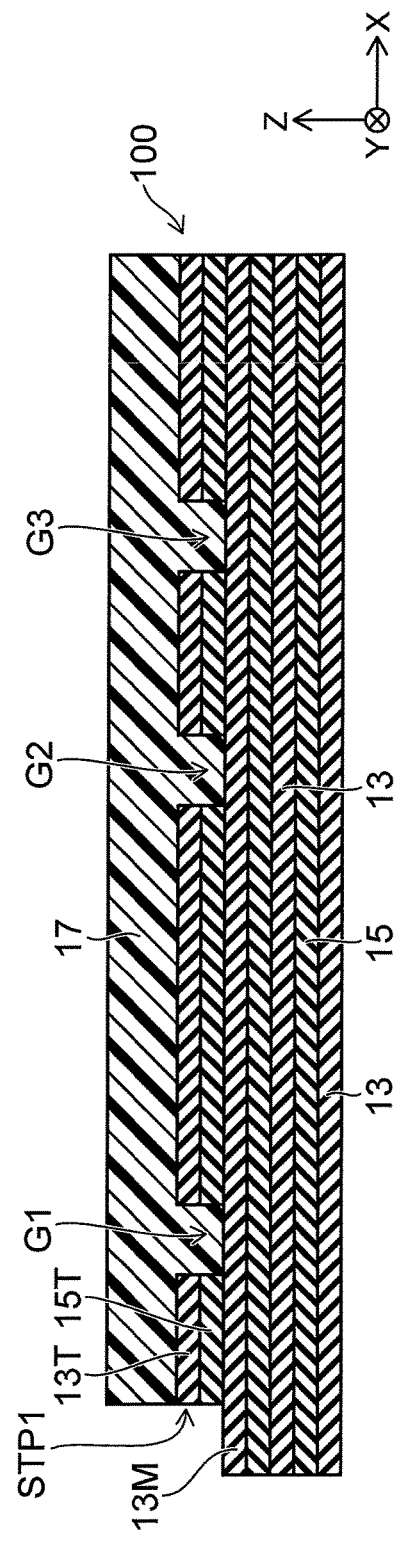

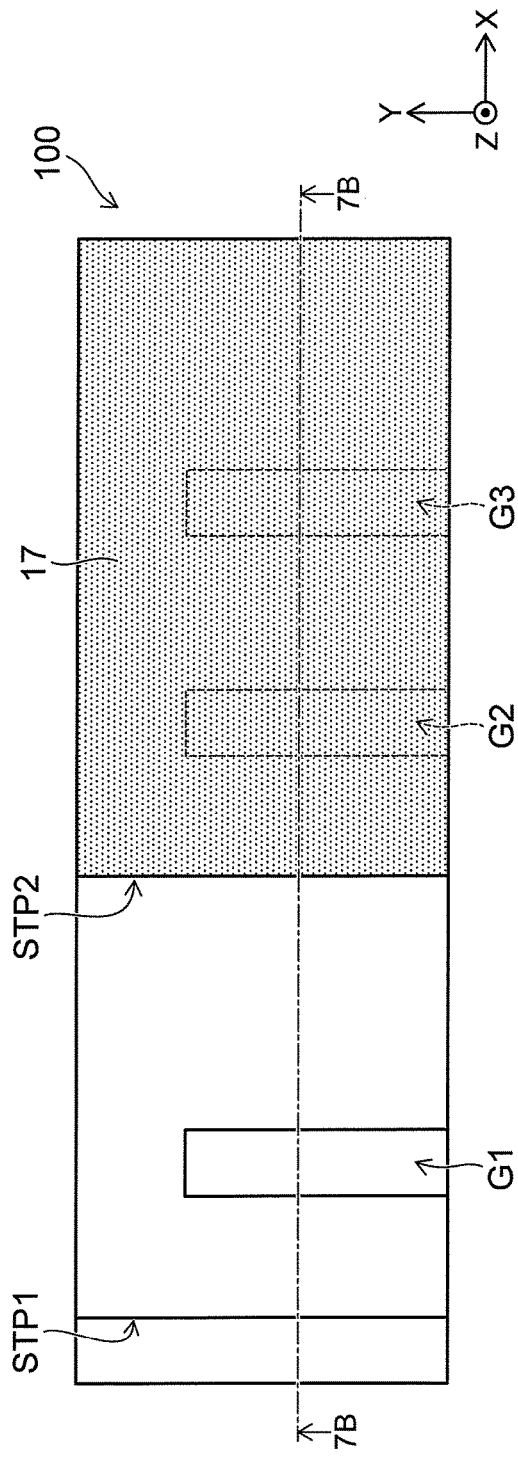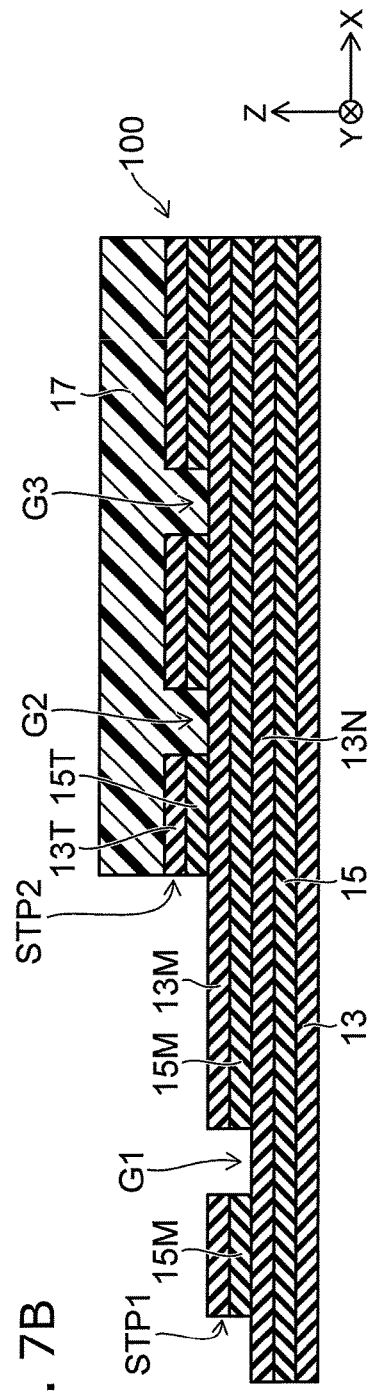

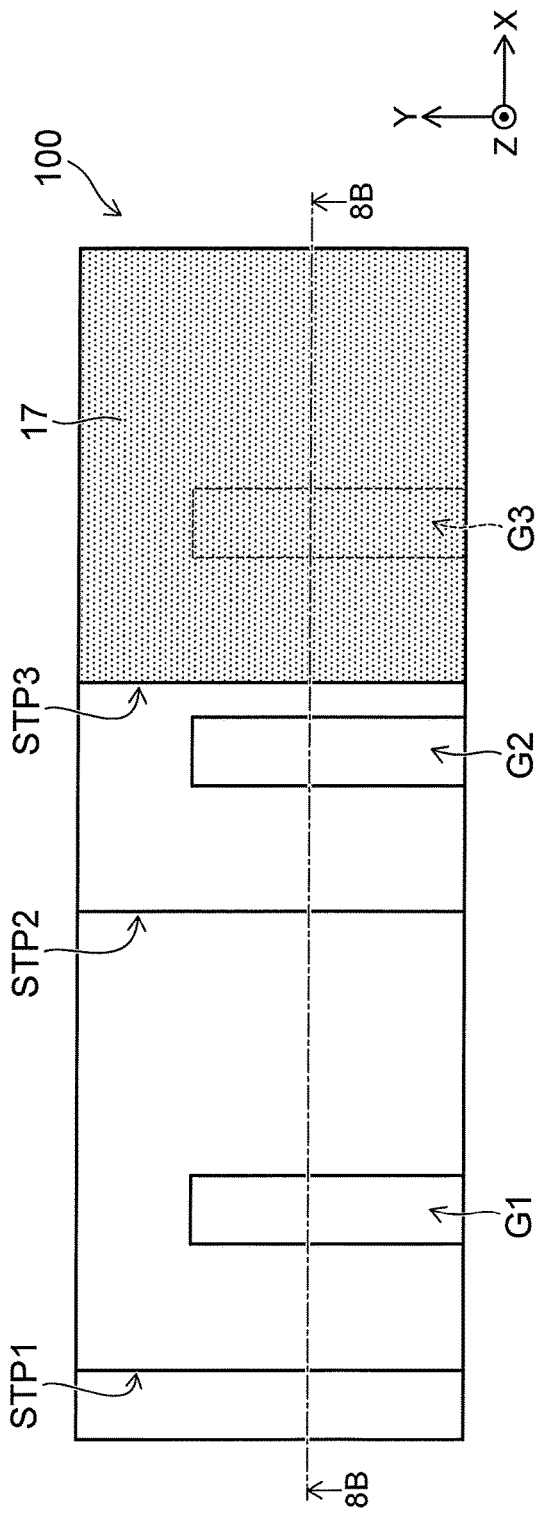
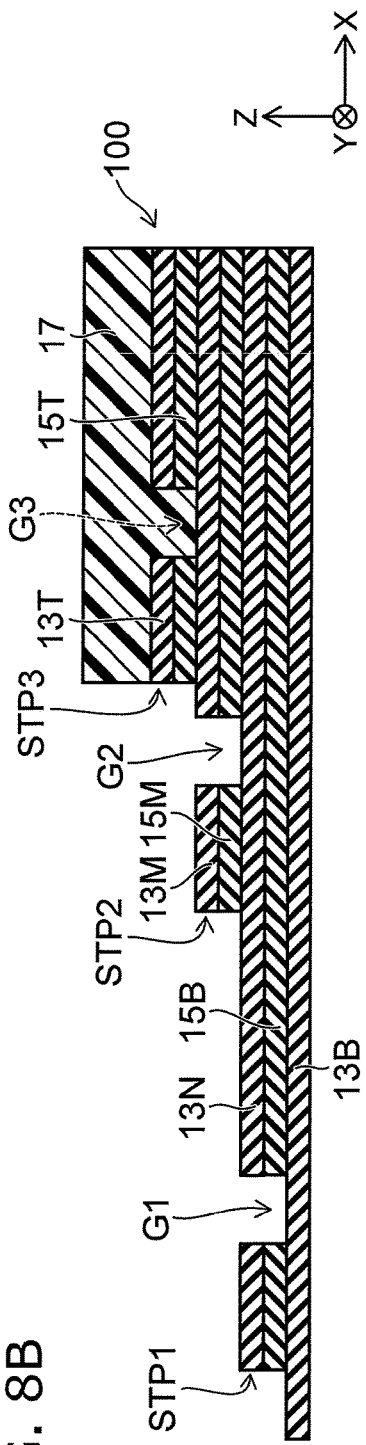
FIG. 8A
FIG. 8B

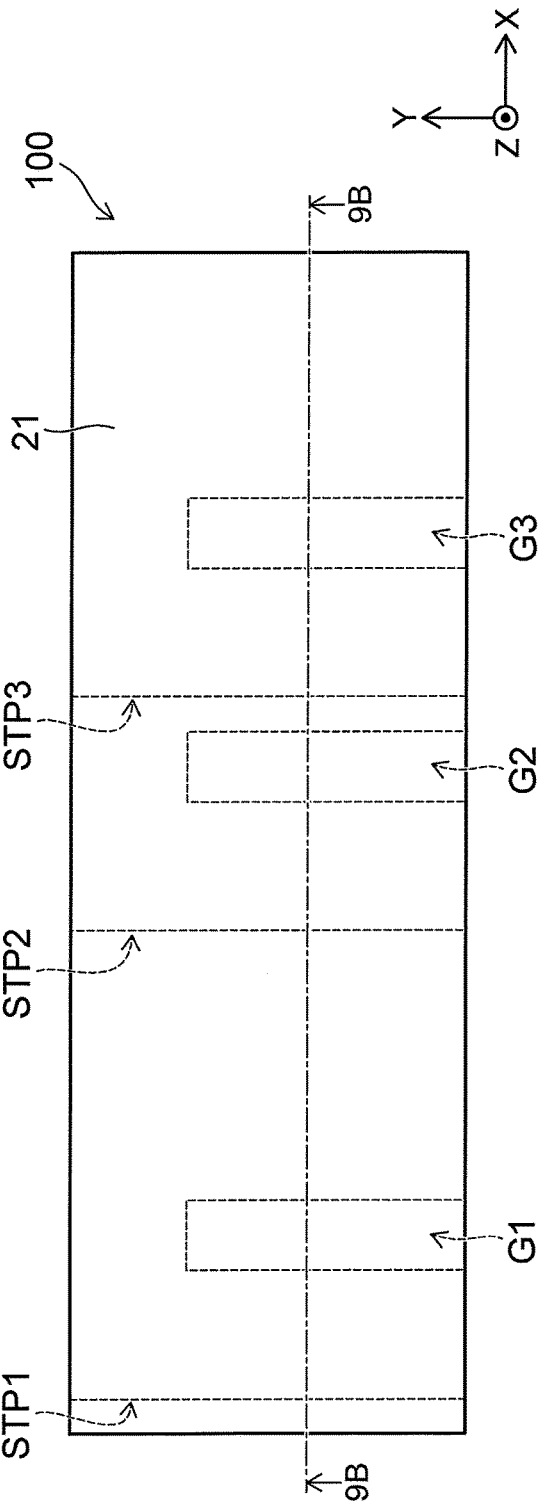
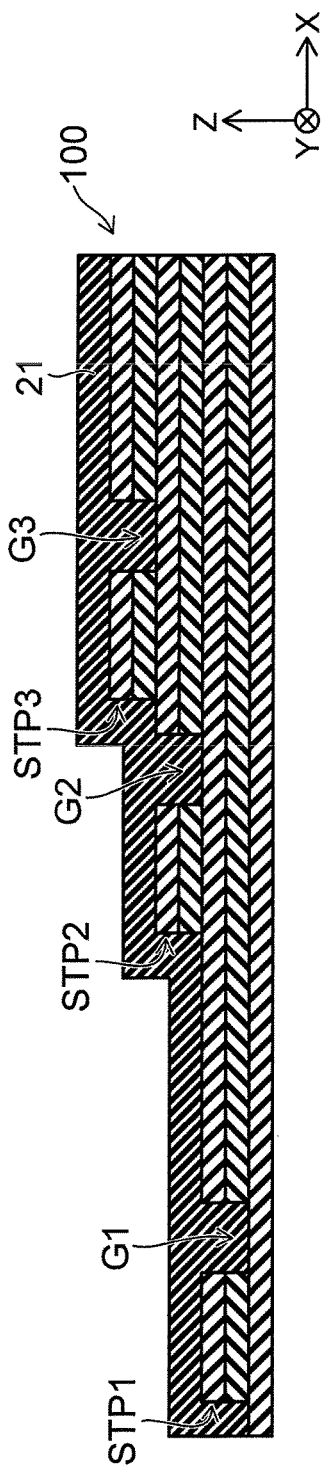
FIG. 9A
FIG. 9B

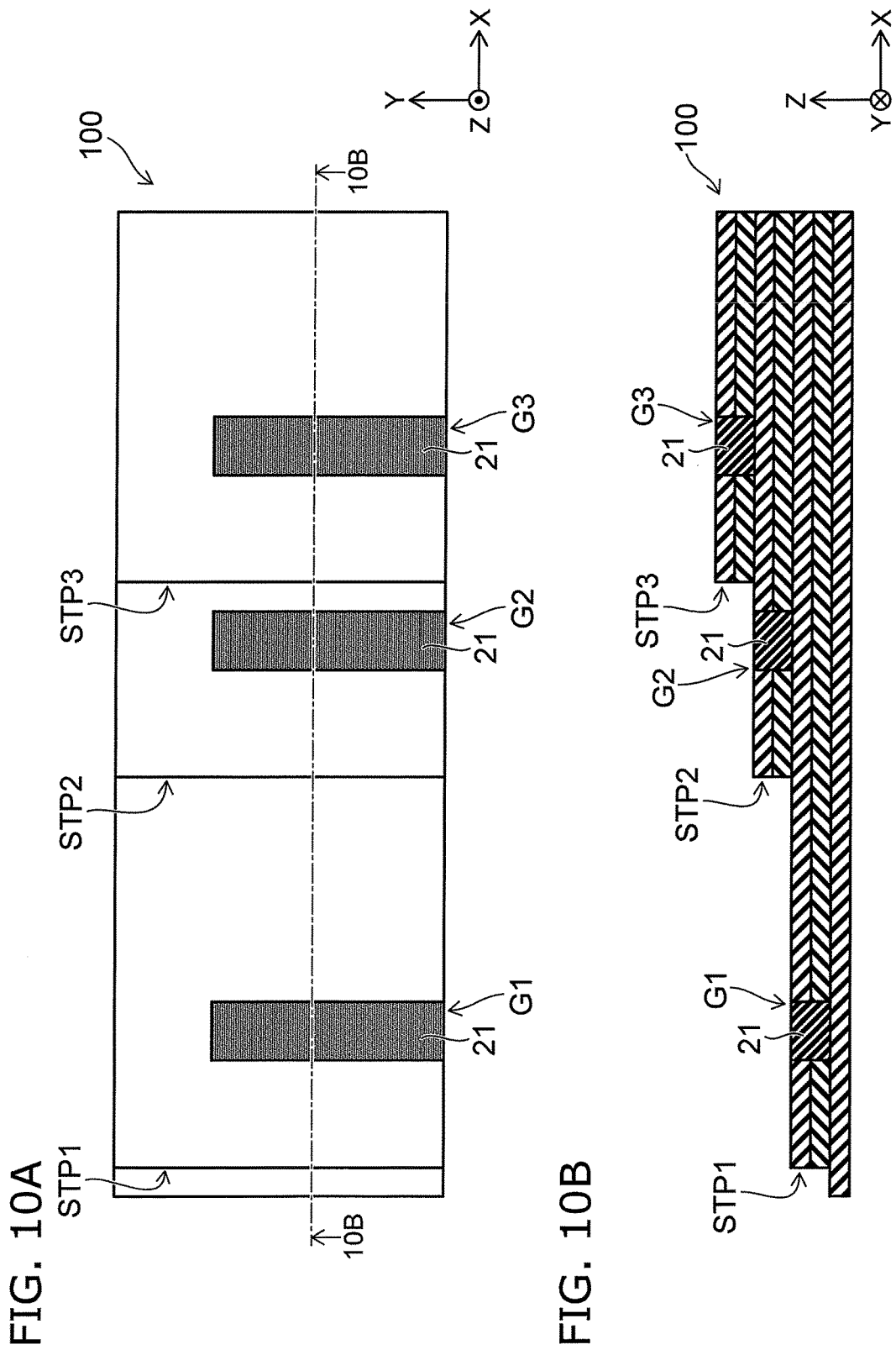

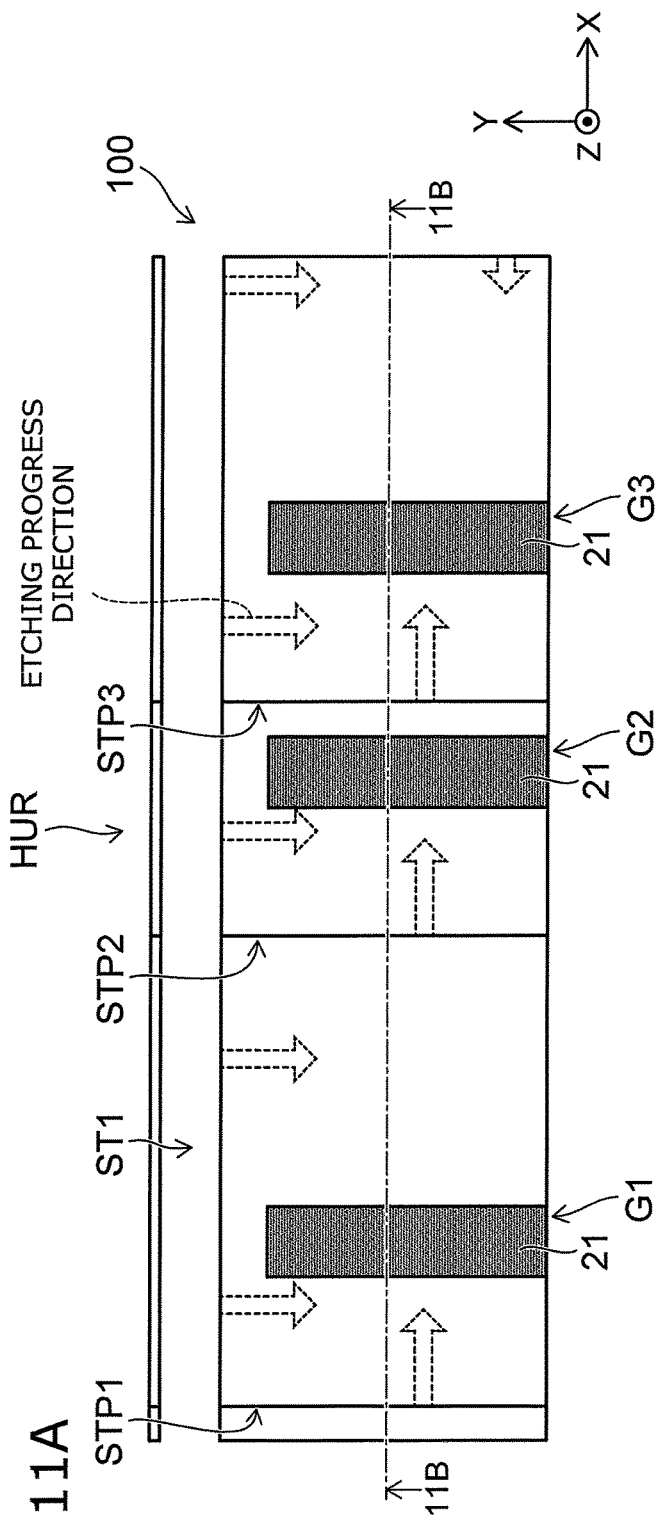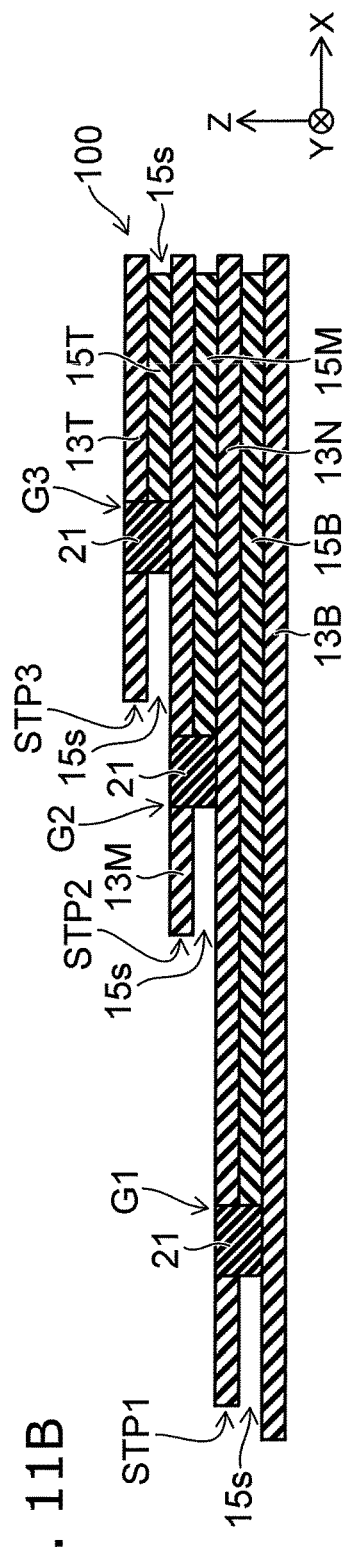

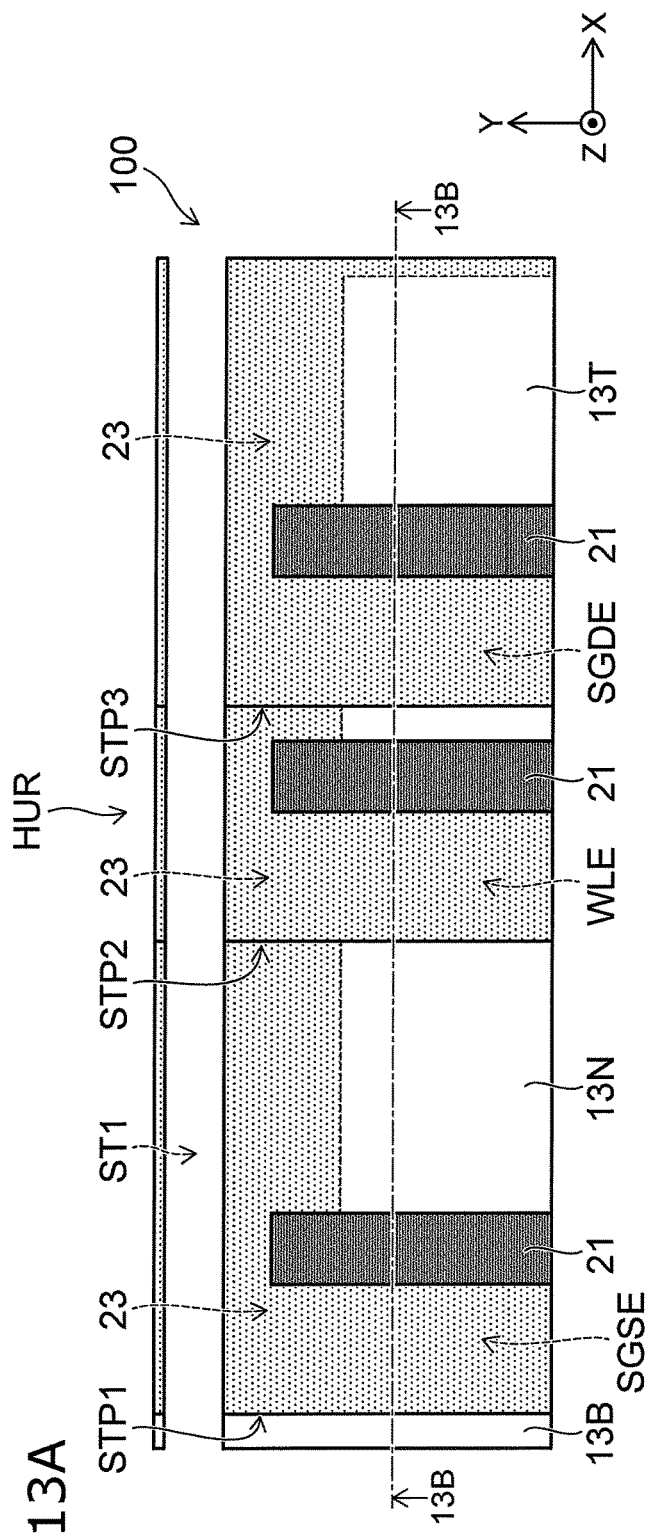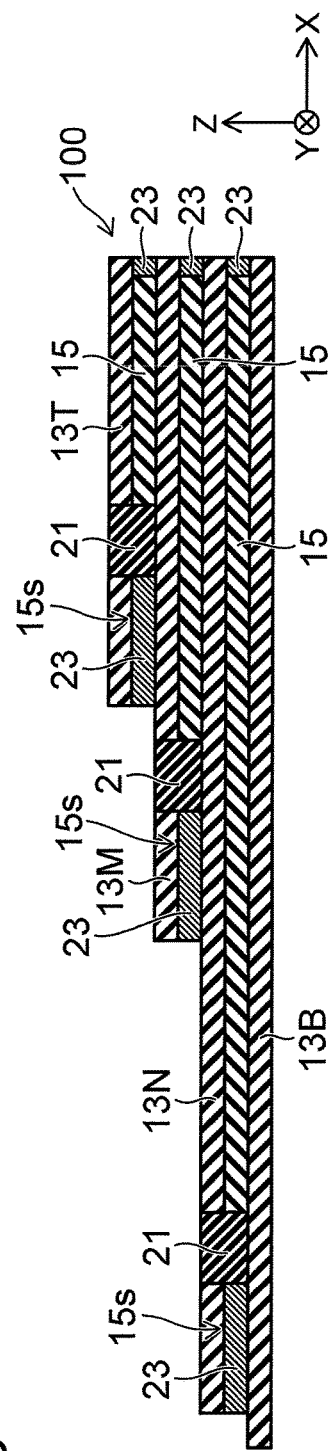
FIG. 13A
FIG. 13B

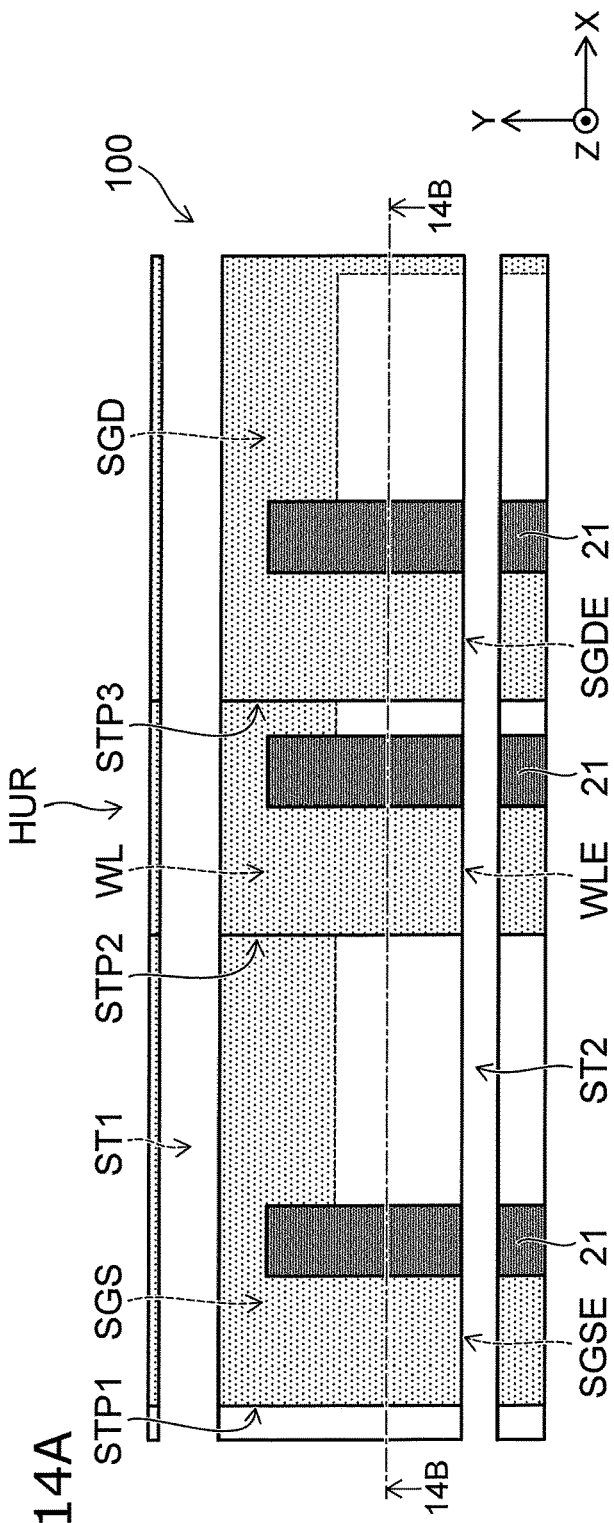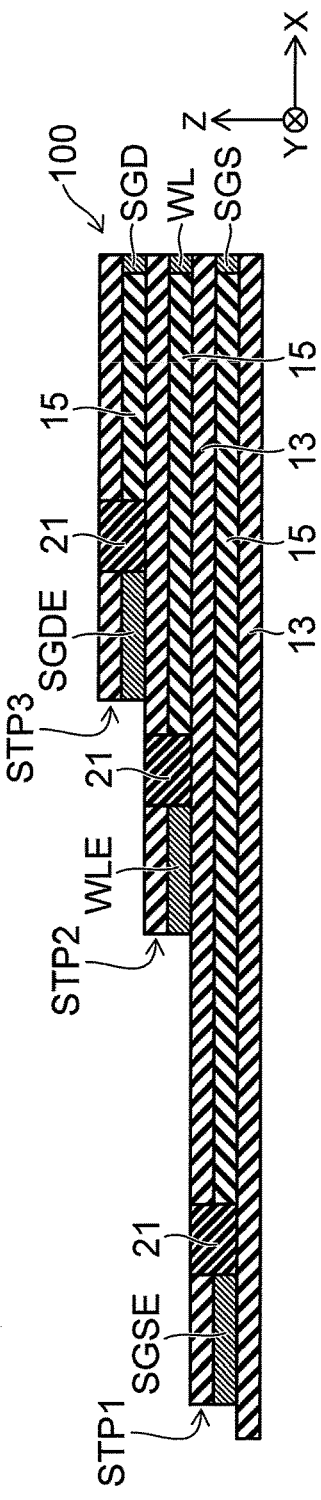
FIG. 14A
FIG. 14B

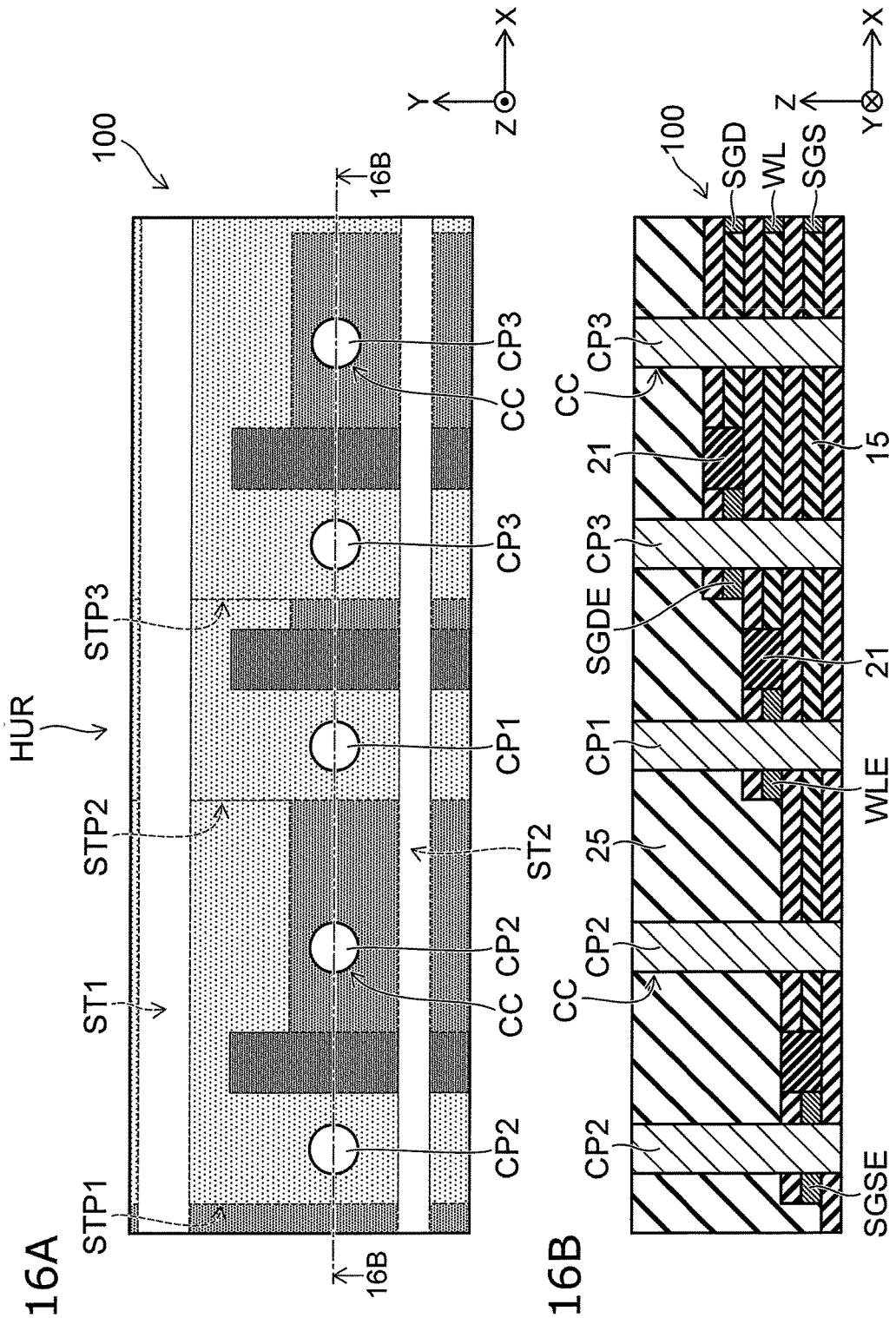

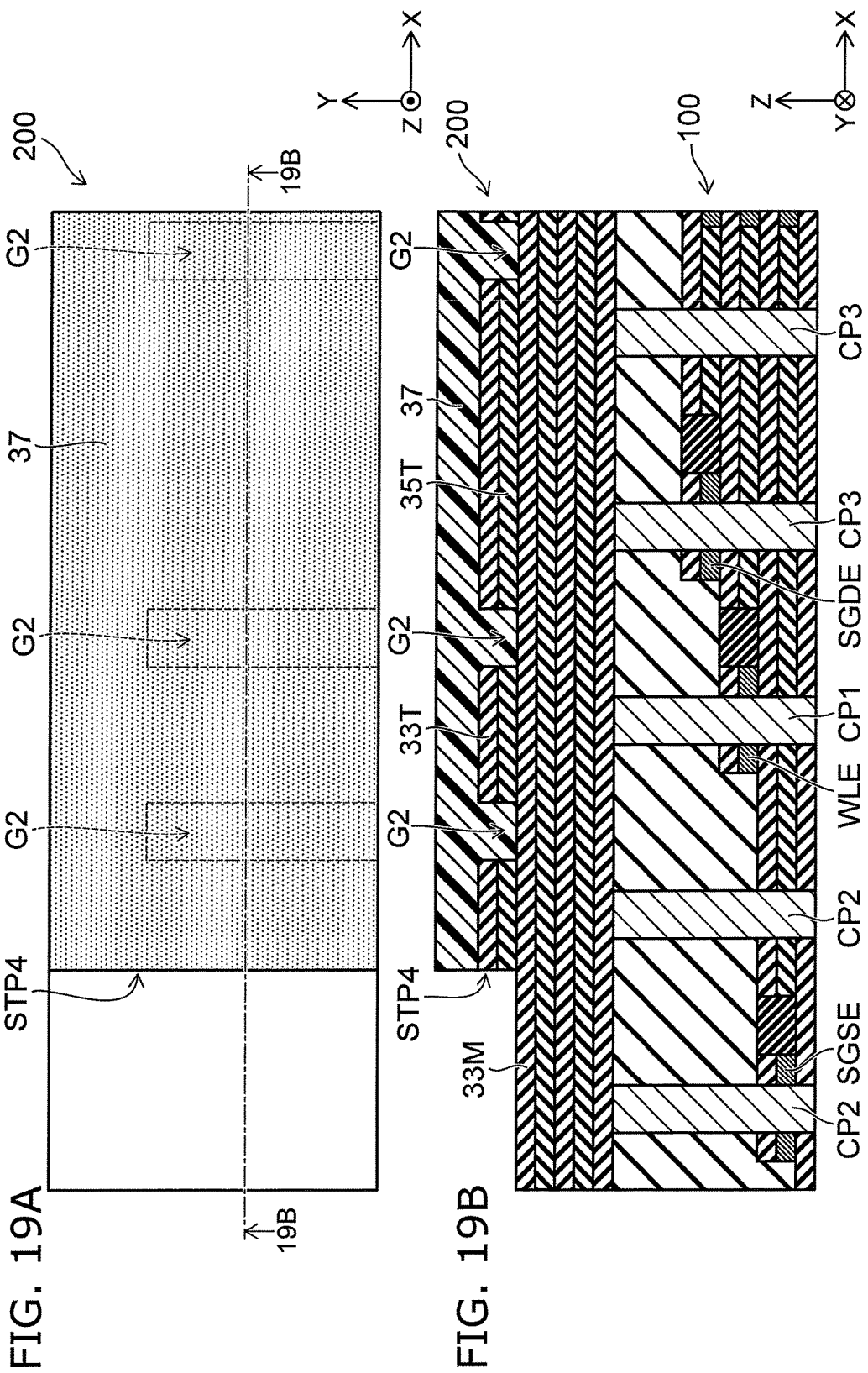

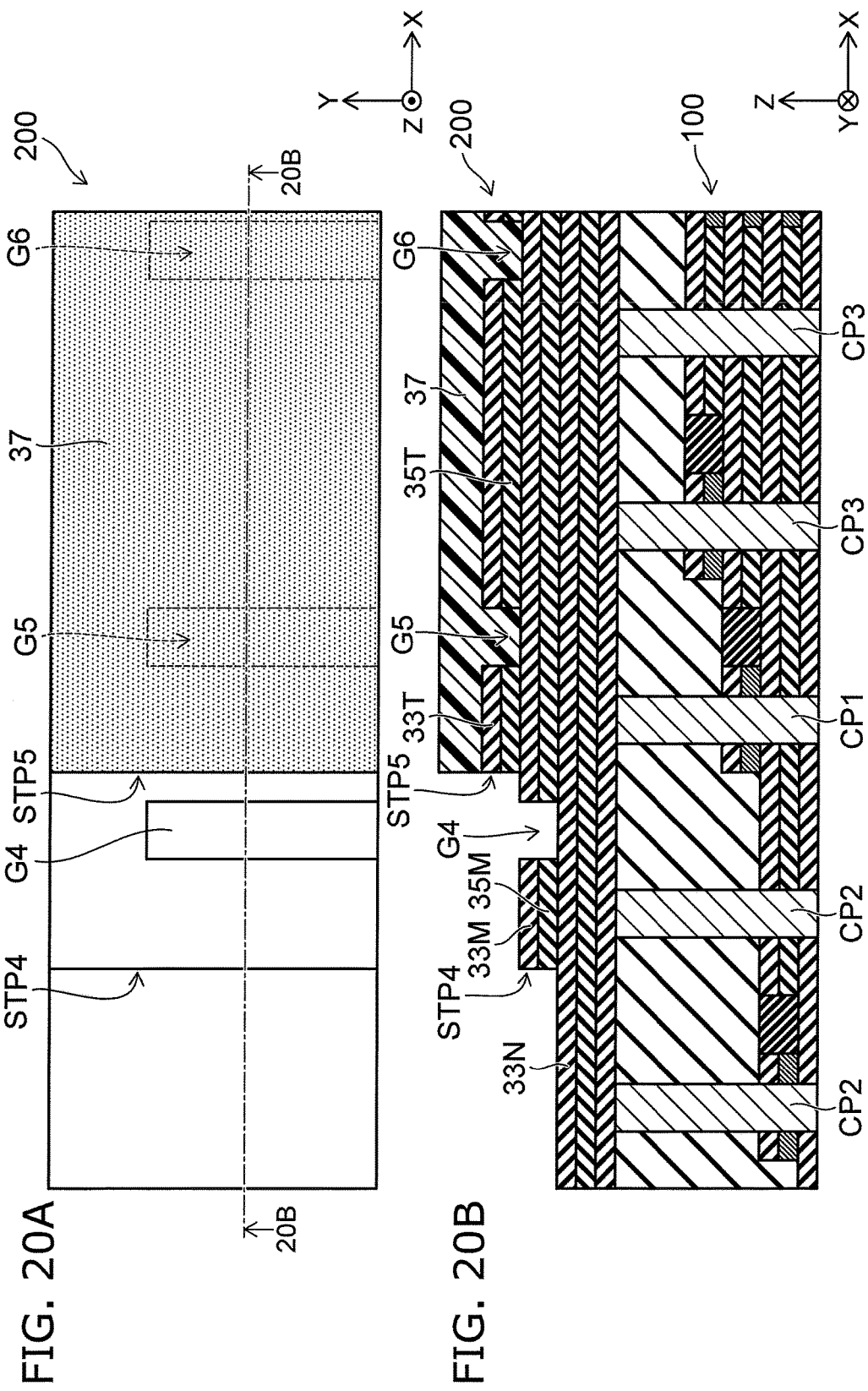

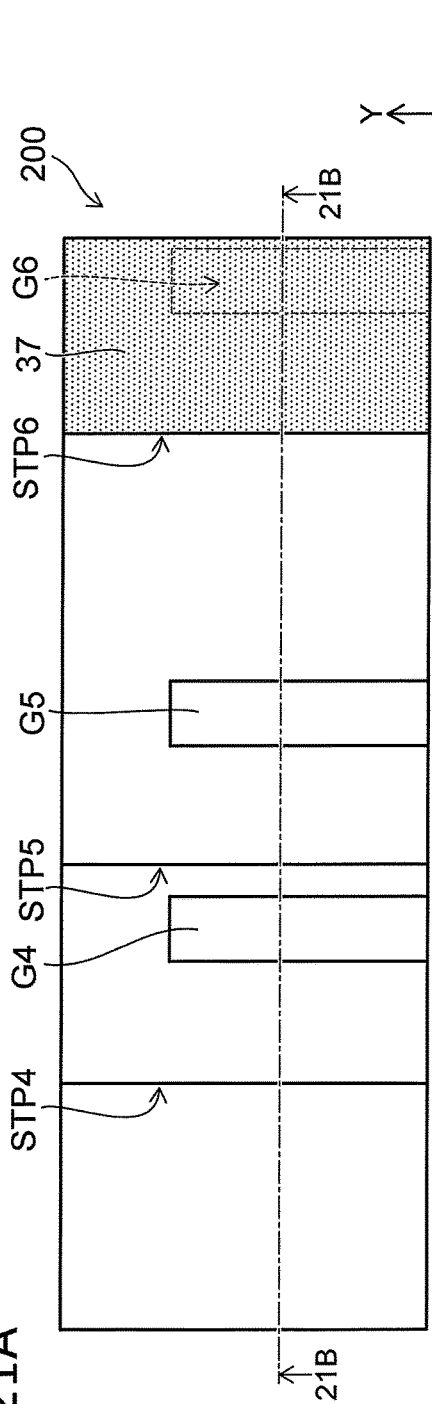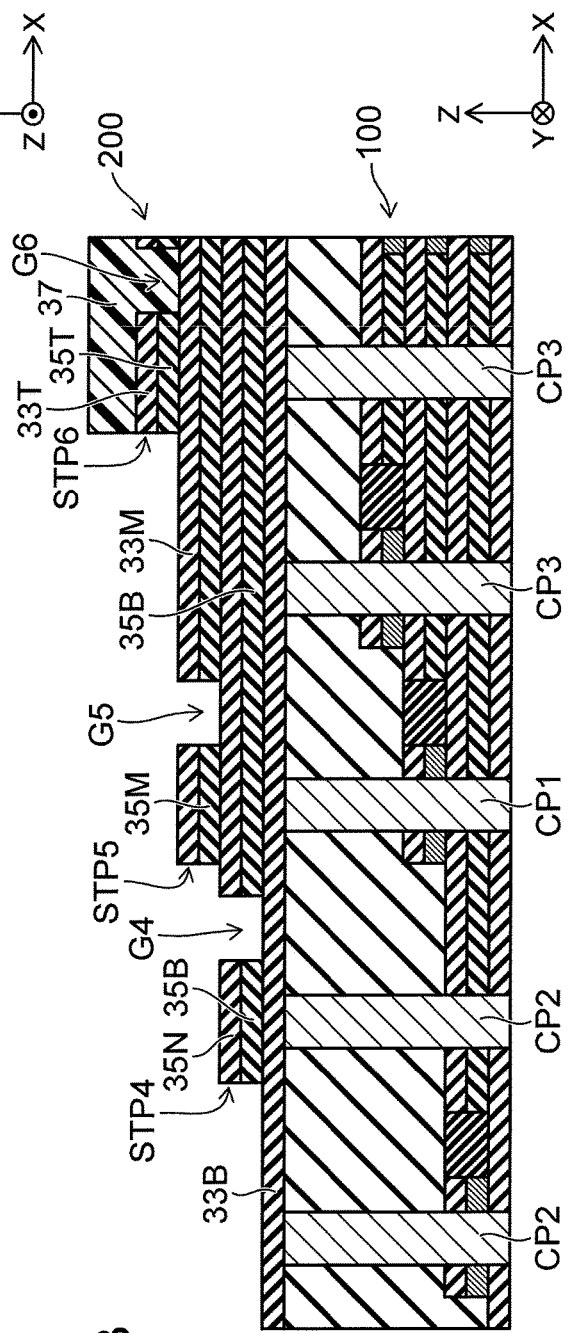
FIG. 21A
FIG. 21B

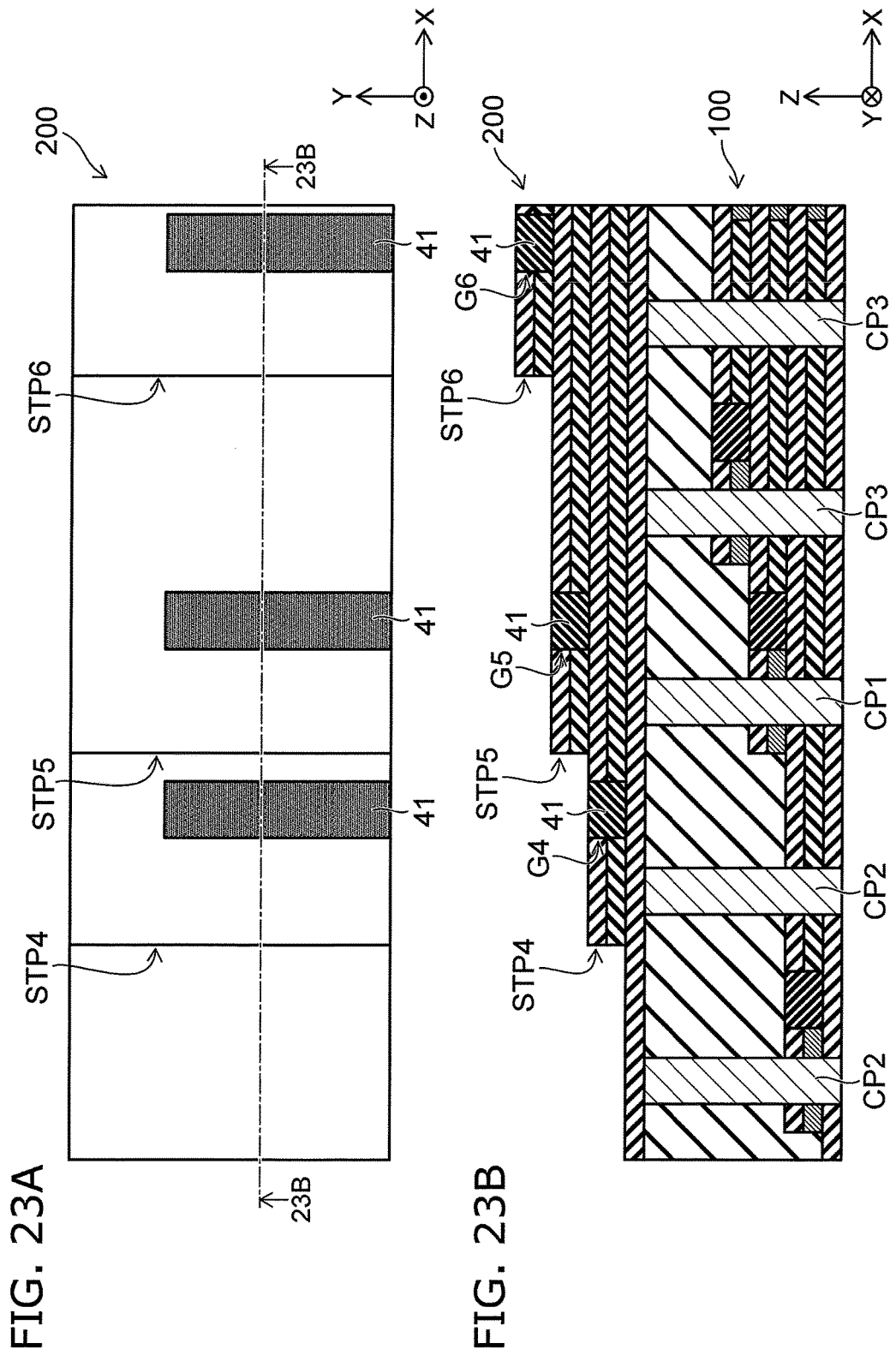

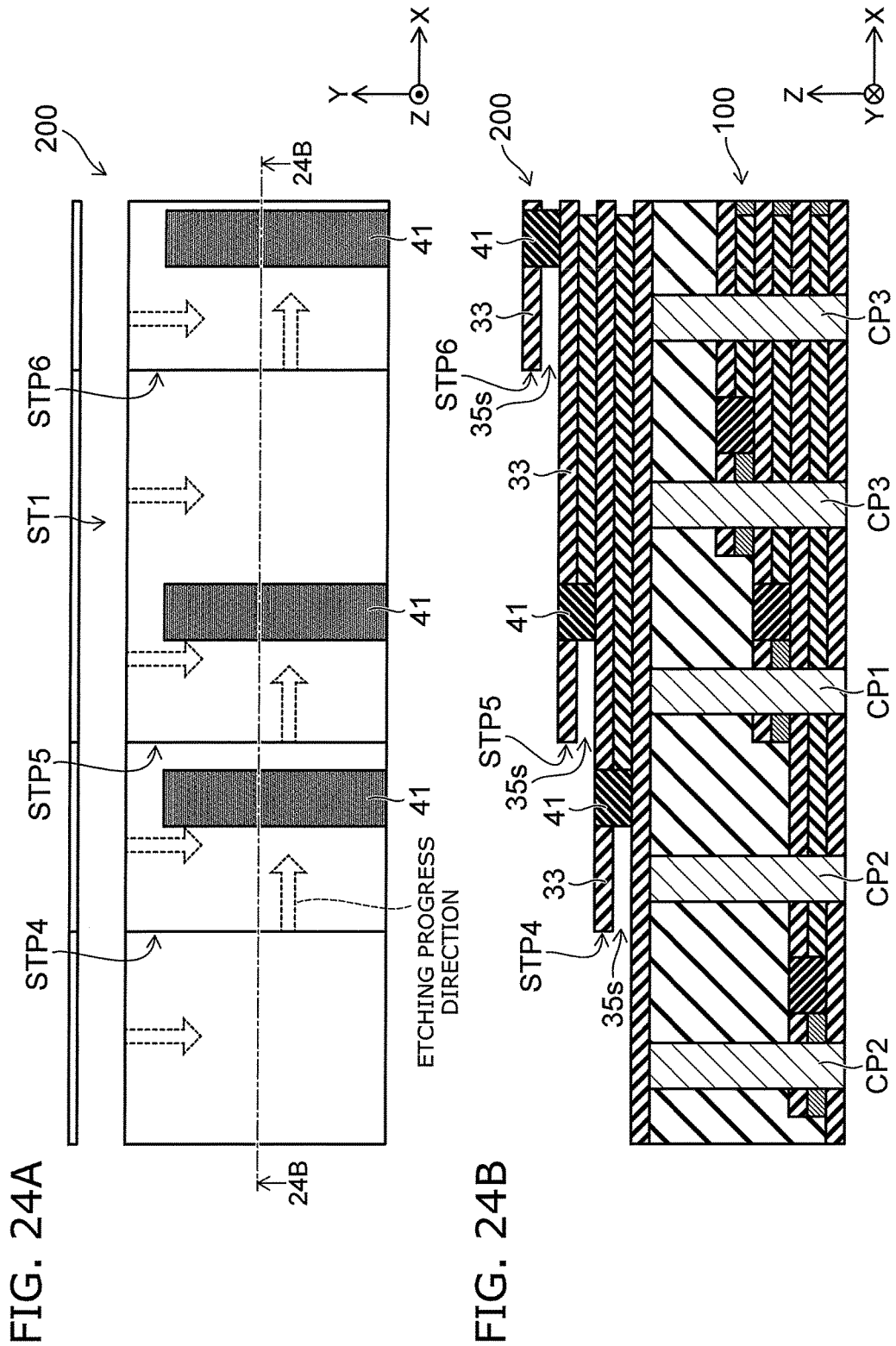

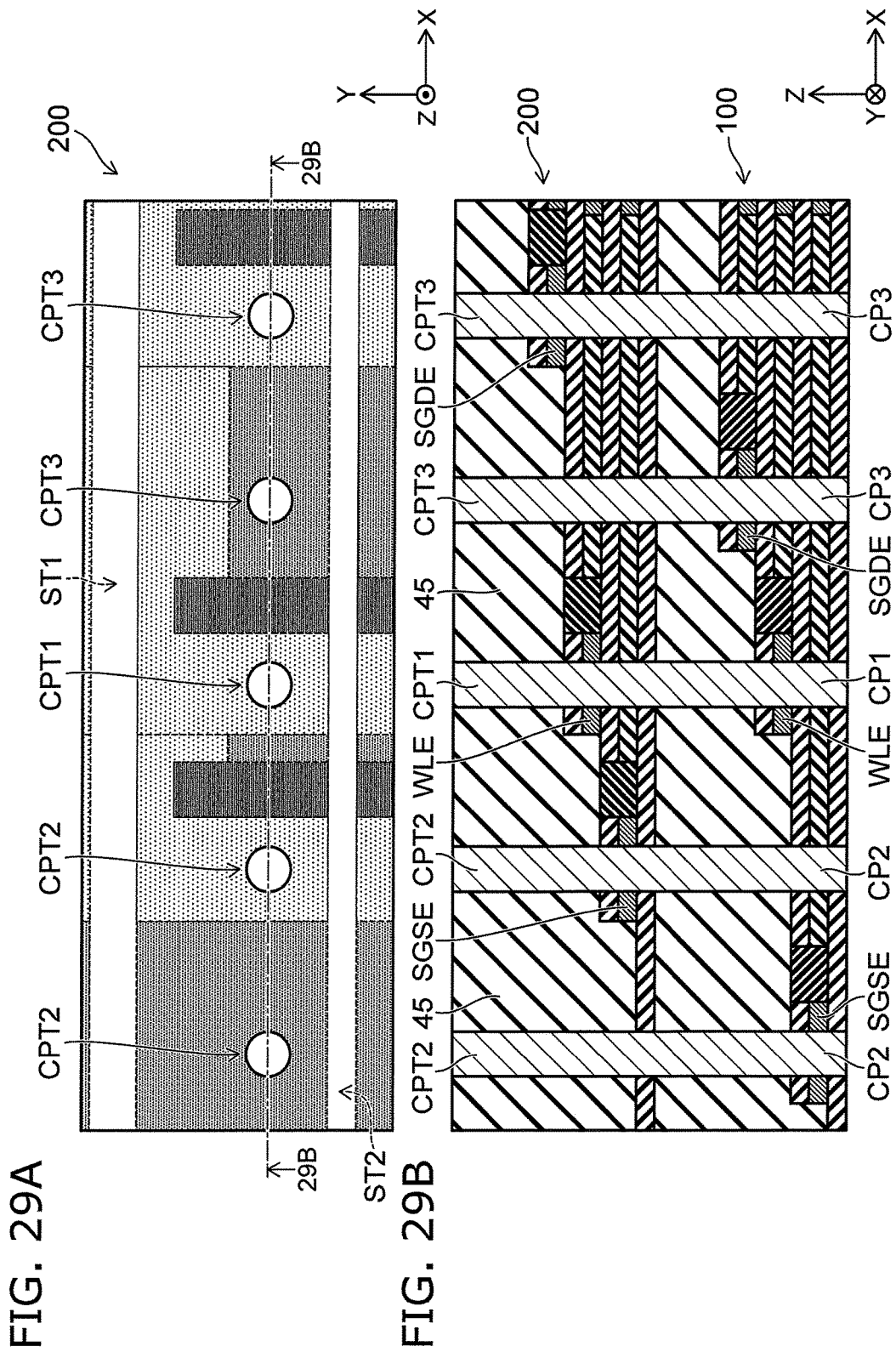

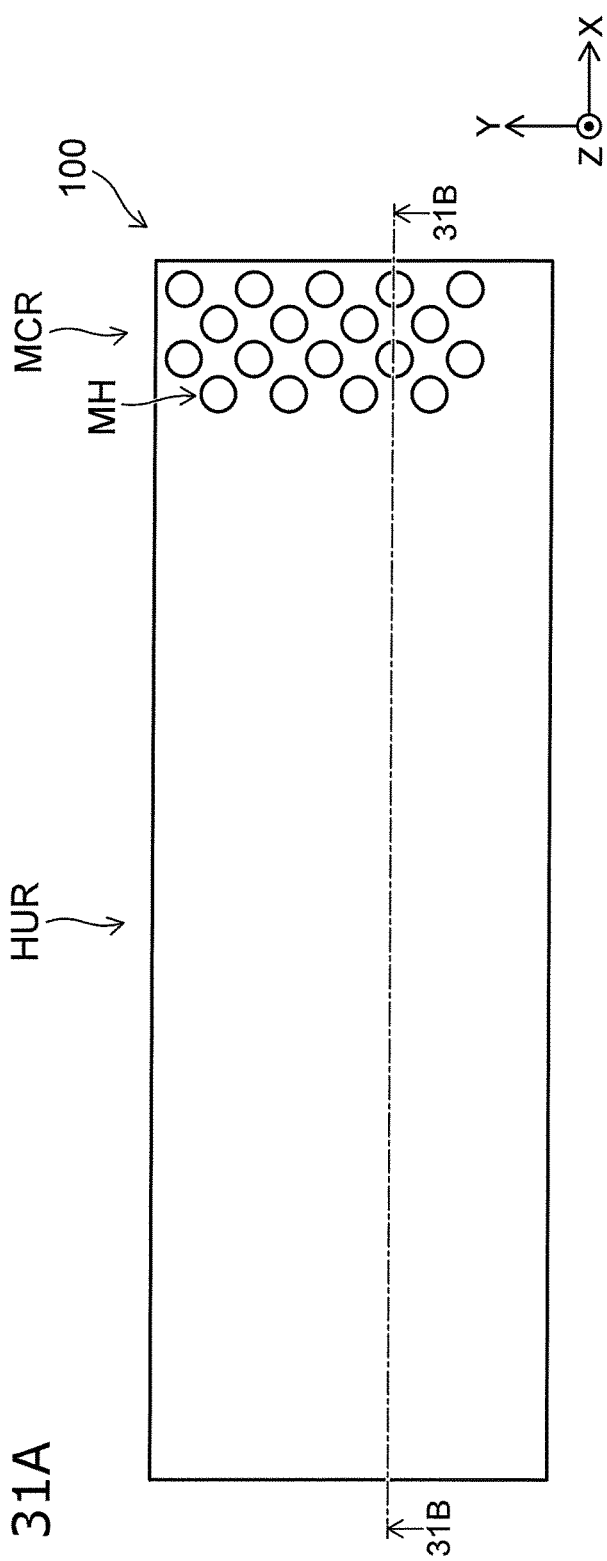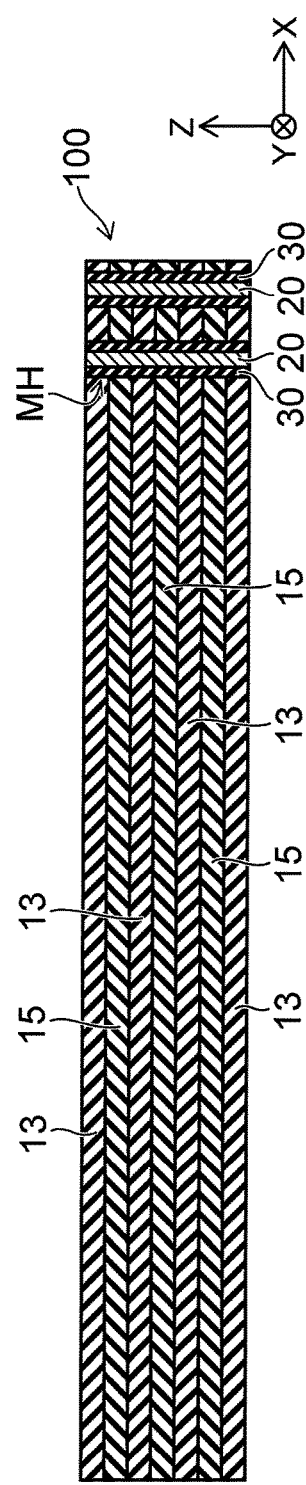
FIG. 31A
FIG. 31B

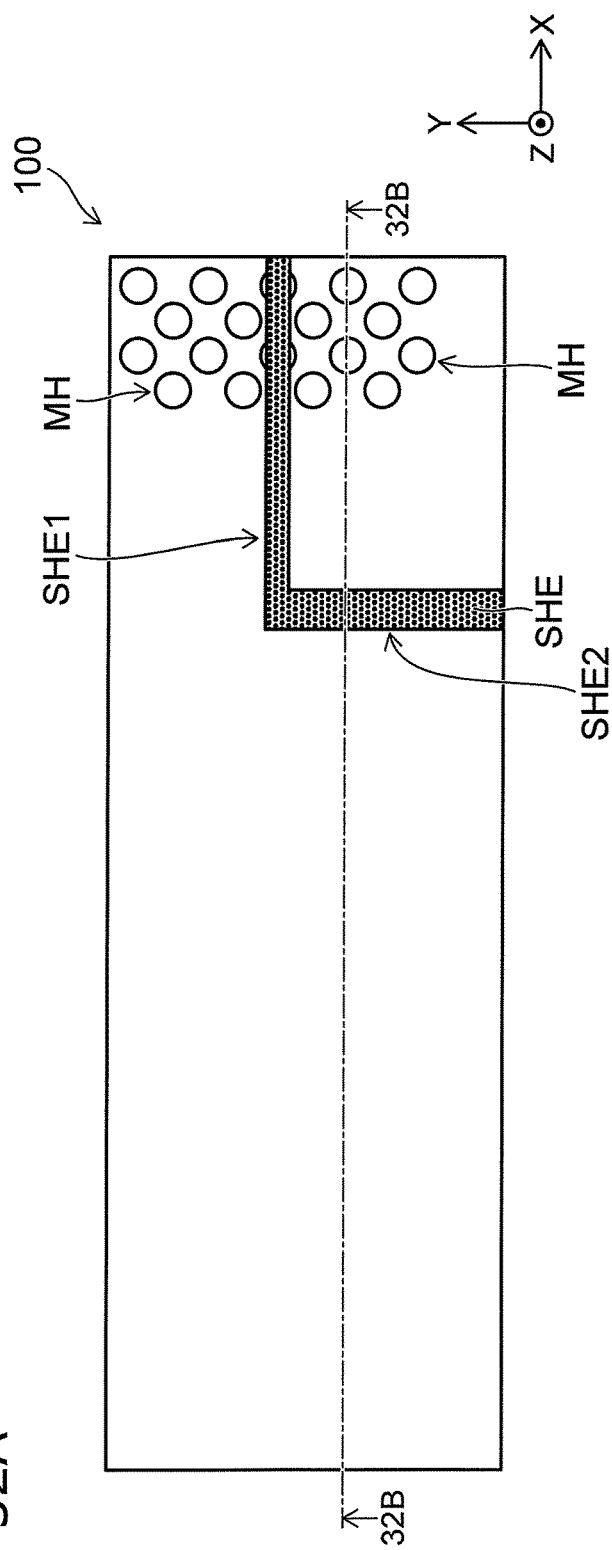
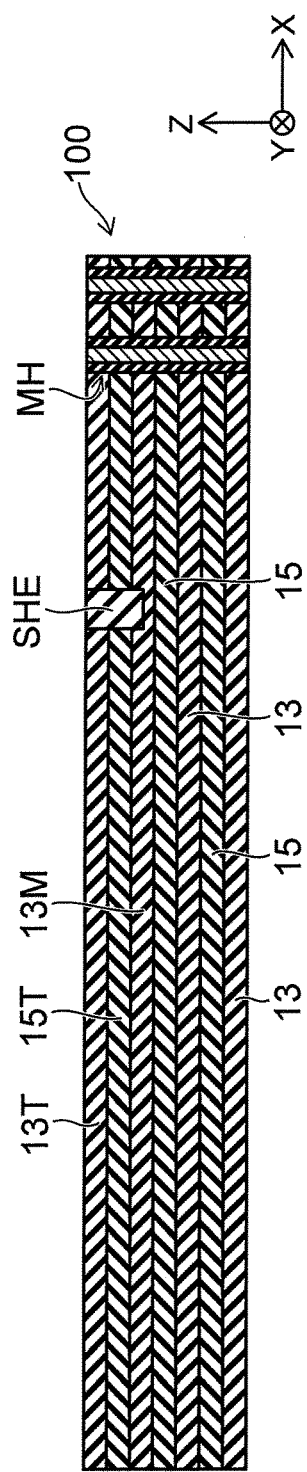
FIG. 32A
FIG. 32B

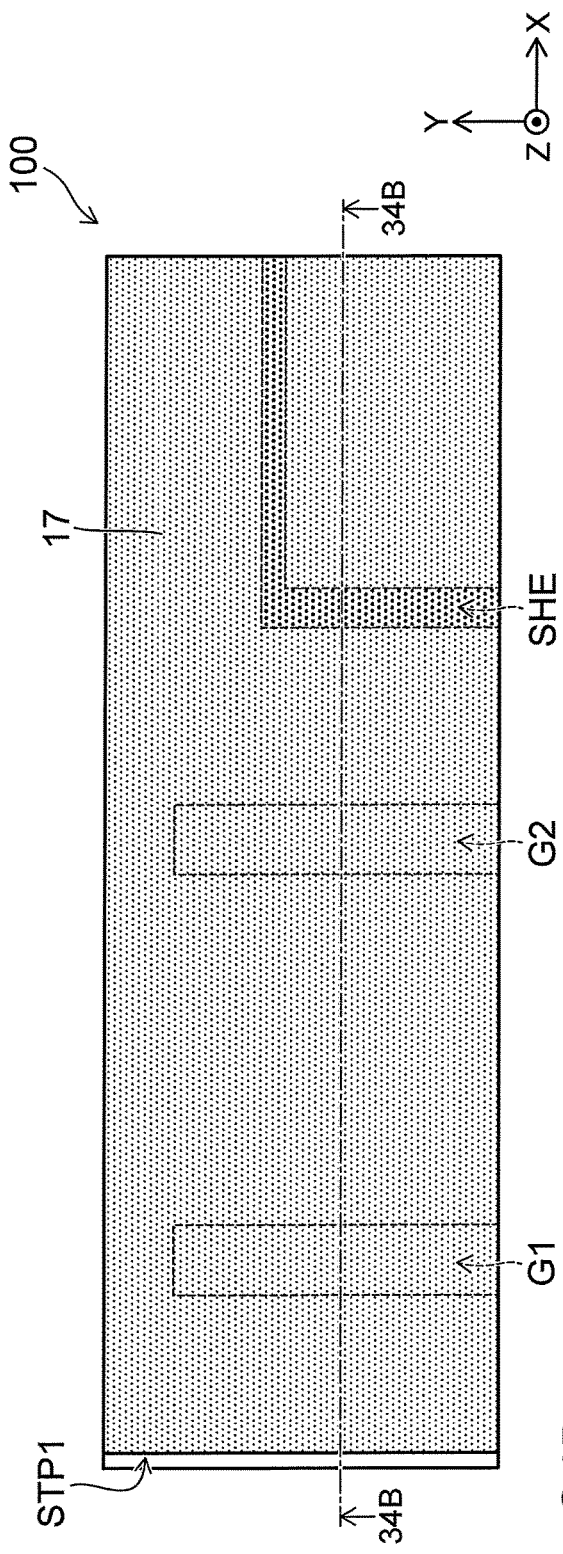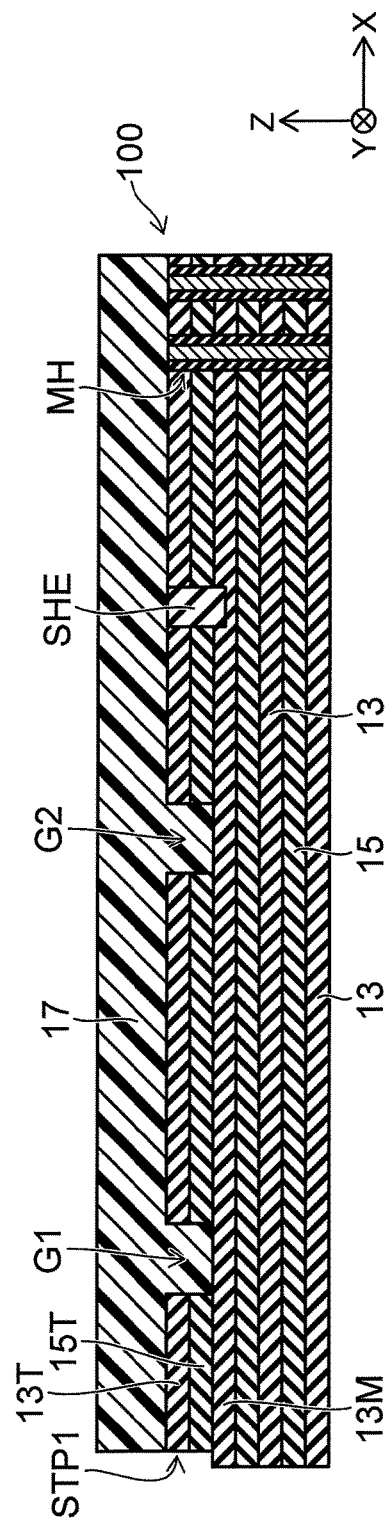
FIG. 34A
FIG. 34B

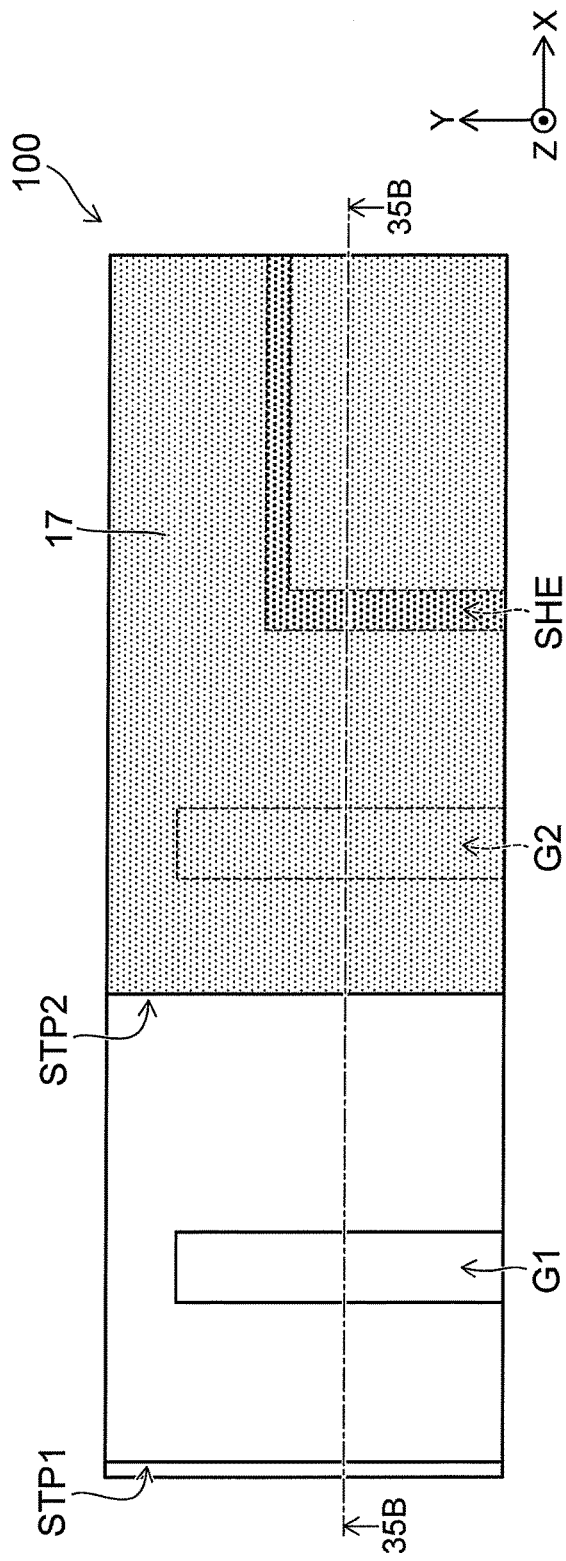
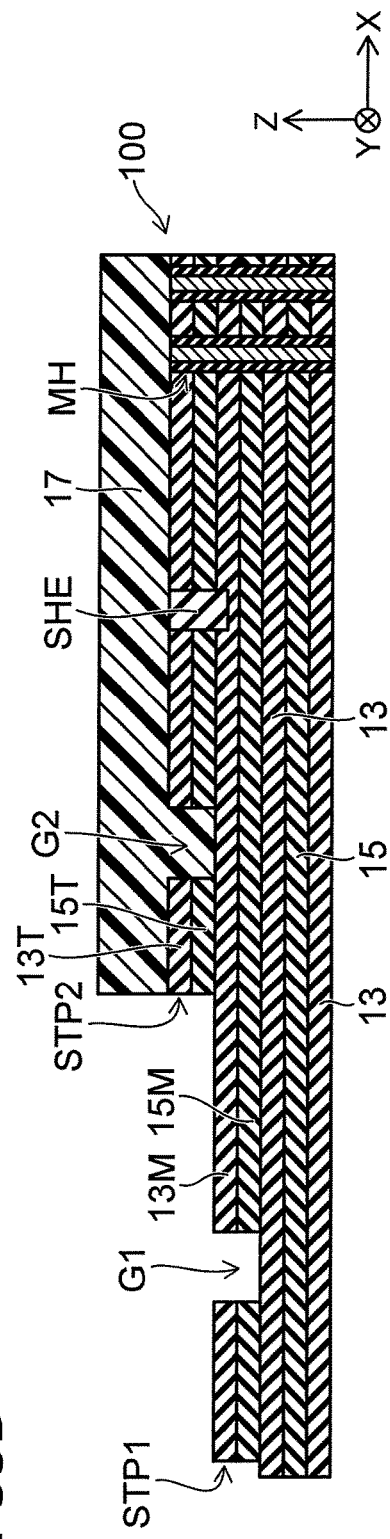
FIG. 35A
FIG. 35B

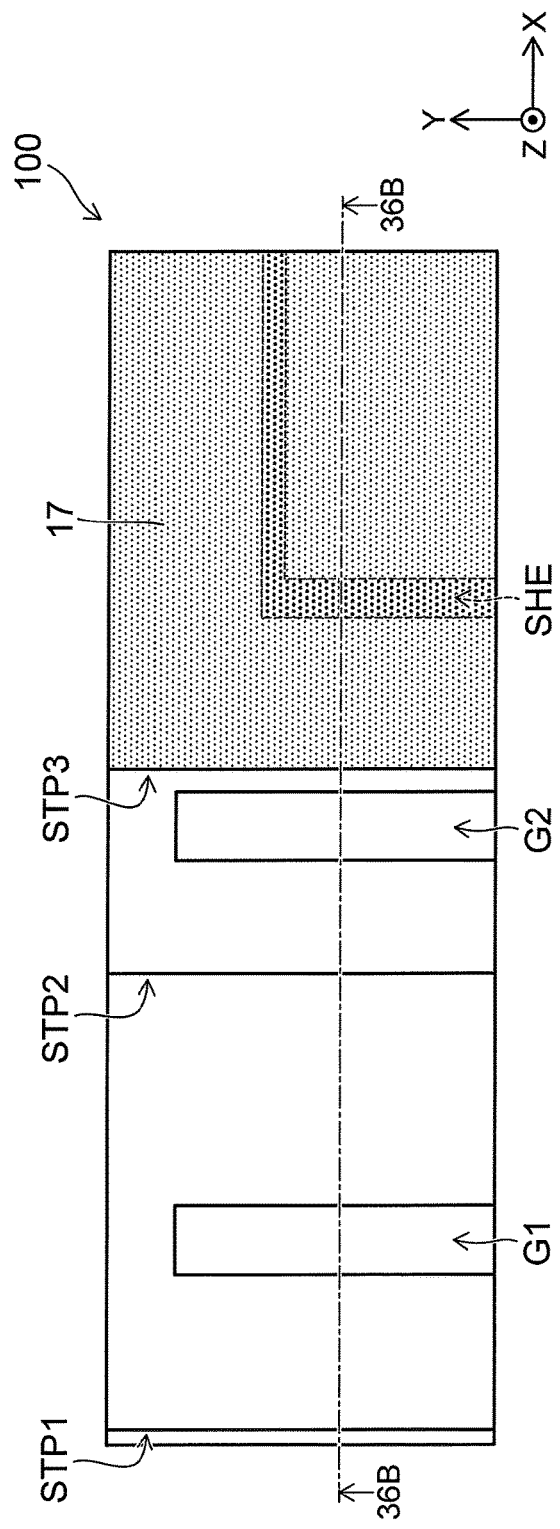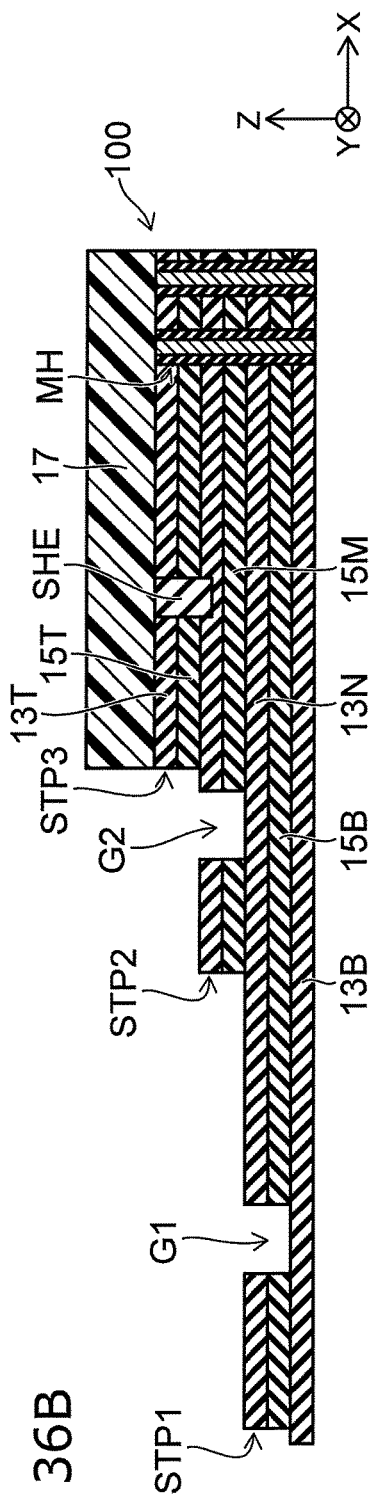

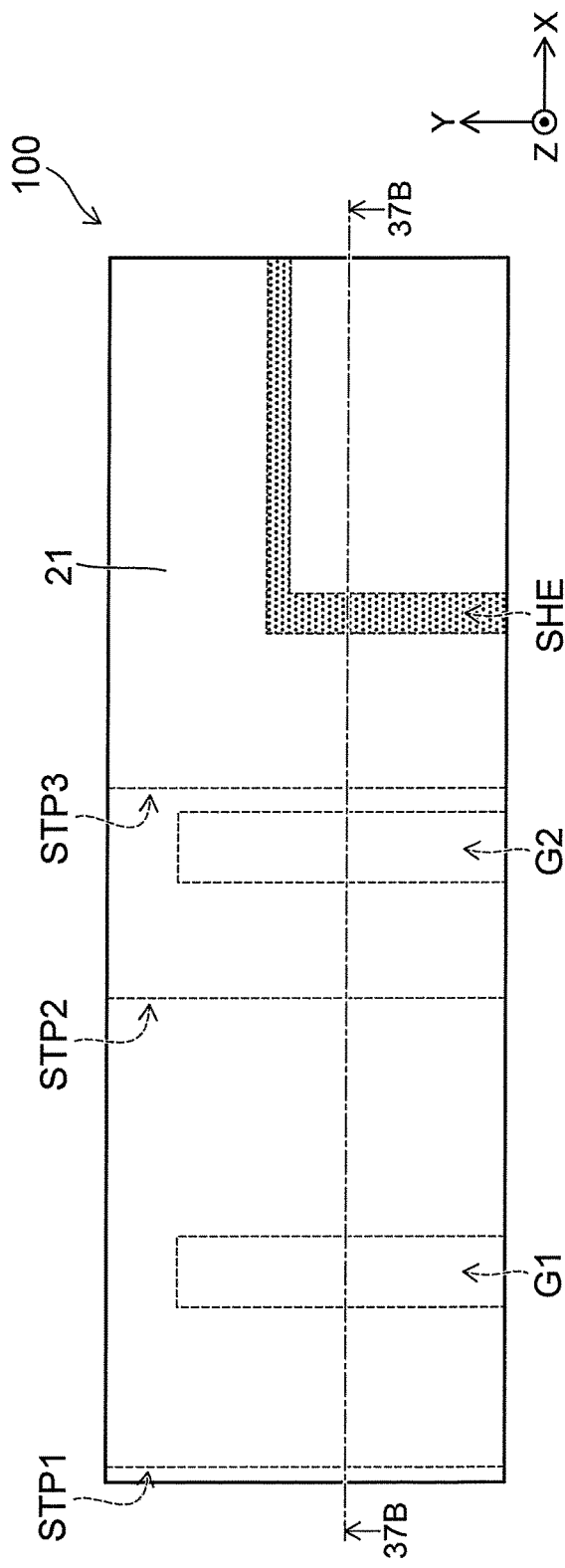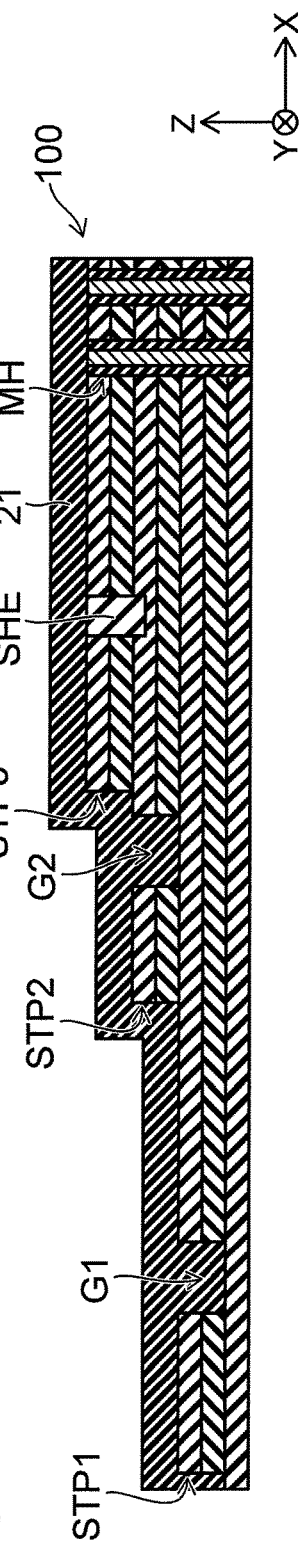
FIG. 37A
FIG. 37B

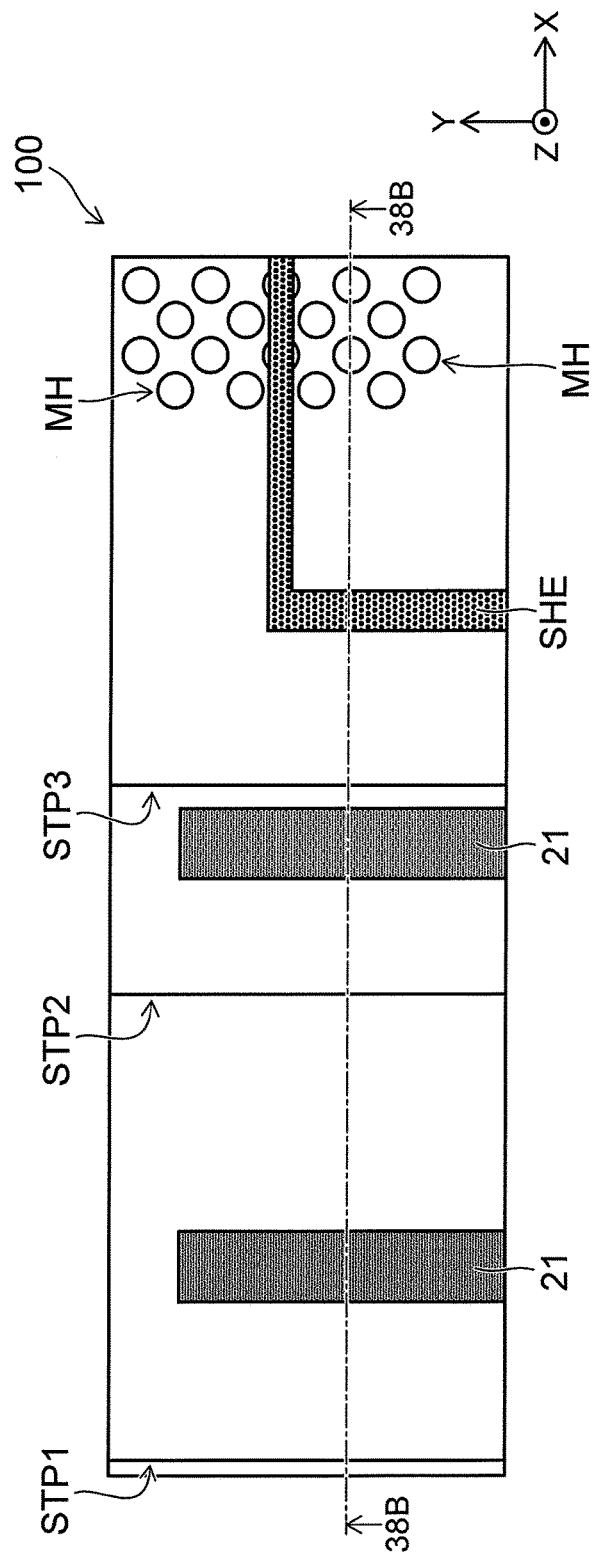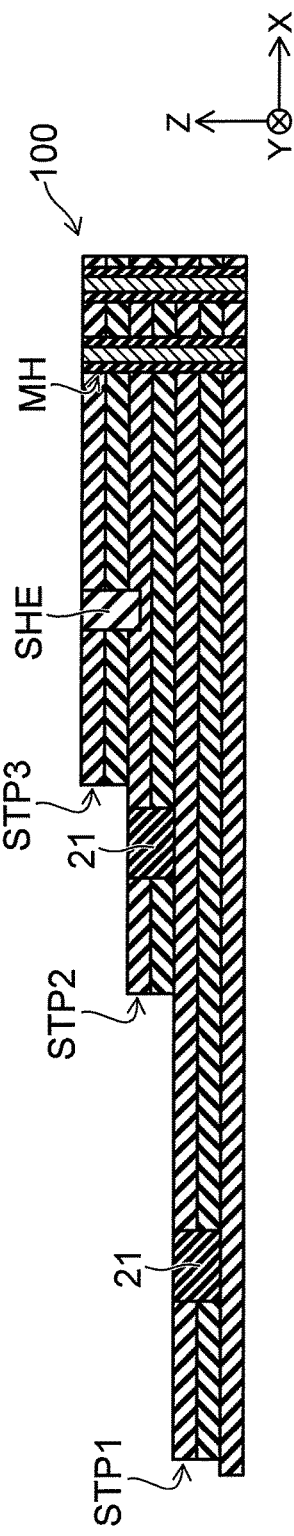
FIG. 38A
FIG. 38B

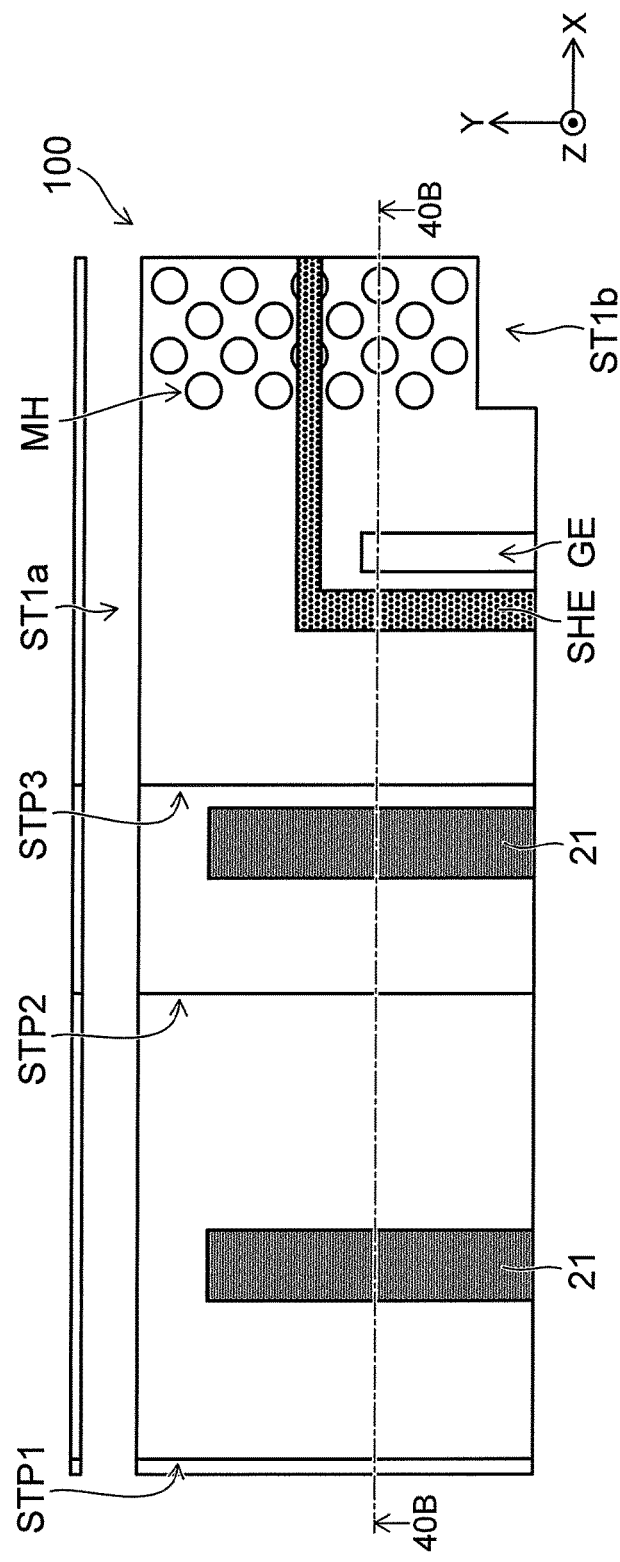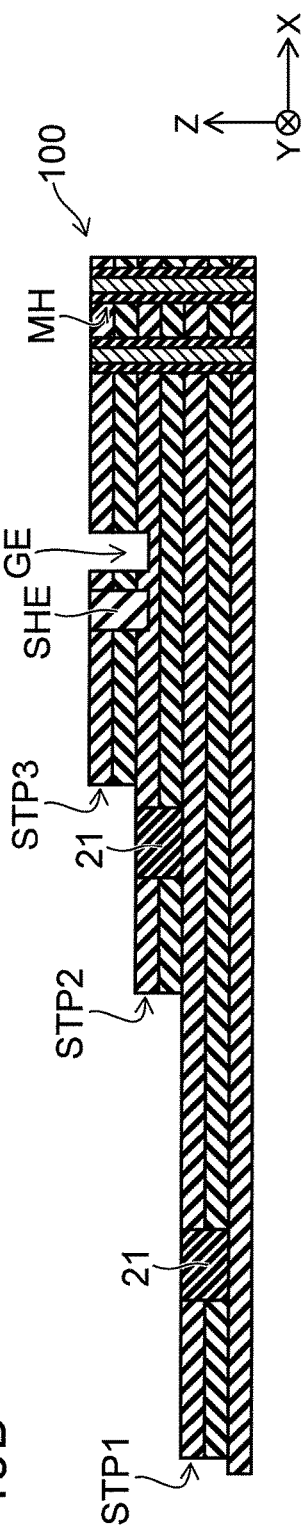
FIG. 40A
FIG. 40B

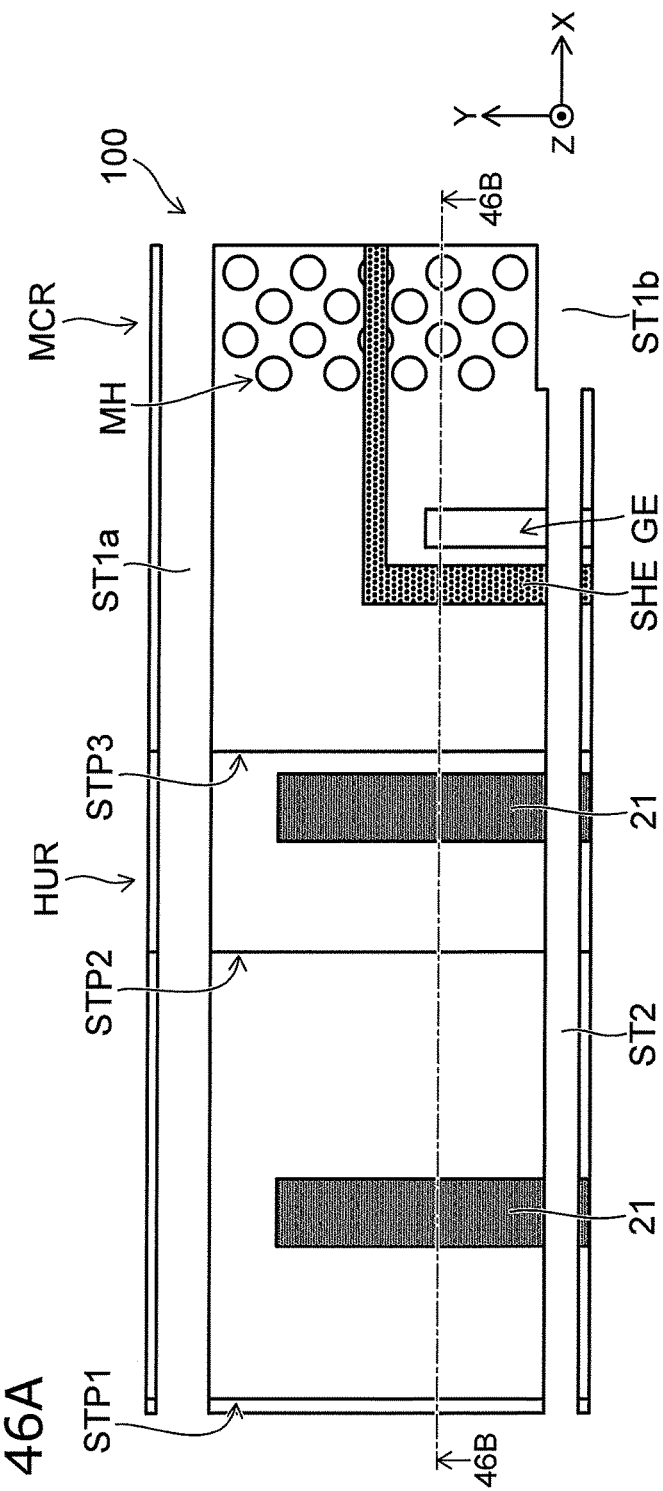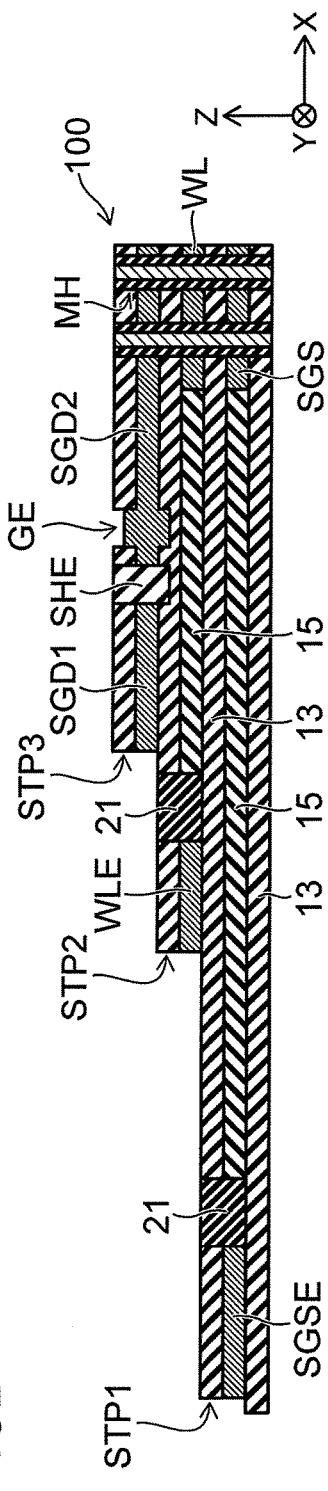
FIG. 46A
FIG. 46B

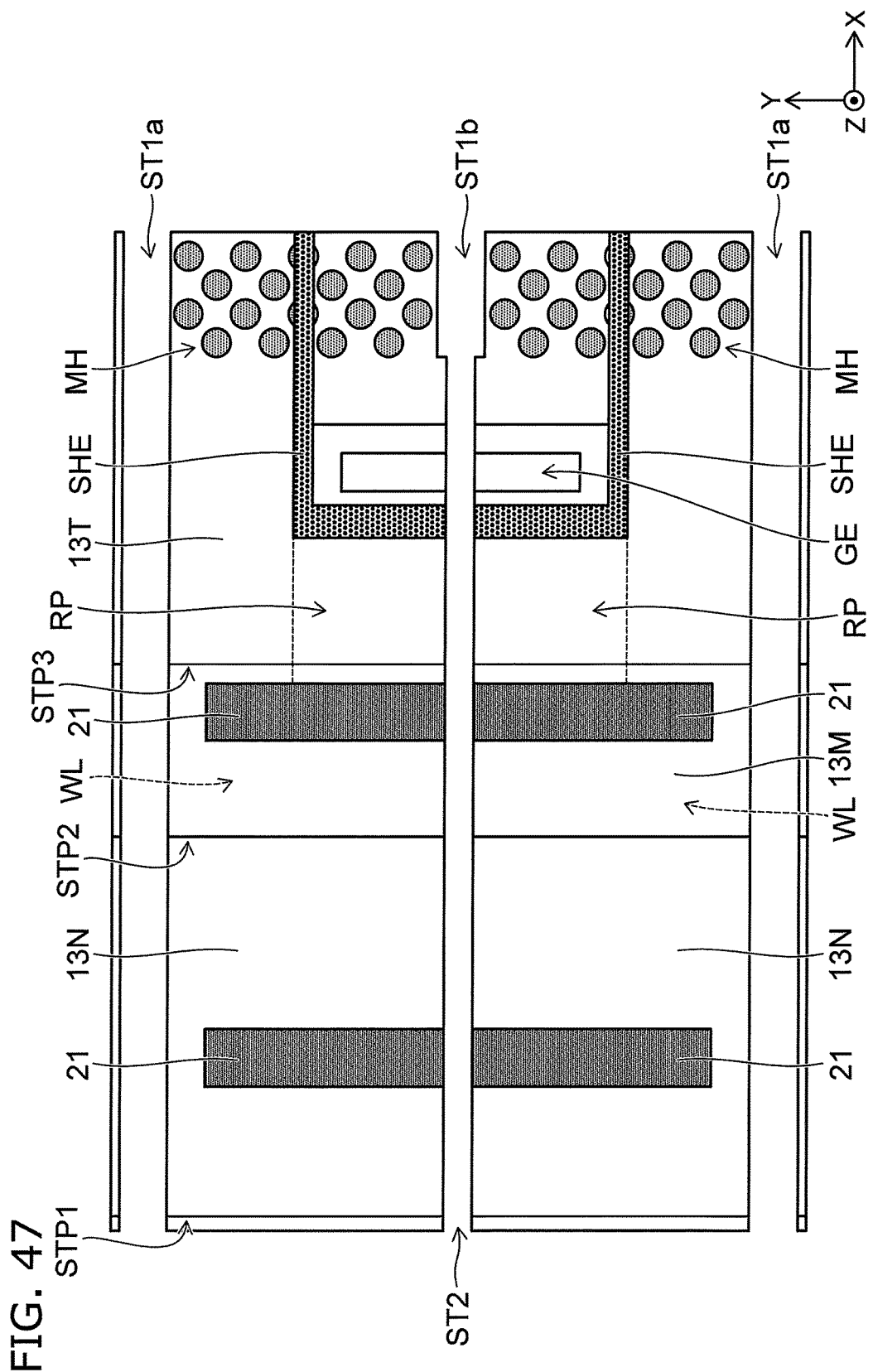

US 10,381,081 B2

THREE DIMENSIONAL MEMORY DEVICE WITH MULTIPLE STACKED ELECTRODE LAYERS

CROSS-REFERENCE TO RELATED APPLICATIONS

This application is based upon and claims the benefit of priority from Japanese Patent Application No. 2017-173536, filed on Sep. 8, 2017; the entire contents of which are incorporated herein by reference.

FIELD

Embodiments described herein relate generally to a memory device.

BACKGROUND

A memory device that includes three-dimensionally arranged memory cells is being developed. For example, a NAND memory device includes multiple stacked electrode layers, semiconductor pillars extending in the stacking direction of the multiple stacked electrode layers, and memory cells provided at the portions where the semiconductor pillars and the electrode layers cross. In a memory device having such a structure, the memory capacity can be increased by increasing the number of stacks of electrode layers. However, as the number of stacks of electrode layers is increased, the semiconductor pillars lengthen; and the read current flowing through the memory cells decreases. There are also cases where higher capacity may be obstructed because the surface area is wider for the draw-out portion for electrically connecting a drive circuit to the electrode layers that function as control gates of the memory cells.

BRIEF DESCRIPTION OF THE DRAWINGS

FIGS. 4A to 29B are schematic views showing the memory device according to the second embodiment;

FIGS. 31A to 41B, 42, 43, 44A to 46B, 47, 48A to 49B and FIG. 50 are schematic views showing manufacturing processes of the memory device according to the second embodiment.

DETAILED DESCRIPTION

Figure 1A:
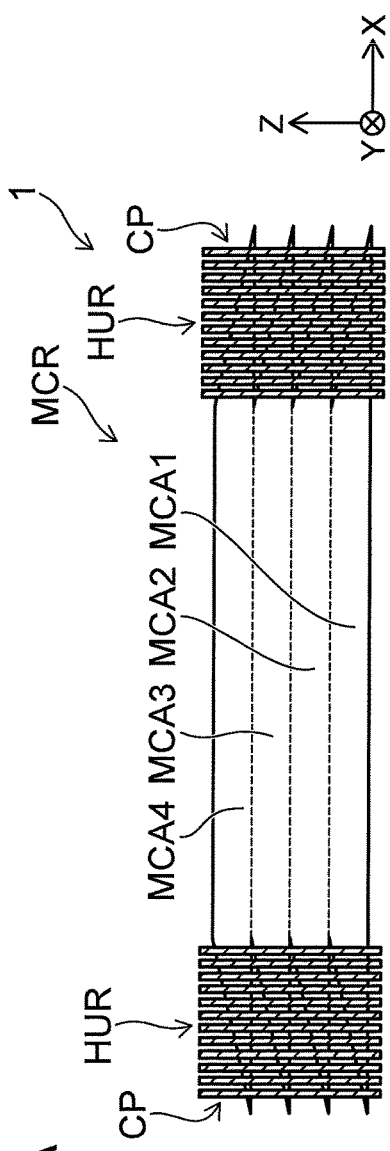
FIGS. 1A and 1B are schematic cross-sectional views showing a memory device 1 according to a first embodiment.

According to one embodiment, a memory device includes a plurality of first electrode layers, a first semiconductor pillar, a plurality of second electrode layers, a second semiconductor pillar, an interconnect, and a first connecting conductor. The first electrode layers are stacked in a first direction. The first semiconductor pillar extends in the first direction and pierces the first electrode layers. The second electrode layers are stacked in the first direction. The second electrode layers are positioned in the first direction when viewed from the first electrode layers. The second semiconductor pillar extends in the first direction and pierces the second electrode layers. The interconnect is provided between the first electrode layers and the second electrode layers. The interconnect is electrically connected to the first semiconductor pillar and the second semiconductor pillar. The first connecting conductor is connected to one of the first electrode layers and one of the second electrode layers. The first connecting conductor extends in the first direction, and crosses at least one of the second electrode layers.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
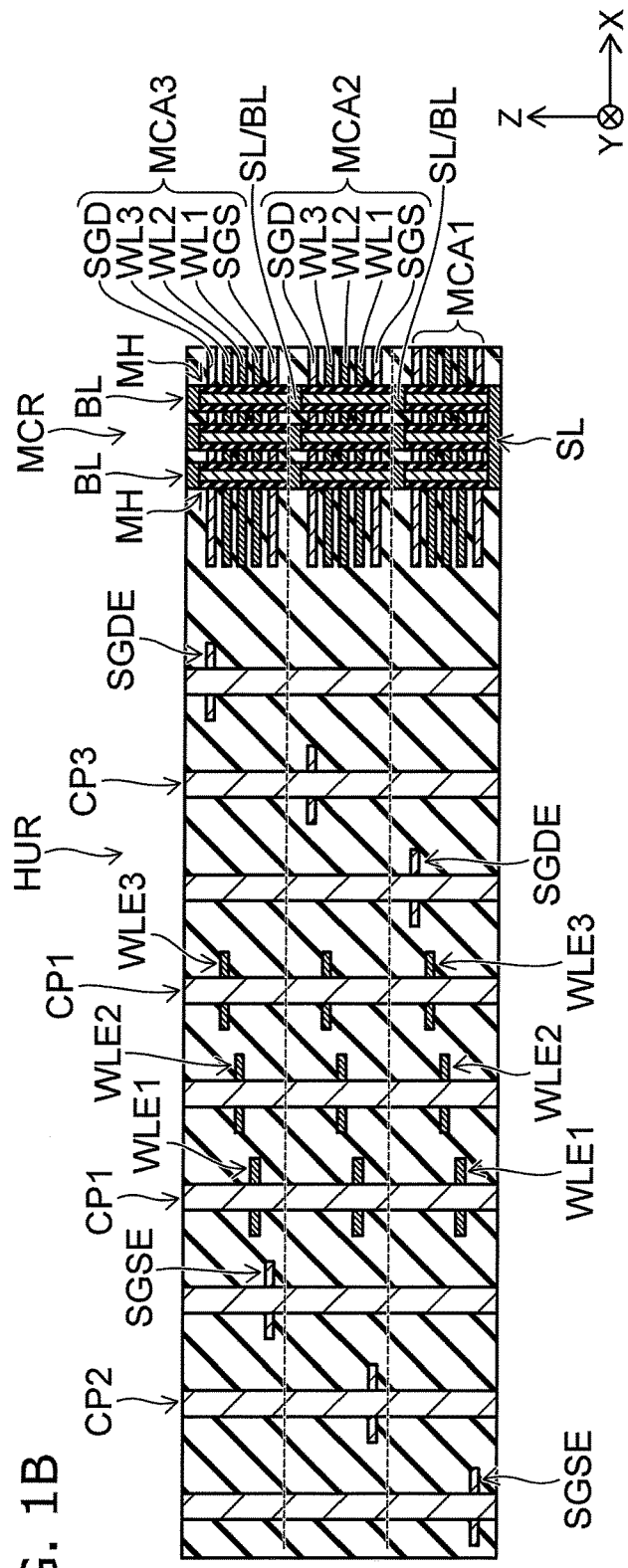

FIGS. 1A and 1B are schematic cross-sectional views showing a memory device 1 according to a first embodiment. As shown in FIG. 1A, the memory device 1 has a structure in which multiple memory cell arrays MCA1 to MCA4 are stacked in a Z-direction. The memory device 1 further includes a memory cell region MCR and a draw-out region HUR. The memory cell region MCR includes three-dimensionally arranged memory cells; and the draw-out region HUR includes the end portion of each memory cell array, and multiple contact plugs CP piercing the end portion of each memory cell array in the Z-direction.

FIG. 1B is a schematic cross-sectional view showing the structures of the memory cell region MCR and the draw-out region HUR in detail. The memory cell arrays MCA1 to MCA4 each include multiple word lines WL1 to WL3, a selection gate SGS, and a selection gate SGD. In FIG. 1B, the number of the word lines WL is drawn as being lower than the actual number for convenience.

The word lines WL1 to WL3 and the selection gates SGS and SGD are provided in plate configurations spreading in an X-direction and a Y-direction, and are stacked in the Z-direction. The word lines WL1 to WL3 are positioned between the selection gate SGS and the selection gate SGD. The memory cell arrays MCA1 to MCA4 further include multiple memory holes MH piercing the word lines WL and the selection gates SGS and SGD in the Z-direction.

In the specification, for example, there are cases where the word lines WL1 to WL3 are generally referred to as the word lines WL; and there are cases where the word lines WL1 to WL3 are described by differentiating. The other components are described similarly.

As shown in FIG. 1B, an interconnect SL/BL that is used as both a source line SL and a bit line BL is provided between the memory cell arrays MCA1 and MCA2 and between the memory cell arrays MCA2 and MCA3. The interconnect SL/BL is provided also between the memory cell array MCA3 and the not-illustrated memory cell array MCA4. For example, the interconnect SL/BL is disposed to extend in the Y-direction. The memory hole MH includes a not-illustrated semiconductor pillar 20 and a not-illustrated insulating film 30 (referring to FIG. 2B); and the semiconductor pillars 20 that are arranged in the Z-direction are connected via the interconnect SL/BL.

The draw-out region HUR includes, for example, contact plugs CP1 to CP3. The contact plug CP1 extends in the Z-direction and is connected to one of the word lines WL included in each memory cell array MCA. In other words, the contact plug CP1 is shared by one of the word lines WL of each memory cell array MCA. The contact plug CP2 is connected to one of the selection gates SGS; and the contact plug CP3 is connected to one of the selection gates SGD.

The contact plugs CP1 to CP3 are connected respectively to end portions WLE1 to WLE3 of the word lines WL, an end portion SGSE of the selection gate SGS, and an end portion SGDE of the selection gate SGD. The end portions WLE, the end portion SGSE, and the end portion SGDE are linked respectively to the word lines WL and the selection gates SGS and SGD at not-illustrated portions.

Figure 2A:
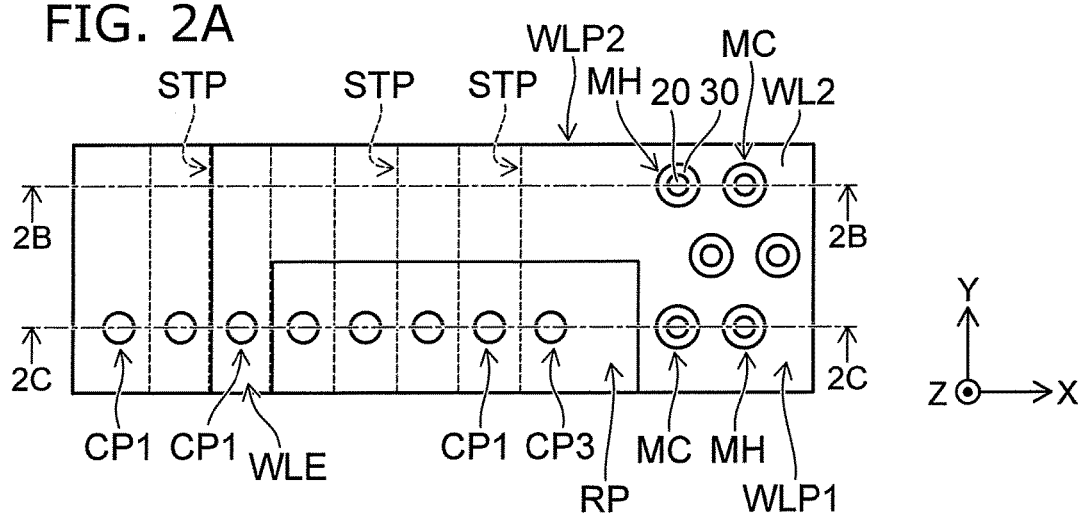
FIGS. 2A to 2C are other schematic cross-sectional views showing the memory device according to the first embodiment.
Figure 2B:
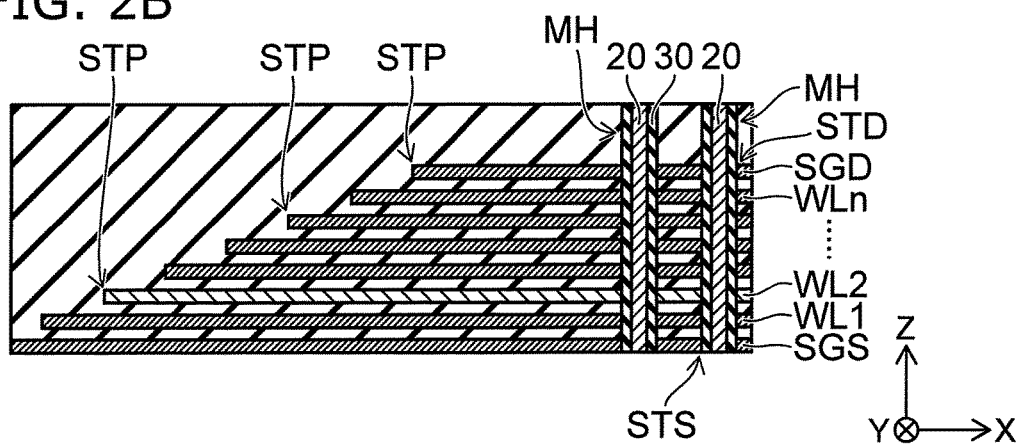
Figure 2C:
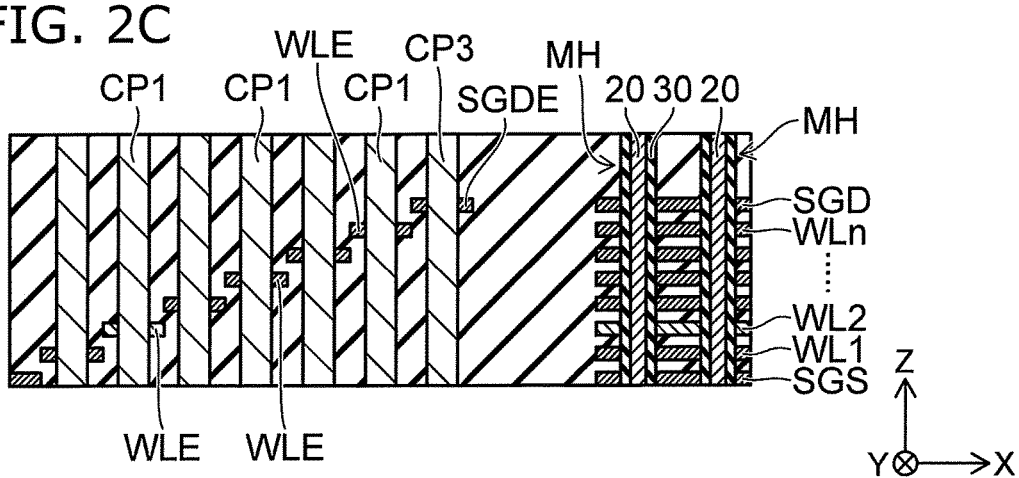

FIGS. 2A to 2C are other schematic cross-sectional views showing the memory device 1 according to the first embodiment. FIGS. 2A to 2C illustrate the structure of each memory cell array in more detail. FIG. 2A is a plan view including the word line WL2; and FIG. 2B is a cross-sectional view along line 2B-2B shown in FIG. 2A. FIG. 2C is a cross-sectional view along line 2C-2C shown in FIG. 2A.

As shown in FIG. 2A, the word line WL2 includes a first region WLP1, a second region WLP2, and the end portion WLE. The memory hole MH includes the semiconductor pillar 20 and the insulating film 30, extends in the Z-direction, and pierces the first region WLP1. The second region WLP2 is positioned between the first region WL1 and the end portion WLE and electrically connects the first region WLP1 and the end portion WLE. The outer edge of the second region WLP2 is recessed further in the Y-direction than the outer edges of the first region WLP1 and the end portion WLE; and a recess RP is provided between the first region WLP1 and the end portion WLE. The contact plugs CP1 that are connected to the other word lines WL and the contact plug CP3 that is connected to the selection gate SGD are disposed in the recess RP. The other word lines WL also have similar structures.

Memory cells MC are provided respectively at the portions where the semiconductor pillar 20 pierces the word lines WL. For example, the insulating film 30 has a so-called ONO structure in which a silicon oxide film, a silicon nitride film, and another silicon oxide film are stacked in the direction from the word line WL toward the semiconductor pillar 20, and functions as a charge retaining portion of the memory cells MC at the portions positioned between the semiconductor pillar 20 and the word lines WL.

As shown in FIG. 2B, for example, the word lines WL1 to WLn are stacked in the Z-direction between the selection gate SGS and the selection gate SGD. The end portions of the word lines WL and the selection gates SGS and SGD are provided in a staircase configuration.

The semiconductor pillar 20 extends in the Z-direction in the interior of the memory hole MH. A selection transistor STS is provided at the portion where the semiconductor pillar 20 crosses the selection gate SGS; and a selection transistor STD is provided at the portion where the semiconductor pillar 20 crosses the selection gate SGD.

As shown in FIG. 2C, the contact plugs CP extend in the Z-direction and pierce the end portions WLE, SGSE, and SGDE of the word lines WL and the selection gates SGS and SGD. Such a structure is realized by providing the recesses RP in the word lines WL and the selection gates SGS and SGD.

In the memory device 1, the memory capacity can be increased by stacking the multiple memory cell arrays MCA1 to MCA4 to increase the number of stacks of the word lines WL. By disposing the interconnects SL/BL between the memory cell arrays MCA, the increase of the length of the semiconductor pillar 20 as the number of stacks of the word lines WL increases is avoided; and the decrease of the cell current is suppressed.

By using the configuration in which one word line WL included in each memory cell array MCA share one contact plug, it is possible to reduce the width in the X-direction of the draw-out region HUR compared to the case where different contact plugs CP are connected respectively to all of the word lines WL. Thereby, a reduction of the size of the memory device 1 or a higher capacity due to the enlargement of the memory cell region MCR can be realized.

Figure 3:
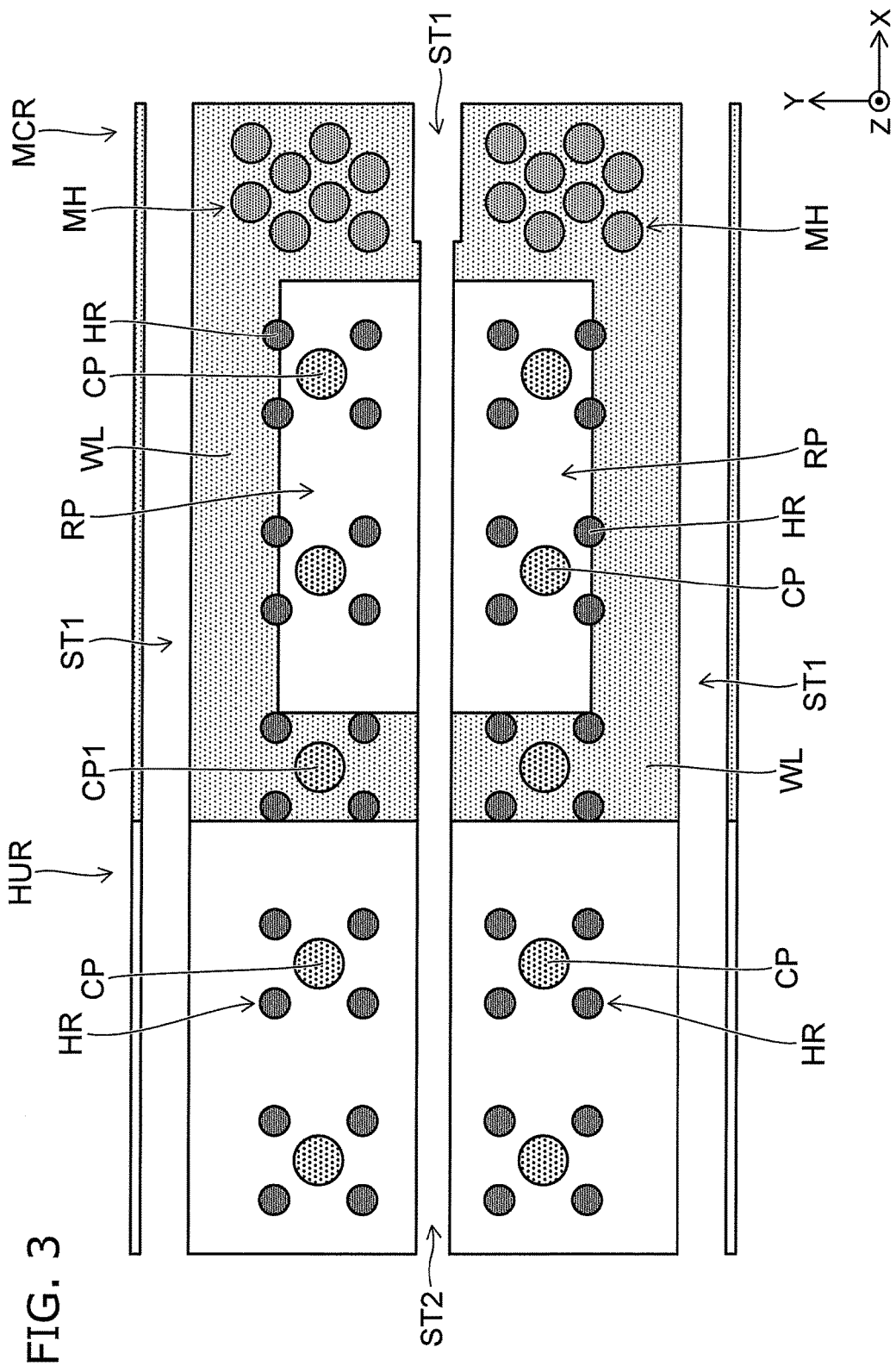
FIG. 3 is a schematic plan view showing the memory device according to the first embodiment.

FIG. 3 is a schematic plan view showing the memory device 1 according to the first embodiment. FIG. 3 is a schematic view showing the word lines WL arranged in the Y-direction.

As shown in FIG. 3, a slit ST1 is provided between the word lines WL arranged in the Y-direction. The slit ST1 extends in the X-direction and has a depth in the Z-direction that divides each of the memory cell arrays MCA. A slit ST2 that divides each of the word lines WL is provided in the draw-out region HUR. The slit ST2 is provided to communicate with the slit ST1 provided in the memory cell region MCR.

As shown in FIG. 3, for example, the word lines WL have configurations that have line symmetry around the slit ST2 as an axis of symmetry. In other words, the recesses RP of the word lines WL are arranged to face each other with the slit ST2 interposed. Columnar support bodies HR are further provided around the contact plugs CP provided in the draw-out region HUR.

A method for manufacturing the memory device 1 according to the first embodiment will now be described with reference to FIG. 4A to FIG. 29B. FIG. 4A to FIG. 29B are schematic views showing manufacturing processes of the memory device 1.

Figure 4A:
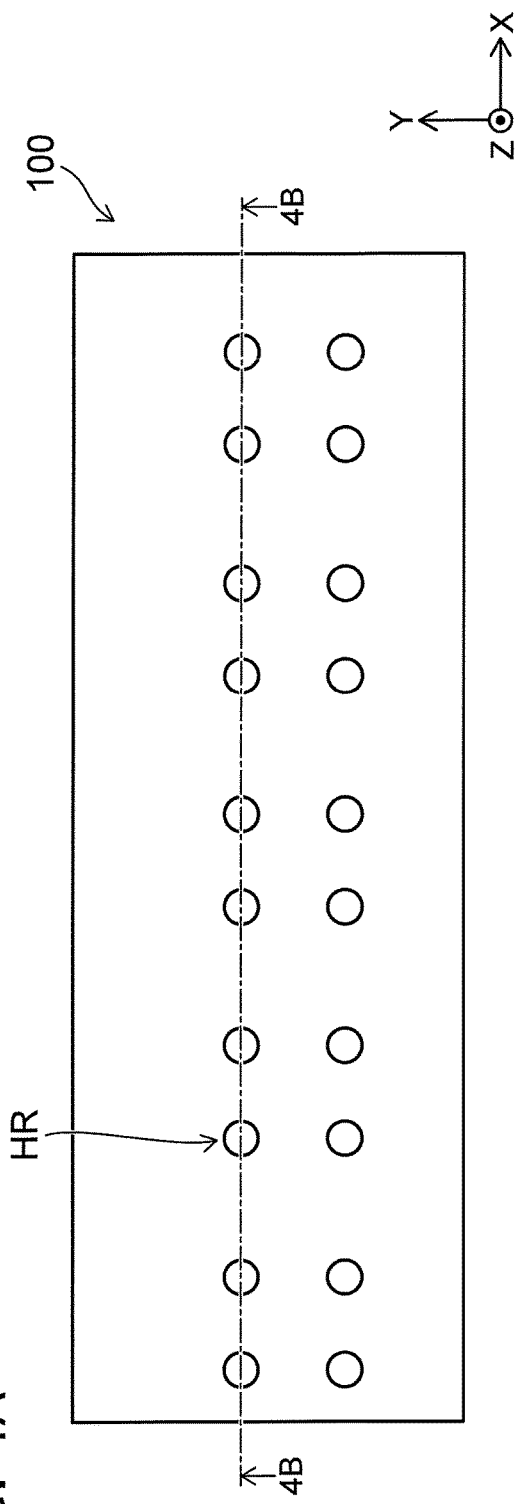
Figure 4B:
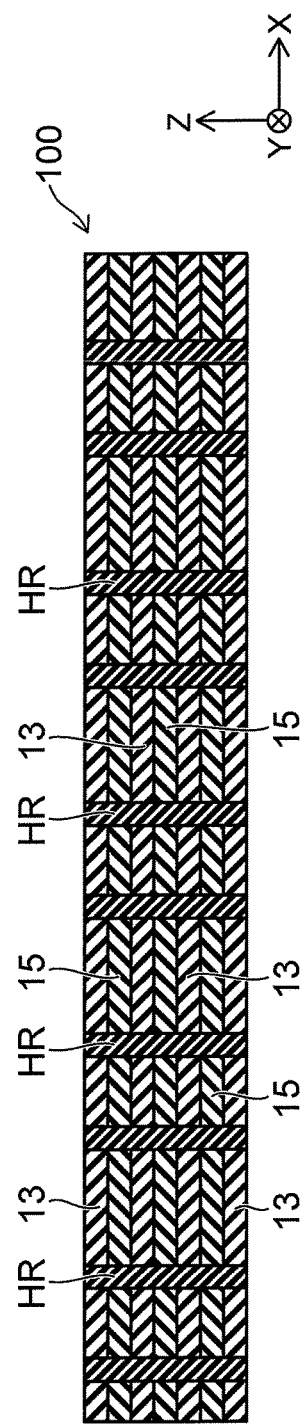

FIGS. 4A and 4B are schematic views showing a stacked body 100 provided on a not-illustrated foundation layer. FIG. 4A is a plan view showing the upper surface of the stacked body 100; and FIG. 4B is a cross-sectional view along line 4B-4B shown in FIG. 4A. Each drawing after FIGS. 4A and 4B is illustrated similarly.

For example, the stacked body 100 is provided on a silicon substrate, or is provided on a conductive layer provided on a silicon substrate with an inter-layer insulating film interposed. The stacked body 100 includes insulating films 13 and 15 stacked in the Z-direction. As shown in FIG. 4A, the stacked body 100 includes the multiple columnar support bodies HR.

As shown in FIG. 4B, the insulating films 13 and 15 are stacked alternately. The insulating films 13 are, for example, silicon oxide films; and the insulating films 15 are, for example, silicon nitride films. The columnar support bodies HR extend in the Z-direction and pierce the insulating films 13 and 15. For example, the columnar support bodies HR are silicon oxide having columnar configurations, and are provided to support the insulating films 13 and maintain a space 15s after the insulating films 15 are removed when performing selective etching of the insulating films 15 described below (referring to FIGS. 11A and 11B).

Although the same number of insulating films 15 as the number of stacks of the word lines WL and the selection gates SGS and SGD, e.g., 73, is stacked in the manufacturing processes of the memory device 1, the number of stacks of the insulating films 13 and 15 is drawn as being reduced for convenience in FIG. 4B and the following drawings. Also, the columnar support bodies HR are not illustrated in the following drawings.

Figure 5A:
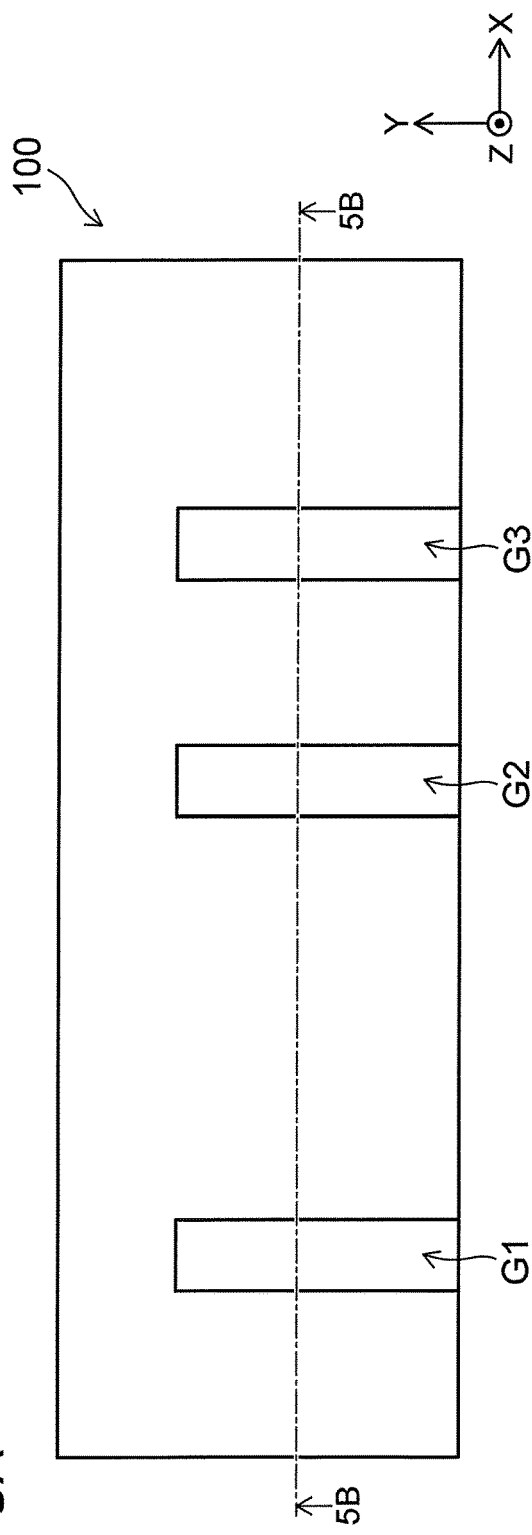
Figure 5B:
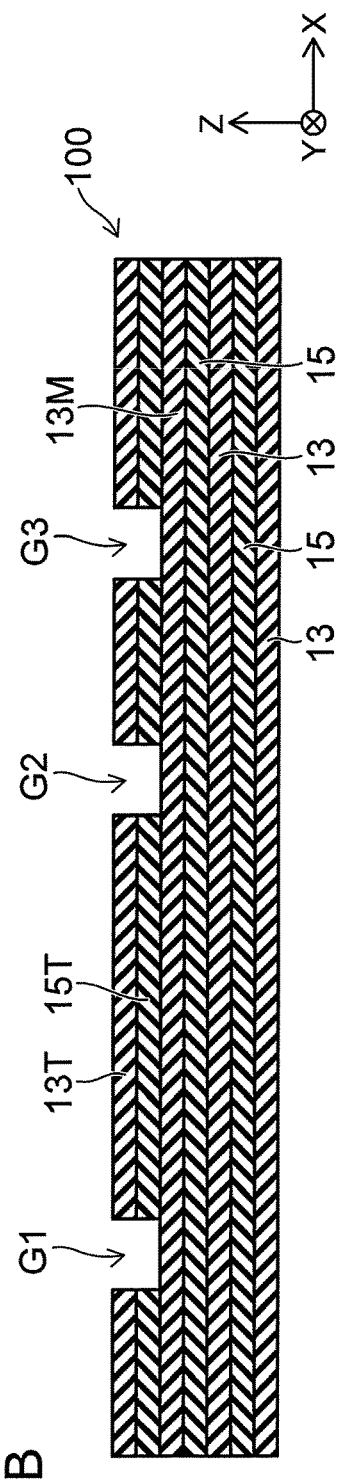

As shown in FIGS. 5A and 5B, trenches G1 to G3 that extend in the Y-direction are formed in the surface layer of the stacked body 100. The same number of trenches G1 to G3 as the number of stacks of the insulating films 15 is formed.

As shown in FIG. 5B, the trenches G1 to G3 are formed by selectively removing an insulating film 13T and an insulating film 15T in order. The insulating film 13T is the uppermost layer of the insulating films 13; and the insulating film 15T is the uppermost layer of the insulating films 15. An insulating film 13M is exposed at the bottom surfaces of the trenches G1 to G3.

As shown in FIGS. 6A and 6B, a resist mask 17 is formed on the stacked body 100. The resist mask 17 fills the interiors of the trenches G1 to G3 and is formed to have an opening for forming a first level difference STP1.

As shown in FIG. 6B, the insulating films 13T and 15T are selectively removed by using the resist mask 17; and a level difference STP1 is formed.

As shown in FIGS. 7A and 7B, slimming of the resist mask 17 is performed; and the opening is widened to a position for forming a second level difference STP2. At this time, the trench G1 which is at the position most proximal to the level difference STP1 is exposed.

As shown in FIG. 7B, the insulating film 13T and the insulating film 15T are selectively removed by using the resist mask 17; and the level difference STP2 is formed. Simultaneously, the level difference STP1 and insulating films 13M and 15M exposed in the trench G1 are selectively removed to be shifted to positions one level lower each.

As shown in FIGS. 8A and 8B, slimming of the resist mask 17 is performed; and the opening is widened to a position for forming a third level difference STP3. At this time, the trench G2 which is at the position most proximal to the level difference STP2 is exposed.

As shown in FIG. 8B, the insulating film 13T and the insulating film 15T are selectively removed by using the resist mask 17; and the level difference STP3 is formed. Simultaneously, the level difference STP1 and insulating films 13N and 15B exposed in the trench G1 are selectively removed; and the level difference STP1 and the trench G1 are shifted further to positions one level lower each. Also, the level difference STP2 and the insulating films 13M and 15M exposed in the trench G2 are selectively removed; and the level difference STP2 and the trench G2 are shifted to positions one level lower each.

In the actual manufacturing processes, slimming of the resist mask 17 is performed further, or another resist mask is formed; and subsequently, the etching of the insulating film 13 and the insulating film 15 is repeated until the same number of level differences STP as the number of stacks of the insulating films 15 is formed.

As shown in FIGS. 9A and 9B, an insulating film 21 that covers the upper surface of the stacked body 100 is formed. The insulating film 21 is, for example, a silicon oxide film. The insulating film 21 covers the level differences STP1 to STP3 and is formed to fill the interiors of the trenches G1 to G3.

As shown in FIGS. 10A and 10B, the insulating film 21 is removed while causing the portions filled into the interiors of the trenches G1 to G3 to remain. For example, the insulating film 21 is removed by etch-back using isotropic dry etching.

As shown in FIGS. 11A and 11B, the slit ST1 that subdivides the stacked body 100 into multiple portions is formed; and subsequently, the insulating films 15 are selectively etched. For example, the slit ST1 is formed using anisotropic RIE (Reactive Ion Etching).

In the case where the insulating films 13 and 21 are silicon oxide films and the insulating films 15 are silicon nitride films, for example, the insulating films 15 can be selectively removed by using hot phosphoric acid. The arrows shown in FIG. 11A show the progress direction of the etching of the insulating films 15.

As shown in FIG. 11A, the etching of the insulating films 15 progresses from the inner wall of the slit ST1 and the portions exposed at the level differences STP1, STP2, and STP3. The etching that progresses in the X-direction from the portions exposed at the level differences STP1 to STP3 progresses until reaching the insulating films 21. In other words, the insulating films 21 function as etching stoppers of the etching progressing in the X-direction from the level differences STP1 to STP3. Conversely, the etching from the inner wall of the slit ST1 progresses with time.

For example, after the etching in the X-direction from the level differences STP1 to STP3 reaches the insulating films 21, the etching of the insulating films 15 is stopped at the time when the insulating films 15 in the memory cell region MCR are completely removed. Because more slits ST1 are provided in the memory cell region MCR than in the draw-out region HUR (referring to FIG. 3), the insulating films 15 are removed faster in the memory cell region MCR than in the draw-out region HUR. Thereby, it is possible to stop the etching of the insulating films 15 while causing the portions used to form the recesses RP of the word lines WL and the selection gates SGS and SGD to remain in the draw-out region HUR.

As shown in FIG. 11B, the space 15s is formed in the portion where the insulating film 15 is removed. The columnar support bodies HR are provided to support the insulating film 13 positioned on the space 15s (referring to FIG. 3). In the draw-out region HUR, a portion of the insulating film 15 remains and is not removed.

Figure 12A:
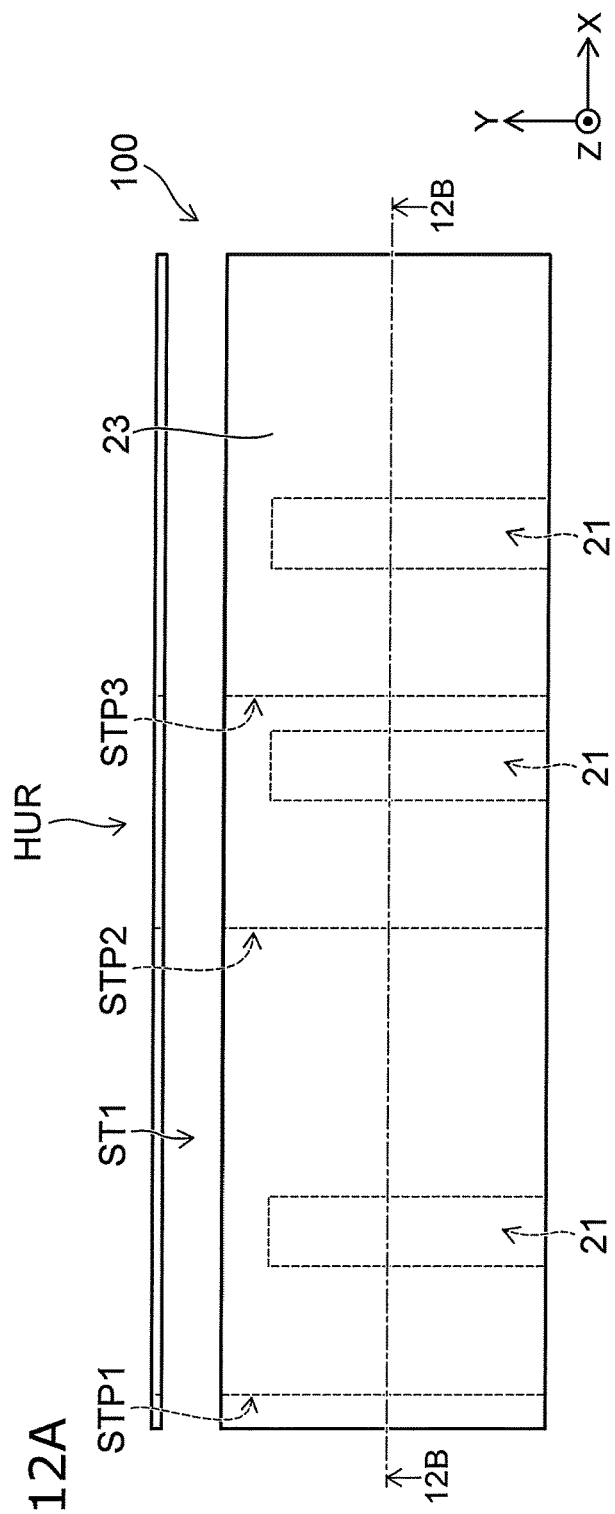
Figure 12B:
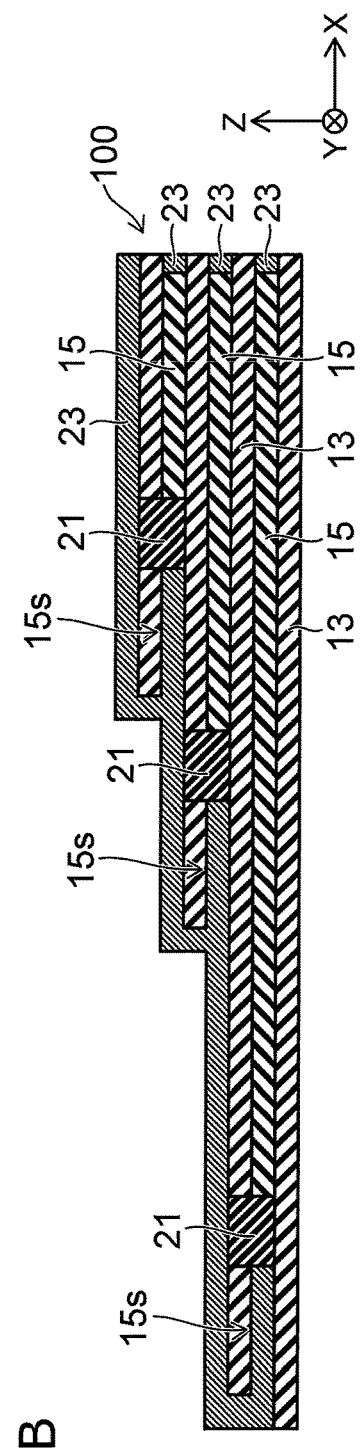

As shown in FIGS. 12A and 12B, a metal film 23 that covers the upper surface of the stacked body 100 and fills the space 15s is formed. The metal film 23 is, for example, a tungsten film formed using CVD (Chemical Vapor Deposition).

As shown in FIGS. 13A and 13B, the metal film 23 that covers the upper surface of the stacked body 100 and the inner surface of the slit ST1 is removed while causing the portions filled into the space 15s to remain. For example, the metal film 23 is removed using anisotropic RIE.

As shown in FIGS. 14A and 14B, the slit ST2 is formed; and the metal films 23 are divided. For example, the slit ST2 is formed using anisotropic RIE. Thereby, the word line WL and the selection gates SGS and SGD are formed in which the metal films 23 are subdivided. The end portion WLE of the word line WL, the end portion SGSE of the selection gate SGS, and the end portion SGDE of the selection gate SGD are formed respectively at the level differences STP1 to STP3.

Figure 15A:
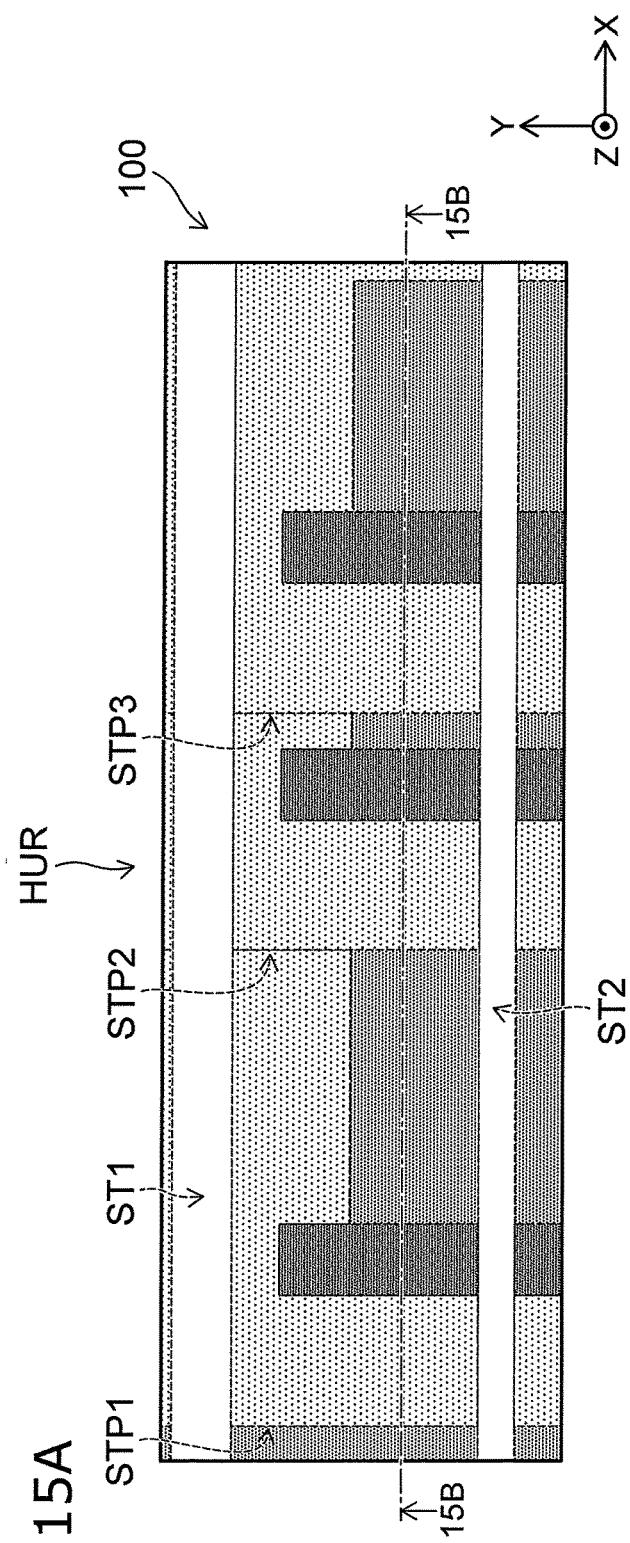
Figure 15B:
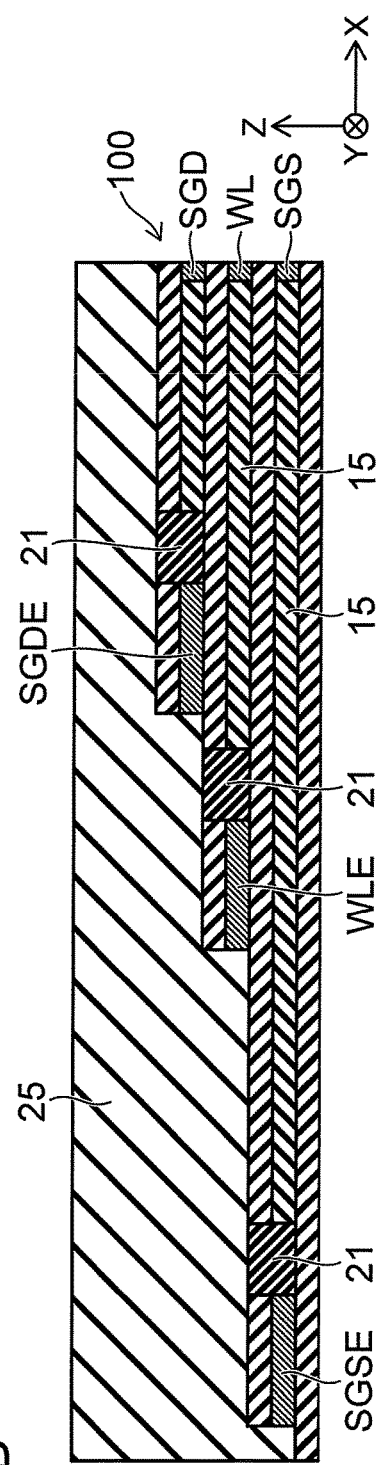

As shown in FIGS. 15A and 15B, an insulating film 25 that covers the upper surface of the stacked body 100 and fills the interiors of the slits ST1 and ST2 is formed. The insulating film 25 is, for example, a silicon oxide film formed using CVD using TEOS as a source material. The insulating film 25 buries the level differences STP1 to STP3 and has an upper surface planarized using, for example, CMP (Chemical Mechanical Polishing).

As shown in FIGS. 16A and 16B, the contact plugs CP that extend in the Z-direction and pierce the stacked body 100 and the insulating film 25 are formed. The contact plugs CP are conductive bodies that include, for example, tungsten (W) and are filled into the interiors of contact holes CC piercing the insulating film 25 and the stacked body 100.

The contact plugs CP include the contact plugs CP1 to CP3. The contact plug CP1 is connected to the end portion WLE of the word line WL of one of the multiple word lines WL included in the stacked body 100 (referring to FIG. 2C). The contact plug CP2 is connected to the end portion SGSE of the selection gate SGS. Also, a contact plug CP2 is formed that is connected to the selection gate SGS of the memory cell array MCA positioned on the stacked body 100 but is not connected to the selection gates SGS of the stacked body 100. The contact plug CP3 is connected to the end portion SGDE of the selection gate SGD. Also, a contact plug CP3 is formed that is connected to the selection gate SGD of the memory cell array MCA positioned on the stacked body 100 but is not connected to the selection gates SGD of the stacked body 100.

Figure 17A:
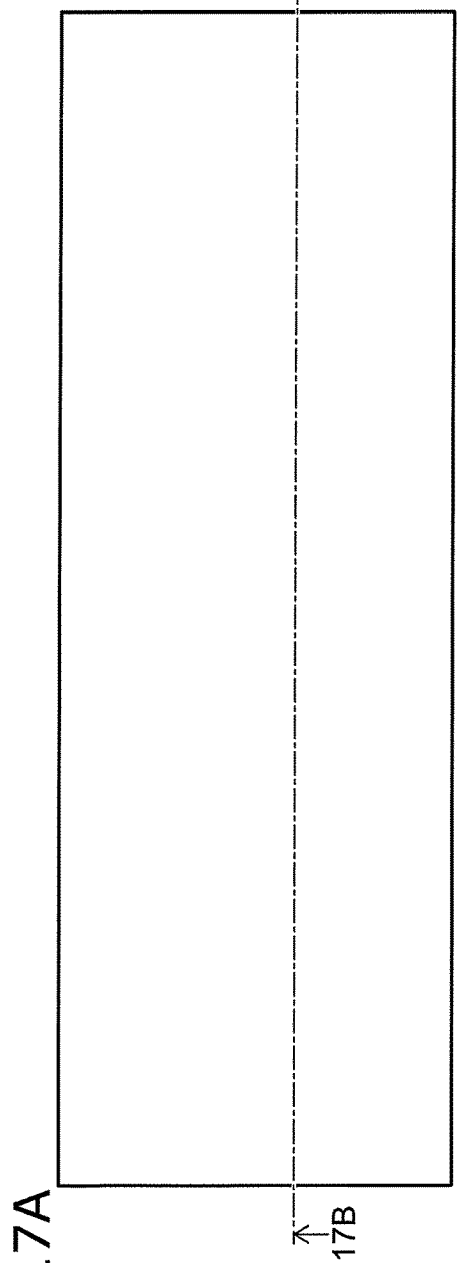
Figure 17B:
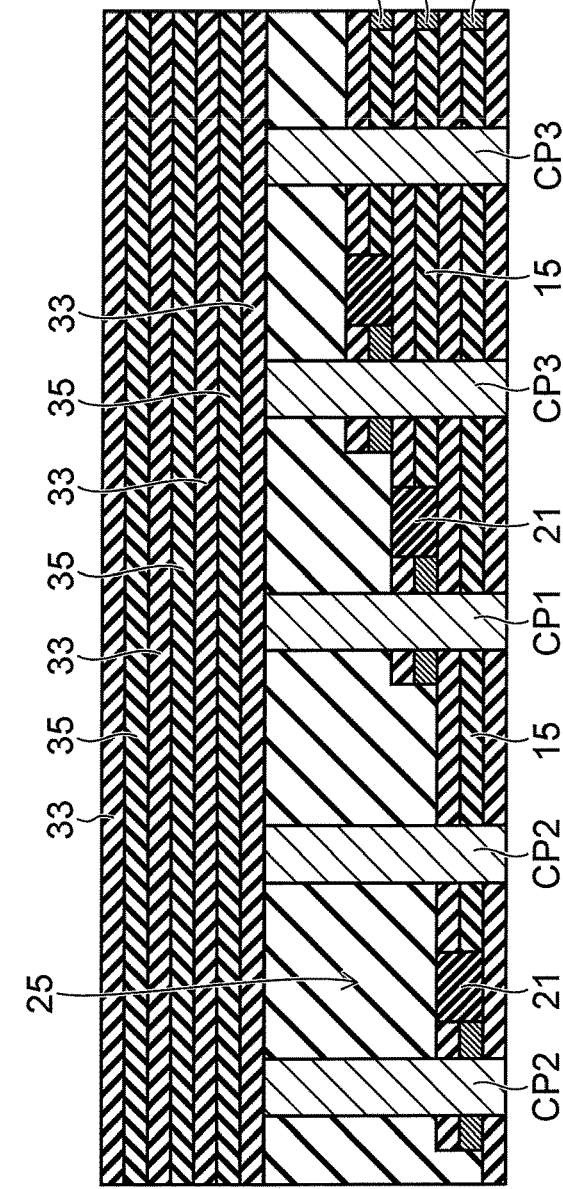

As shown in FIGS. 17A and 17B, a stacked body 200 is formed on the insulating film 25 covering the stacked body 100. The stacked body 200 includes insulating films 33 and 35. The insulating films 33 and 35 are stacked alternately on the insulating film 25. The insulating films 33 are, for example, silicon oxide films; and the insulating films 35 are, for example, silicon nitride films. Also, the interconnects SL/BL are formed in the not-illustrated memory cell region MCR before forming the stacked body 200 (referring to FIG. 1B).

Figures 18A, 18B:
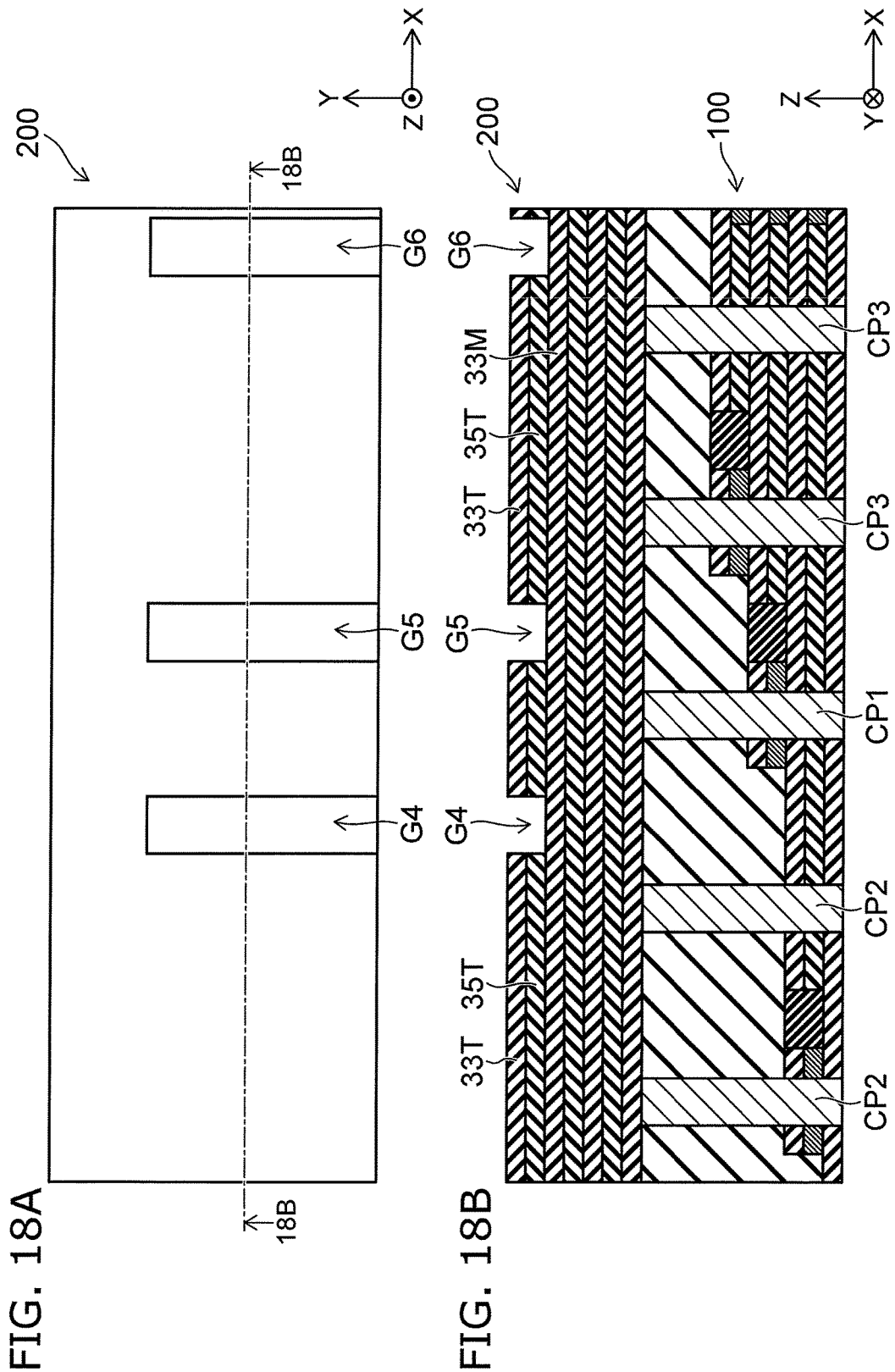

As shown in FIGS. 18A and 18B, trenches G4 to G6 that extend in the Y-direction are formed in the surface layer of the stacked body 200. The number of the trenches G4 to G6 is the same as the number of stacks of the insulating films 35.

As shown in FIG. 18B, the trenches G4 to G6 are formed by selectively removing an insulating film 33T and an insulating film 35T in order. The insulating film 33T is the uppermost layer of the insulating films 33; and the insulating film 35T is the uppermost layer of the insulating films 35. An insulating film 33M is exposed at the bottom surfaces of the trenches G4 to G6.

As shown in FIGS. 19A and 19B, a resist mask 37 is formed on the stacked body 200. The resist mask 37 fills the interiors of the trenches G4 to G6 and is formed to have an opening for forming a first level difference STP4.

As shown in FIG. 19B, the insulating films 33T and 35T are selectively removed by using the resist mask 37; and the level difference STP4 is formed.

As shown in FIGS. 20A and 20B, slimming of the resist mask 37 is performed; and the opening is widened to a position for forming a second level difference STP5. At this time, the trench G4 which is at the position most proximal to the level difference STP4 is exposed.

As shown in FIG. 20B, the insulating film 33T and the insulating film 35T are selectively removed by using the resist mask 37; and the level difference STP5 is formed. Simultaneously, the level difference STP4 and insulating films 33M and 35M exposed in the trench G4 are selectively removed and shifted to positions one level lower each.

As shown in FIGS. 21A and 21B, slimming of the resist mask 37 is performed; and the opening is widened to a position for forming a third level difference STP6. At this time, the trench G5 which is at the position most proximal to the level difference STP5 is exposed.

As shown in FIG. 21B, the insulating film 33T and the insulating film 35T are selectively removed by using the resist mask 37; and the level difference STP6 is formed. Simultaneously, the level difference STP4 and insulating films 33N and 35B exposed in the trench G4 are selectively removed; and the level difference STP4 and the trench G4 are shifted further to positions one level lower each. Also, the level difference STP5 and the insulating films 33M and 35M exposed in the trench G5 are selectively removed; and the level difference STP5 and the trench G5 are shifted to positions one level lower each.

Figures 22A, 22B:
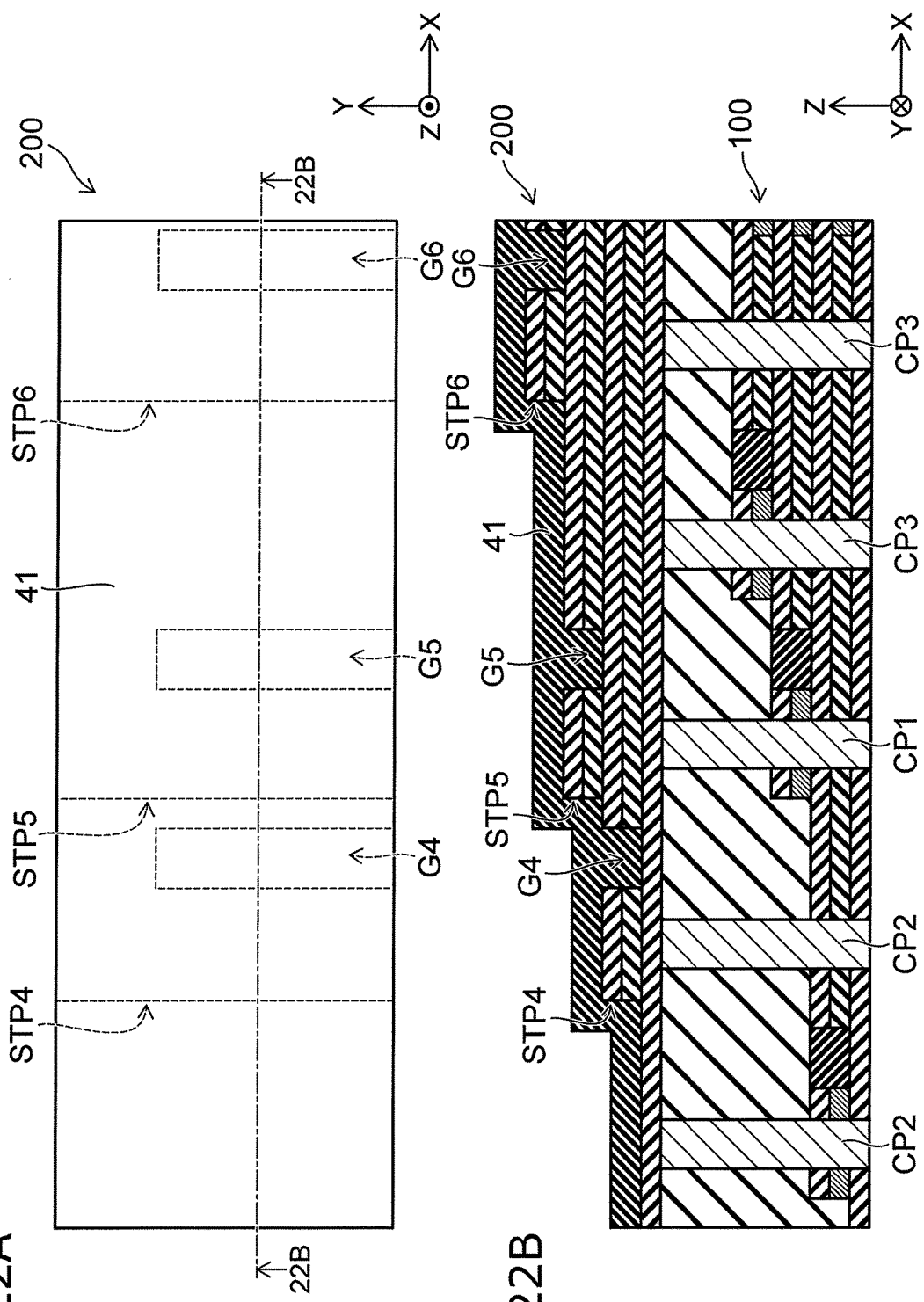

As shown in FIGS. 22A and 22B, an insulating film 41 that covers the upper surface of the stacked body 200 is formed. The insulating film 41 is, for example, a silicon oxide film. The insulating film 41 covers the level differences STP4 to STP6 and is formed to fill the interiors of the trenches G4 to G6.

As shown in FIGS. 23A and 23B, the insulating film 41 is removed while causing the portions filled into the interiors of the trenches G4 to G6 to remain.

As shown in FIG. 23B, the trench G4 is provided above the contact plug CP2 among the contact plugs CP2 provided in the stacked body 100 not connected to the selection gate SGS to position the portion of the stacked body 200 used to form the end portion SGSE of the selection gate SGS. The trench G5 is provided above one of the contact plugs CP1 provided in the stacked body 100 to position the portion used to form the end portion WLE of the word line WL of the stacked body 200. The trench G6 is provided above the contact plug CP3 among the contact plugs CP3 provided in the stacked body 100 not connected to the selection gate SGD to position the portion of the stacked body 200 used to form the end portion SGDE of the selection gate SGD.

As shown in FIGS. 24A and 24B, the slit ST1 that subdivides the stacked body 200 into multiple portions is formed; and subsequently, the insulating films 35 are selectively etched. For example, the slit ST1 is formed above the slit ST1 of the stacked body 100 by using anisotropic RIE (Reactive Ion Etching).

In the case where the insulating films 33 and 41 are silicon oxide films and the insulating films 35 are silicon nitride films, for example, the insulating films 35 can be selectively removed by using hot phosphoric acid. The arrows shown in FIG. 24A show the progress direction of the etching of the insulating films 35.

As shown in FIG. 24A, the etching of the insulating films 35 progresses from the inner wall of the slit ST1 and the portions exposed at the level differences STP4, STP5, and STP6. The etching that progresses in the X-direction from the portions exposed at the level differences STP4 to STP6 progresses until reaching the insulating films 41. Conversely, the etching from the inner wall of the slit ST1 progresses with time.

For example, after the etching in the X-direction from the level differences STP4 to STP6 reaches the insulating films 41, the etching of the insulating films 35 is stopped at the time when the insulating films 35 in the memory cell region MCR are completely removed. Thereby, the etching of the insulating films 35 can be stopped while causing the portions used to form the recesses RP of the word lines WL and the selection gates SGS and SGD to remain. Even in such a case, a space 35s is formed in the portion where the insulating film 35 is removed; and the insulating film 33 that is positioned on the space 35s is supported by the columnar support bodies HR (referring to FIG. 3).

Figure 25A:
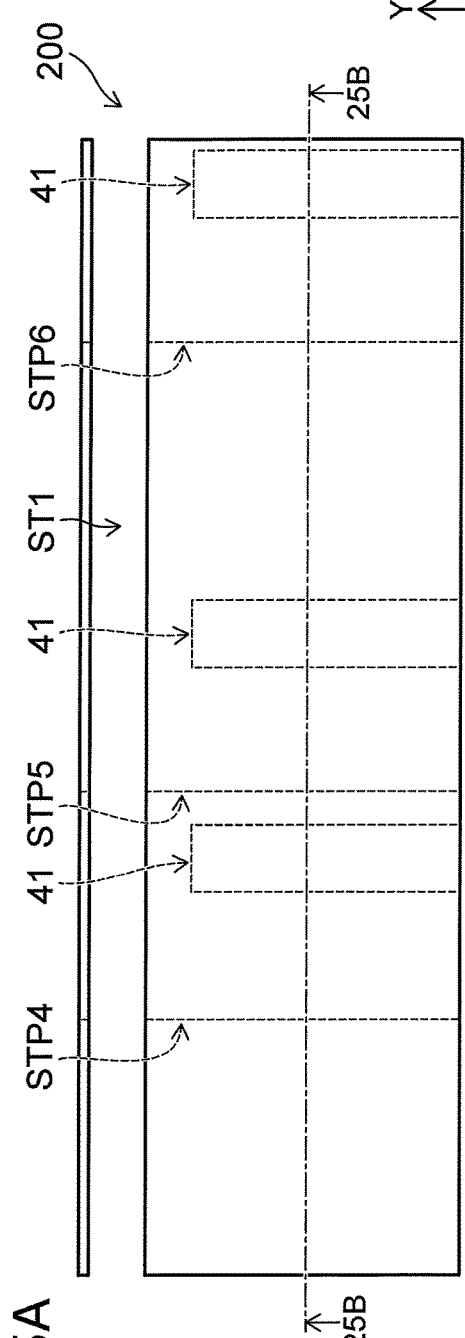
Figure 25B:
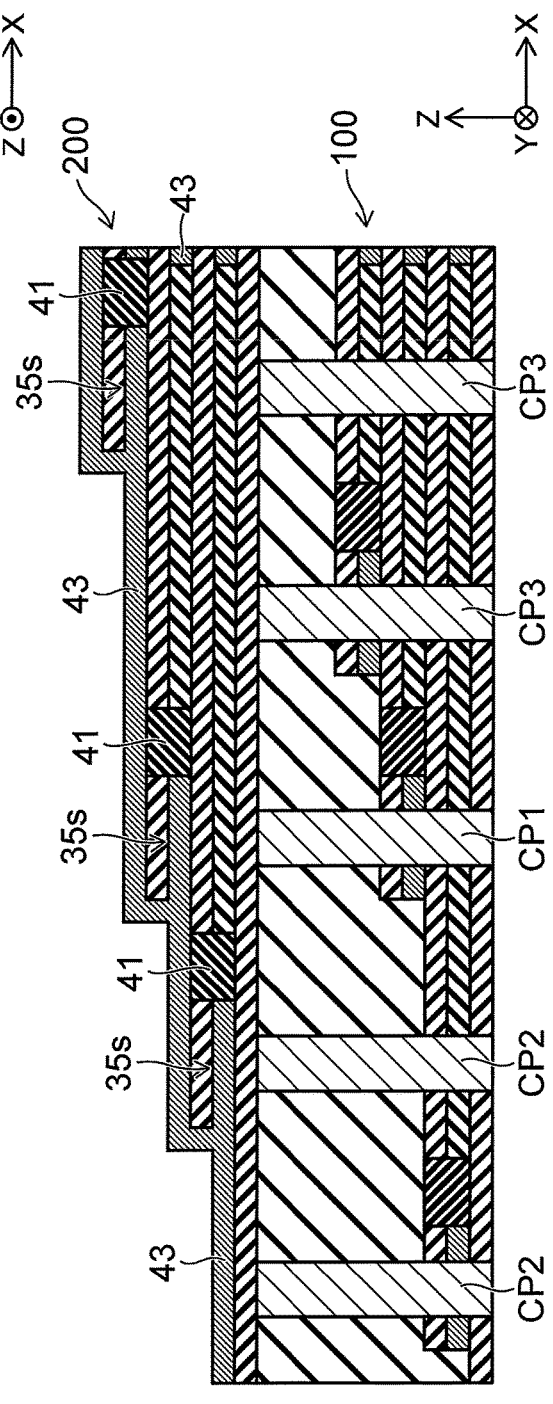

As shown in FIGS. 25A and 25B, a metal film 43 that covers the upper surface of the stacked body 200 and fills the space 35s is formed. The metal film 43 is, for example, a tungsten film formed using CVD (Chemical Vapor Deposition).

Figure 26A:
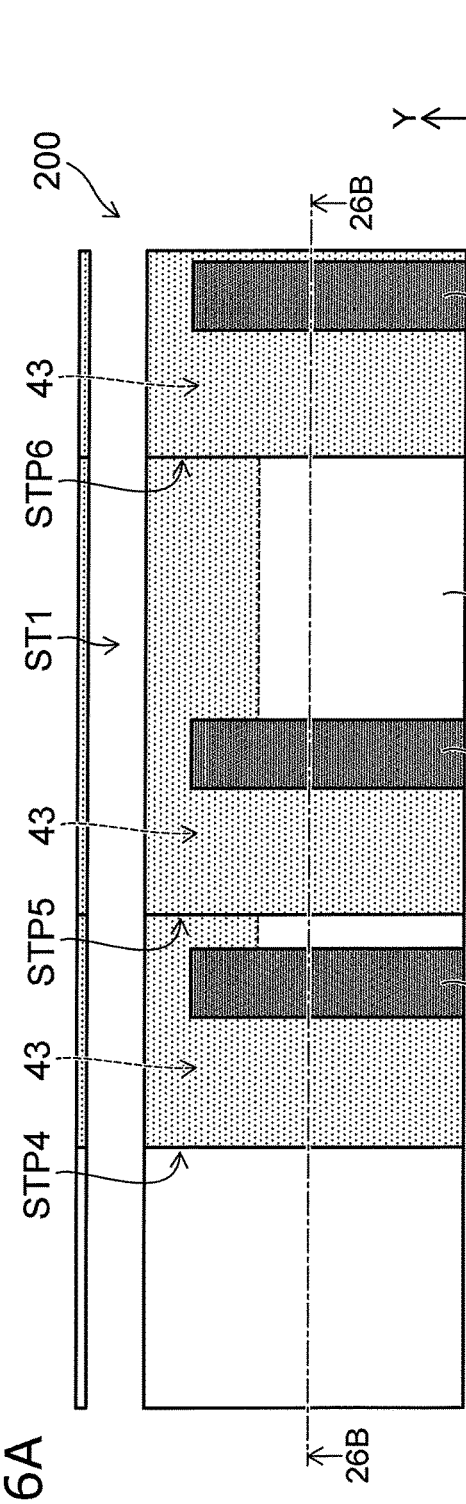
Figure 26B:
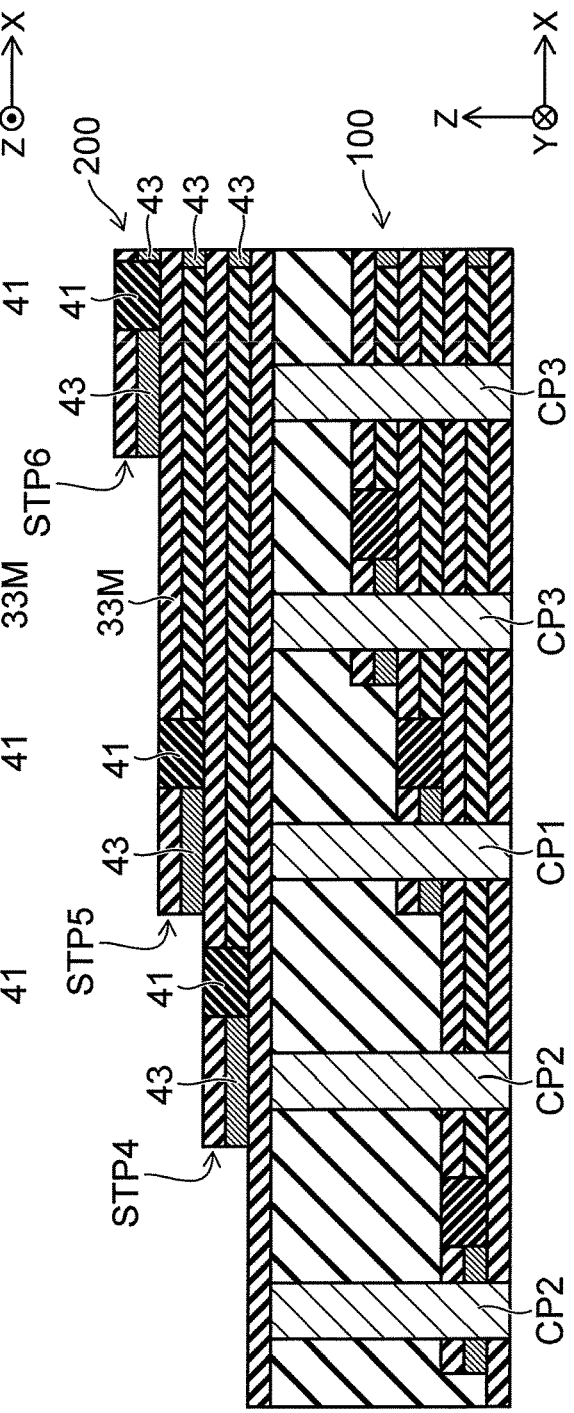

As shown in FIGS. 26A and 26B, the metal film 43 that covers the upper surface of the stacked body 200 and the inner surface of the slit ST1 is removed while causing the portion filled into the space 35s to remain.

Figures 27A, 27B:
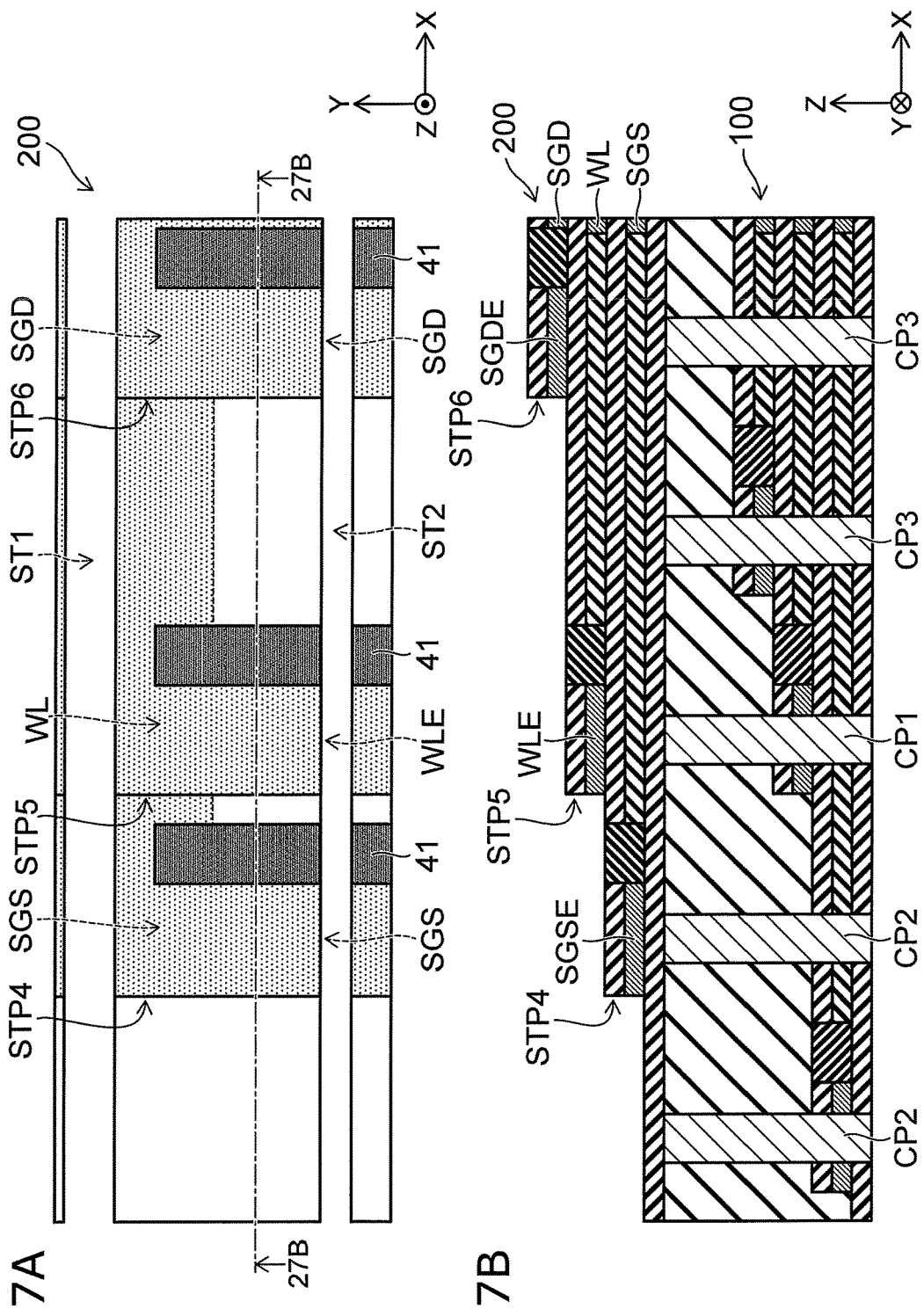

As shown in FIGS. 27A and 27B, the slit ST2 is formed; and the metal films 43 are divided. Thereby, the word line WL and the selection gates SGS and SGD are formed in which the metal films 43 are subdivided. For example, the slit ST2 is formed above the slit ST2 of the stacked body 100. The end portion WLE of the word line WL, the end portion SGSE of the selection gate SGS, and the end portion SGDE of the selection gate SGD are formed respectively at the level differences STP4 to STP6.

Figures 28A, 28B:
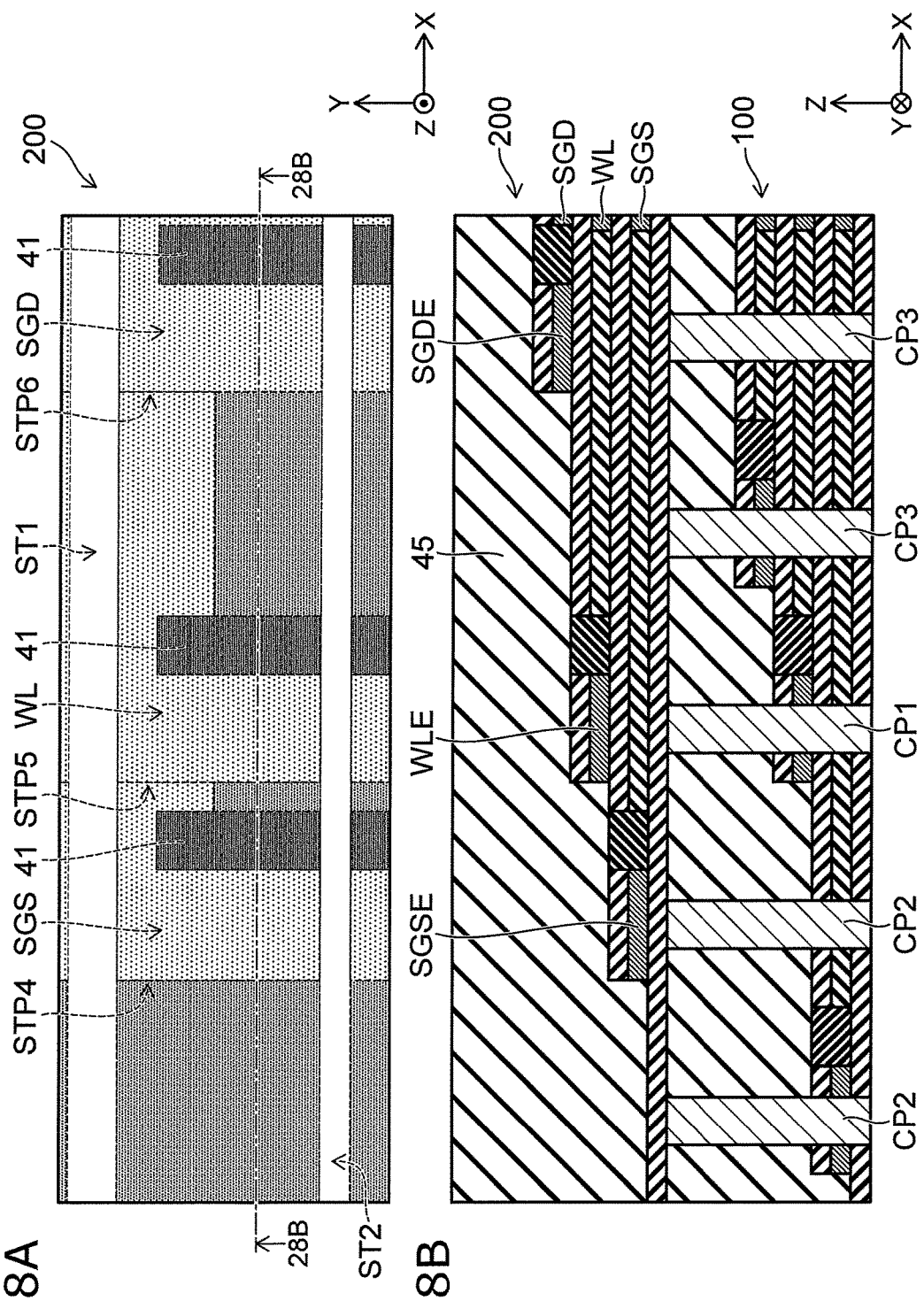

As shown in FIGS. 28A and 28B, an insulating film 45 that covers the upper surface of the stacked body 200 and fills the interiors of the slits ST1 and ST2 is formed. The insulating film 45 is, for example, a silicon oxide film formed using TEOS-CVD. The insulating film 45 buries the level differences STP4 to STP6 and has an upper surface planarized using, for example, CMP.

As shown in FIGS. 29A and 29B, contact plugs CPT that extend in the Z-direction and pierce the stacked body 200 and the insulating film 45 are formed. The contact plugs CPT are formed to communicate with the contact plugs CP piercing the stacked body 100 and the insulating film 25.

The contact plugs CPT include contact plugs CPT1 to CPT3. The contact plug CPT1 is connected to the end portion WLE of the word line WL of one of the multiple word lines WL included in the stacked body 200 (referring to FIG. 2C).

The contact plug CPT2 is disposed to be connected to the end portion SGSE of the selection gate SGS of the stacked body 200, and to be connected to the contact plug CP2 not connected to the selection gate SGS of the stacked body 100. A contact plug CPT2 also is formed to be connected to the contact plug CP2 connected to the selection gate SGS of the stacked body 100 but not connected to the selection gate SGS of the stacked body 200.

The contact plug CPT3 is connected to the end portion SGDE of the selection gate SGD of the stacked body 200 and is connected to the contact plug CP3 not connected to the selection gate SGD of the stacked body 100. A contact plug CPT3 also is formed to be connected to the contact plug CP3 connected to the selection gate SGD of the stacked body 100 but not connected to the selection gate SGD of the stacked body 200.

For example, the stacked bodies 100 and 200 correspond to the memory cell array MCA1 and the memory cell array MCA2. By further repeating the manufacturing processes shown in FIG. 17A to FIG. 29B, the memory cell arrays MCA3 and MCA4 are formed; and the memory device 1 can be completed.

In the embodiment, the contact plugs CP1 and CPT1 are formed to be shared by one of the word lines WL included in each memory cell array MCA. The contact plugs CP2 and CPT2 are formed to be connected respectively to the selection gates SGS of the memory cell arrays MCA; and the multiple selection gates SGS do not share the contact plugs CP2 and CPT2. Also, the contact plugs CP3 and CPT3 are formed to be connected respectively to the selection gates SGD of the memory cell arrays MCA; and the multiple selection gates SGD do not share the contact plugs CP3 and CPT3.

Second Embodiment

Figure 30:
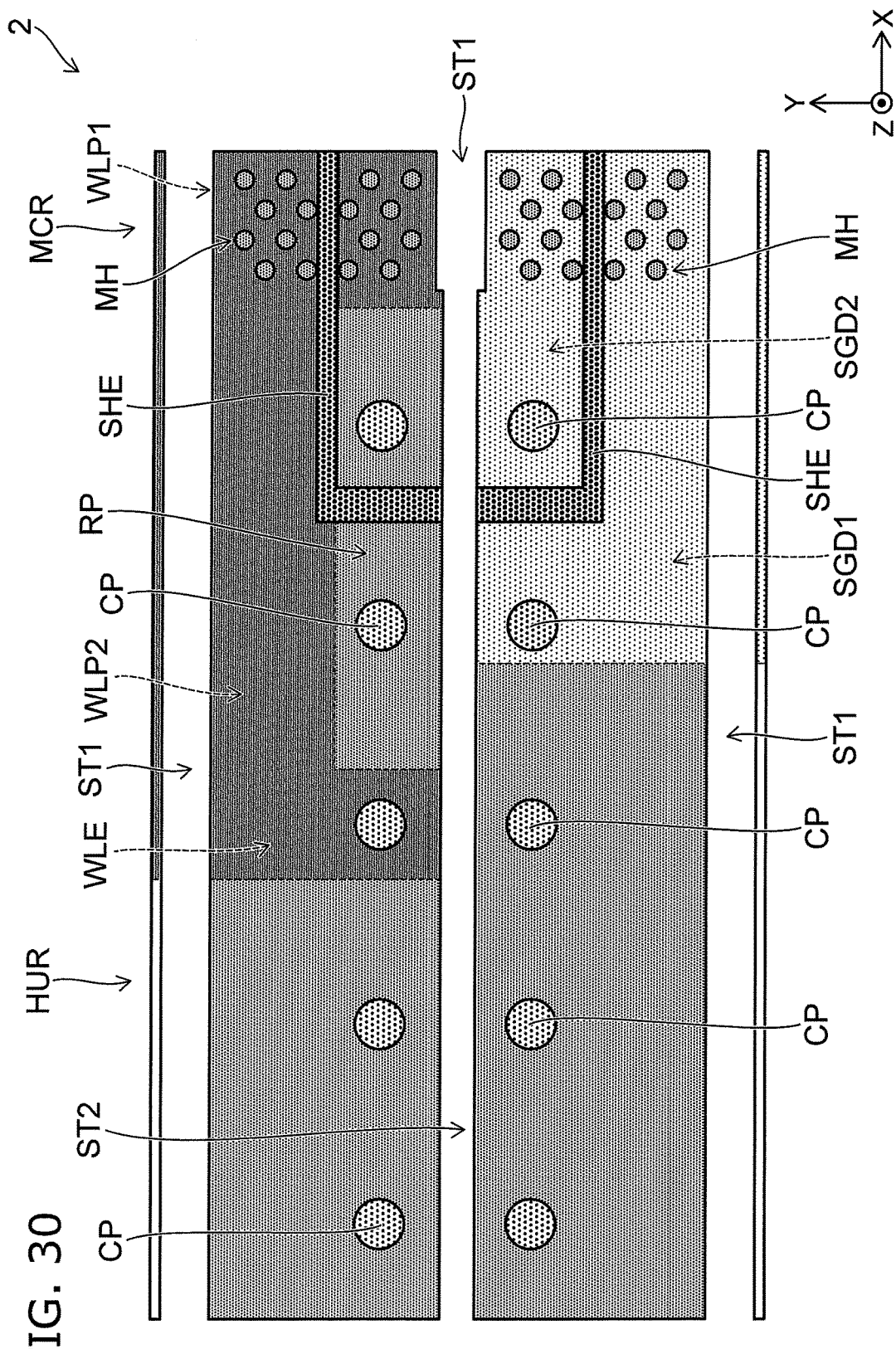
FIG. 30 is a schematic plan view showing a memory device 2 according to a second embodiment.

FIG. 30 is a schematic plan view showing a memory device 2 according to a second embodiment. In the embodiment as well, the memory device 2 has a structure in which the multiple memory cell arrays MCA are stacked in the Z-direction; and the word line WL of the memory device 2 includes the first region WLP1 where the memory holes MH are provided, the end portion WLE, and the second region WLP2 electrically connecting the first region WLP1 and the end portion WLE. The second region WLP2 has an outer edge between the first region WLP1 and the end portion WLE that is recessed further in the Y-direction than the outer edges of the first region WLP1 and the end portion WLE. Thereby, the recess RP is provided between the first region WLP1 and the end portion WLE.

The memory device 2 has a trench SHE subdividing the selection gate SGD provided on the word lines WL. For example, a silicon oxide film is filled into the interior of the trench SHE and electrically insulates between a selection gate SGD1 and a selection gate SGD2 subdivided into two. Thereby, in the case where the number of the memory holes MH piercing the word lines WL is increased, it is possible to operate the memory cells MC without increasing the number of the bit lines BL and without increasing the scale of the circuit connected to the bit lines BL.

The memory device 2 includes the contact plugs CP piercing the draw-out region HUR of each of the memory cell arrays MCA and being shared by one of the word lines WL of each memory cell array MCA. Thereby, the number of stacks of the word lines WL can be increased and the memory capacity can be increased without increasing the surface area of the draw-out region HUR.

A method for manufacturing the memory device 2 according to the second embodiment will now be described with reference to FIG. 31A to FIG. 50. FIG. 31A to FIG. 50 are schematic views showing manufacturing processes of the memory device 2.

FIGS. 31A and 31B are schematic views showing the stacked body 100 provided on a not-illustrated foundation layer. The stacked body 100 includes the insulating films 13 and 15 stacked in the Z-direction.

As shown in FIG. 31B, the insulating films 13 and 15 are stacked alternately in the Z-direction. The insulating films 13 are, for example, silicon oxide films; and the insulating films 15 are, for example, silicon nitride films. In FIG. 31B and subsequent cross-sectional views, the number of stacks of the insulating films 13 and 15 is drawn as being reduced for convenience.

In the memory cell region MCR, the memory holes MH that pierce the stacked body 100 in the Z-direction are formed. The semiconductor pillar 20 and the insulating film 30 are provided in the interiors of the memory holes MH. The semiconductor pillar 20 includes, for example, polysilicon and functions as the channels of the memory cells MC. The insulating film 30 includes, for example, multiple insulating films stacked on the inner walls of the memory holes MH and functions as charge retaining layers of the memory cells MC. In the following cross-sectional view, the semiconductor pillar 20 and the insulating film 30 are not illustrated for convenience.

As shown in FIGS. 32A and 32B, the trench SHE is formed in the surface layer of the stacked body 100. The trench SHE includes a first portion SHE1 extending in the X-direction and reaching the memory cell region MCR, and a second portion SHE2 communicating with the first portion SHE1 and extending in the Y-direction in the draw-out region HUR. The trench SHE divides the insulating film 13T and the insulating film 15T and is formed to a depth reaching the insulating film 13M. For example, a silicon oxide film is filled into the interior of the trench SHE.

Figure 33A:
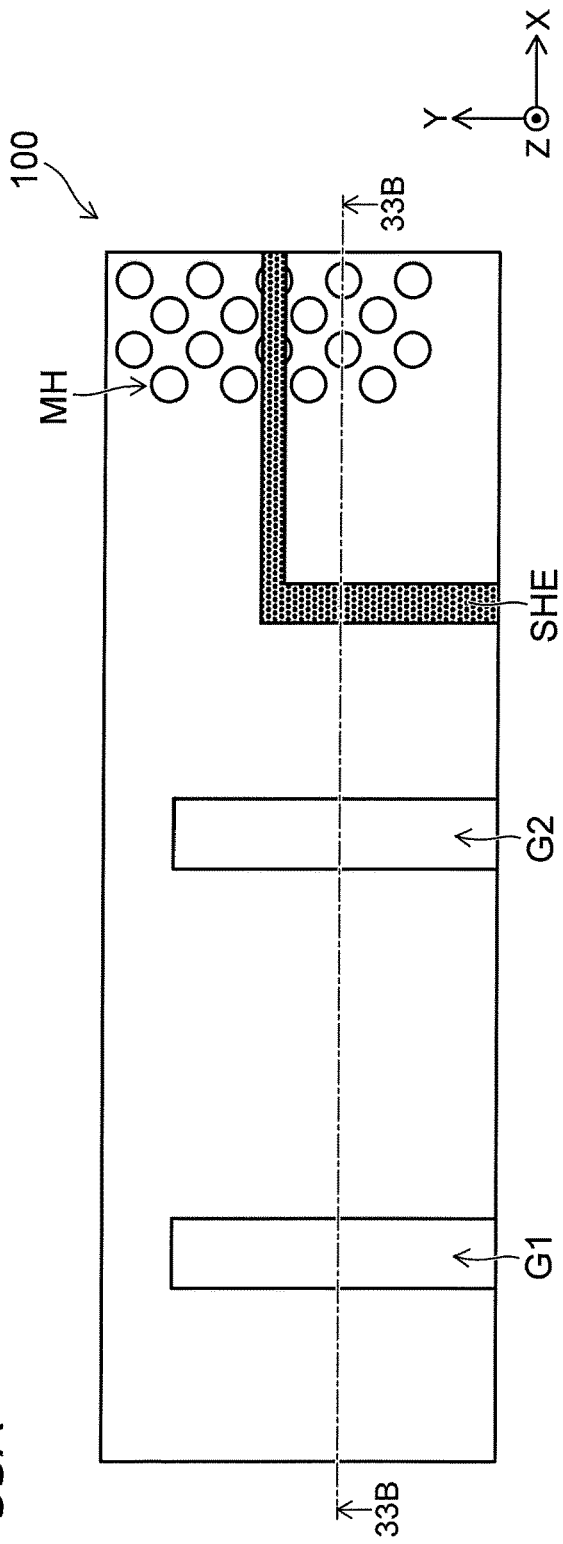
Figure 33B:
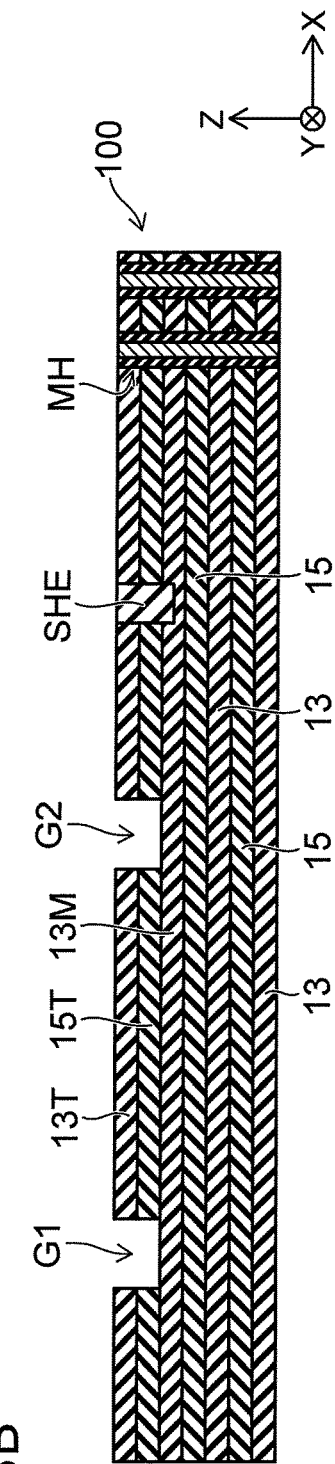

As shown in FIGS. 33A and 33B, the trenches G1 and G2 that extend in the Y-direction are formed in the surface layer of the stacked body 100.

As shown in FIG. 33B, the trenches G1 and G2 are formed by selectively removing the insulating film 13T and the insulating film 15T in order. The insulating film 13M is exposed at the bottom surfaces of the trenches G1 and G2.

As shown in FIGS. 34A and 34B, the resist mask 17 is formed on the stacked body 100. The resist mask 17 fills the interiors of the trenches G1 and G2 and is formed to have an opening for forming the first level difference STP1. Continuing as shown in FIG. 34B, the level difference STP1 is formed by selectively removing the insulating films 13T and 15T by using the resist mask 17.

As shown in FIGS. 35A and 35B, slimming of the resist mask 17 is performed; and the opening is widened to a position for forming the second level difference STP2. At this time, the trench G1 which is at the position most proximal to the level difference STP1 is exposed.

As shown in FIG. 35B, the level difference STP2 is formed by selectively removing the insulating film 13T and the insulating film 15T by using the resist mask 17. Simultaneously, the level difference STP1 and the insulating films 13M and 15M exposed in the trench G1 are selectively removed and shifted to positions one level lower each.

As shown in FIGS. 36A and 36B, slimming of the resist mask 17 is performed; and the opening is widened to a position for forming the third level difference STP3. At this time, the trench G2 which is at the position most proximal to the level difference STP2 is exposed.

As shown in FIG. 36B, the level difference STP3 is formed by selectively removing the insulating film 13T and the insulating film 15T by using the resist mask 17. Simultaneously, the level difference STP1 and the insulating films 13N and 15B exposed in the trench G1 are selectively removed; and the level difference STP1 and the trench G1 are shifted to positions one level lower each. Also, the level difference STP2 and the insulating films 13M and 15M exposed in the trench G2 are selectively removed; and the level difference STP2 and the trench G2 are shifted to positions one level lower each.

As shown in FIGS. 37A and 37B, the insulating film 21 that covers the upper surface of the stacked body 100 is formed. The insulating film 21 is, for example, a silicon oxide film. The insulating film 21 covers the level differences STP1 to STP3 and is formed to fill the interiors of the trenches G1 and G2.

As shown in FIGS. 38A and 38B, the insulating film 21 is removed while causing the portions filled into the interiors of the trenches G1 and G2 to remain.

Figure 39A:
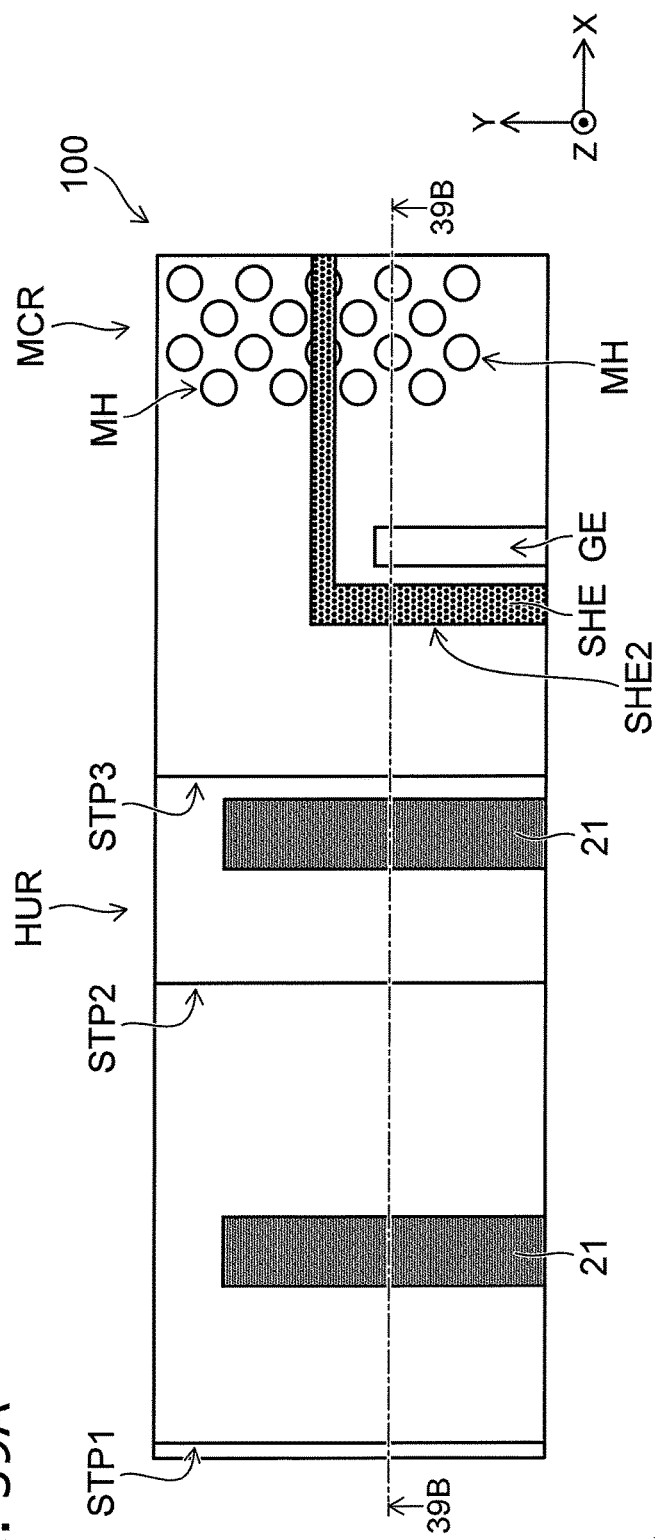
Figure 39B:
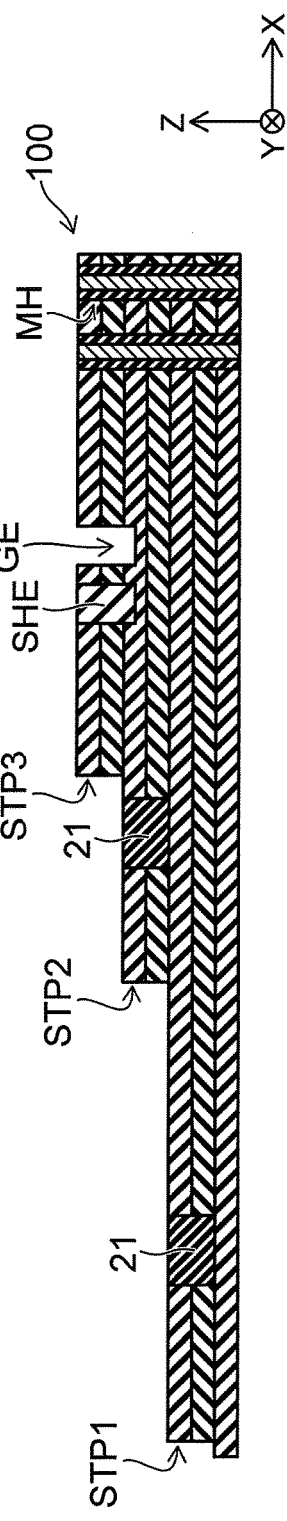

As shown in FIGS. 39A and 39B, a trench GE is formed in a portion positioned between the trench SHE and the memory cell region MCR. The trench GE extends along the second portion SHE2 of the trench SHE and is formed to a depth reaching the insulating film 13M from the upper surface of the insulating film 13T.

As shown in FIGS. 40A and 40B, the slit ST1 that subdivides the stacked body 100 into multiple portions is formed. The slit ST1 includes a slit ST1a extending in both the memory cell region MCR and the draw-out region HUR, and a slit ST1b dividing the memory cell region MCR but not extending to the draw-out region HUR.

Figure 41A:
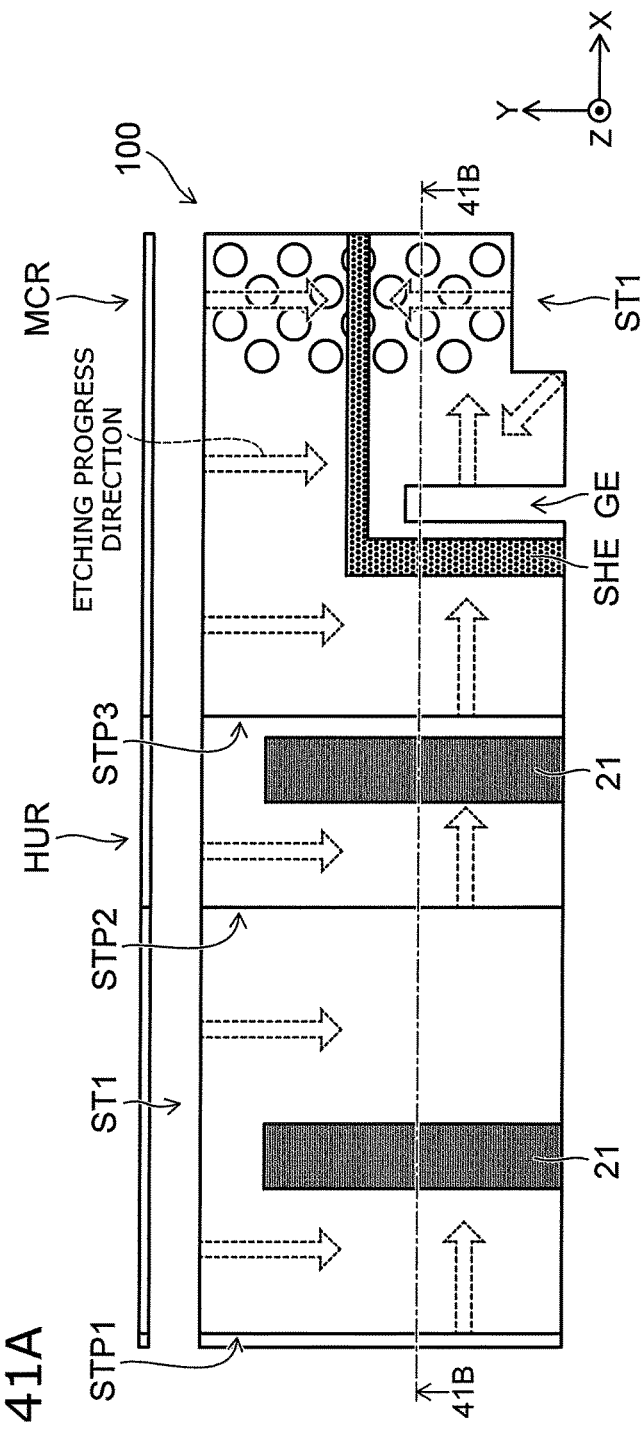
Figure 41B:
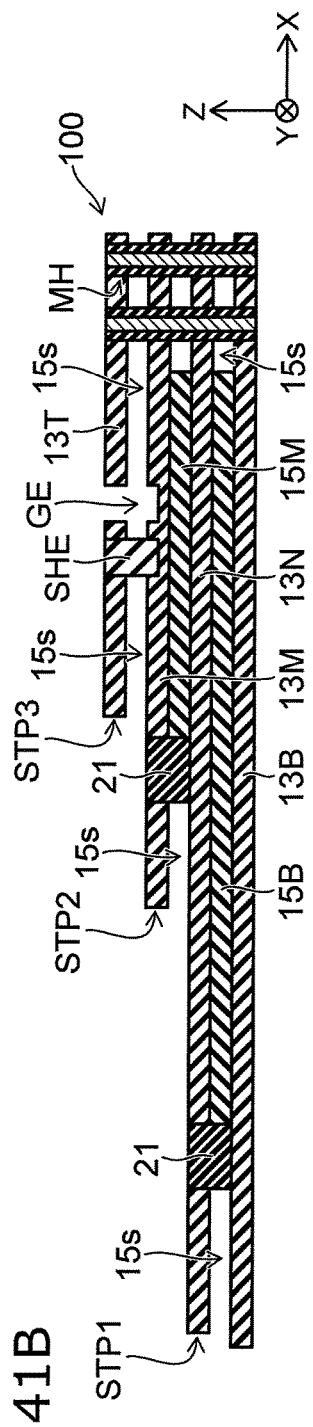

As shown in FIGS. 41A and 41B, the insulating films 15 are selectively etched.

The arrows shown in FIG. 41A show the progress direction of the etching of the insulating films 15. The etching of the insulating films 15 progresses from the inner wall of the slit ST1 and the portions exposed at the level differences STP1, STP2, and STP3. In the example as well, after the etching progresses in the X-direction from the level differences STP1 and STP and reaches the insulating films 21, the time until all of the insulating films 15 in the memory cell region MCR are removed is controlled. In the example, the etching of the insulating film 15T of the uppermost layer progresses differently from the other insulating films 15.

Figure 42:
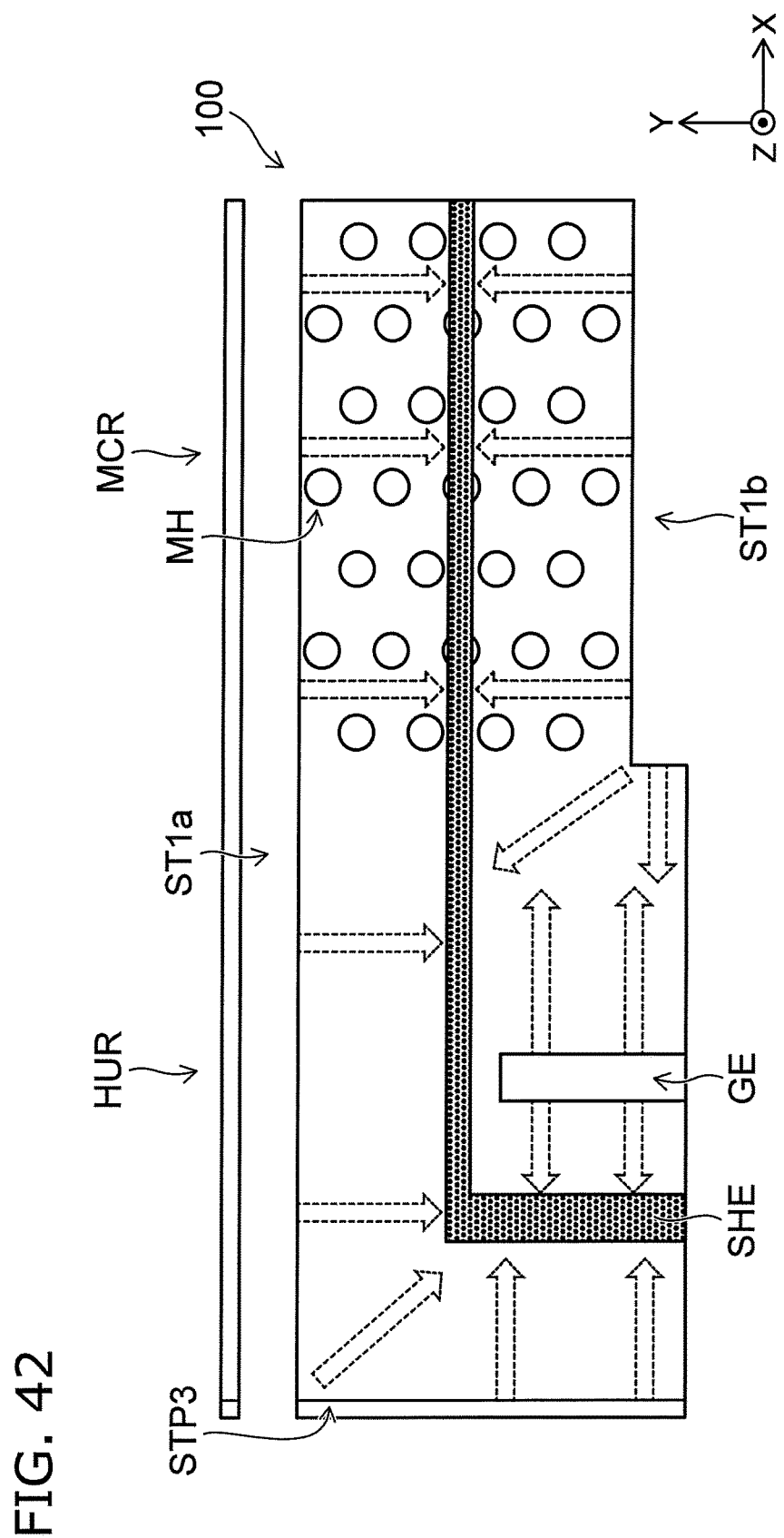

FIG. 42 is a schematic view showing the progress of the etching of the insulating film 15T divided by the trench SHE. In the memory cell region MCR, the etching that progresses from the inner walls of the slits ST1a and ST1b reaches the trench SHE and is stopped. Conversely, in the draw-out region HUR, the etching that progresses from the slit ST1a and the level difference STP3 reaches the trench SHE and is stopped; but the time for the etching that progresses in the X-direction from the slit ST1b to reach the trench SHE is longer than that of the other portions. Therefore, the etching that progresses in the X-direction from the slit ST1b may not always reach the trench SHE within the prescribed amount of time. Therefore, by providing the trench GE in the example, the etching in the X-direction is promoted so that the entire insulating film 15T is removed.

Figure 43:
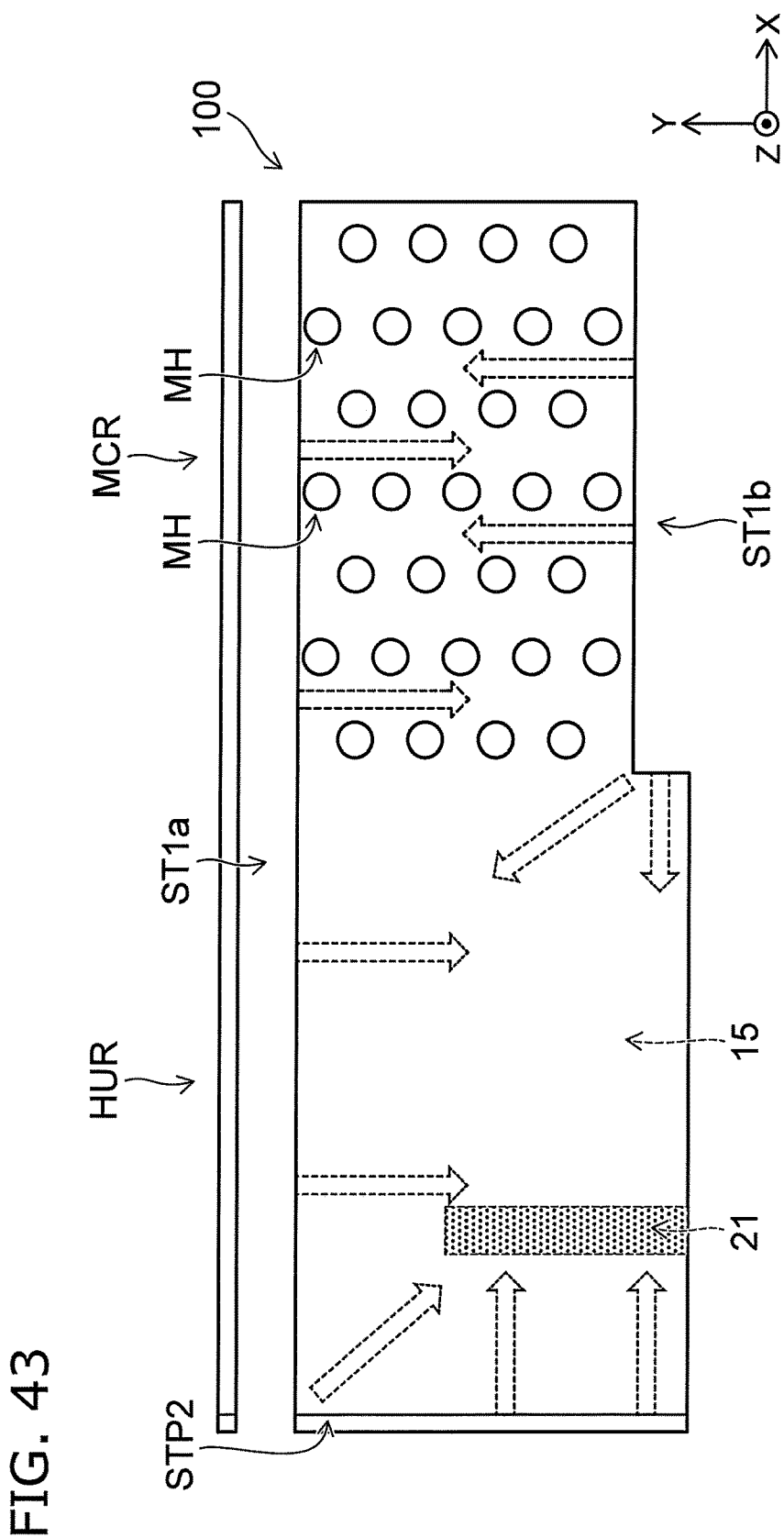

FIG. 43 is a schematic view showing the progress of the etching of the insulating film 15M. For example, the etching that progresses in the X-direction from the level difference STP2 progresses until reaching the insulating film 21. In contrast, the etching from the slits ST1a and ST1b progresses with time. In the memory cell region MCR, the entire insulating film 15M is removed because the etching progresses in the Y-direction from both the slits ST1a and ST1b. Conversely, in the draw-out region HUR to which the slit ST1b does not extend, a portion of the insulating film 15M remains without being etched; and the region that becomes the recess RP of the word line WL is formed.

As a result, as shown in FIG. 41B, the entire insulating film 15T of the uppermost layer is removed; and the etching can be controlled so that portions of the insulating films 15M and 15B under the insulating film 15T remain in the draw-out region HUR. The space 15s is formed in the portions where the insulating films 15 are removed. In the example as well, the columnar support bodies HR are provided to support the insulating film 13 positioned on the space 15s (referring to FIG. 3).

Figure 44A:
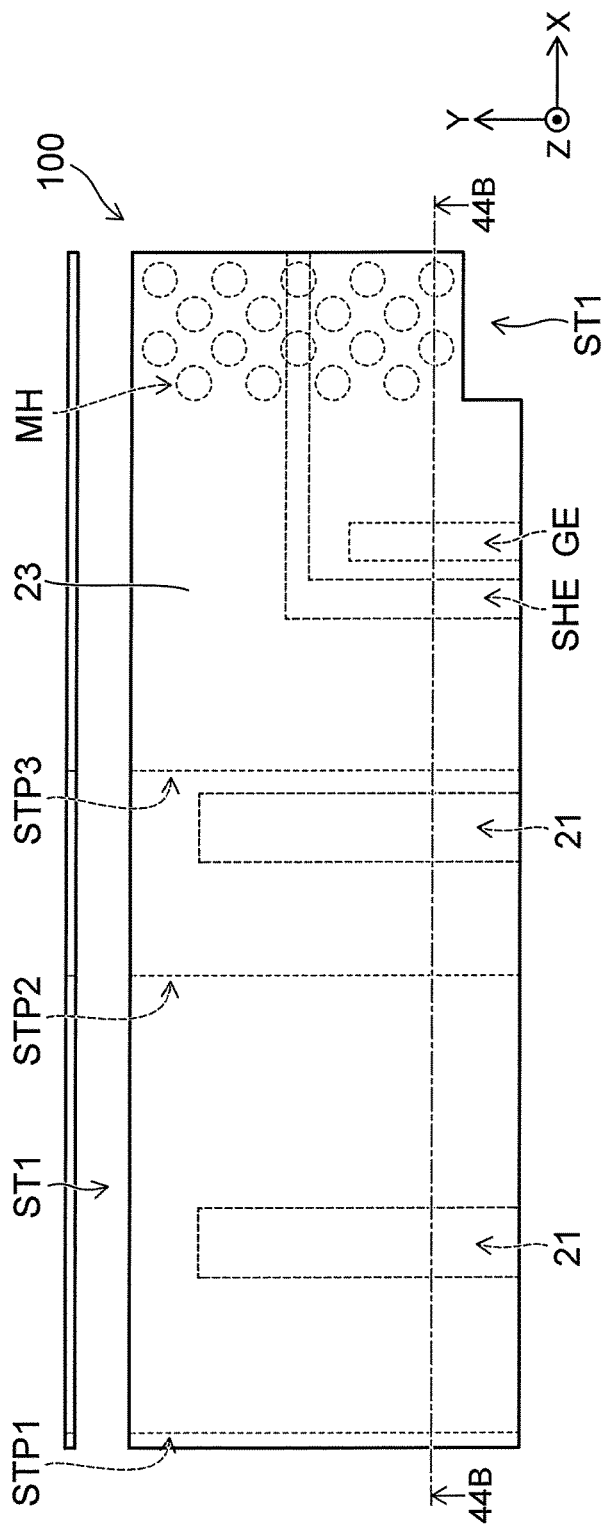
Figure 44B:
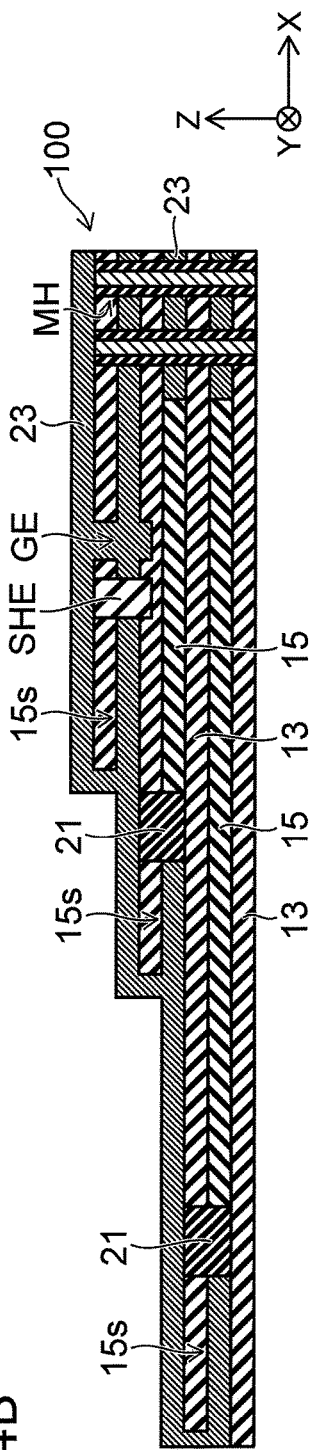

As shown in FIGS. 44A and 44B, the metal film 23 that covers the upper surface of the stacked body 100 and fills the space 15s is formed. The metal film 23 is, for example, a tungsten film formed using CVD (Chemical Vapor Deposition).

Figure 45A:
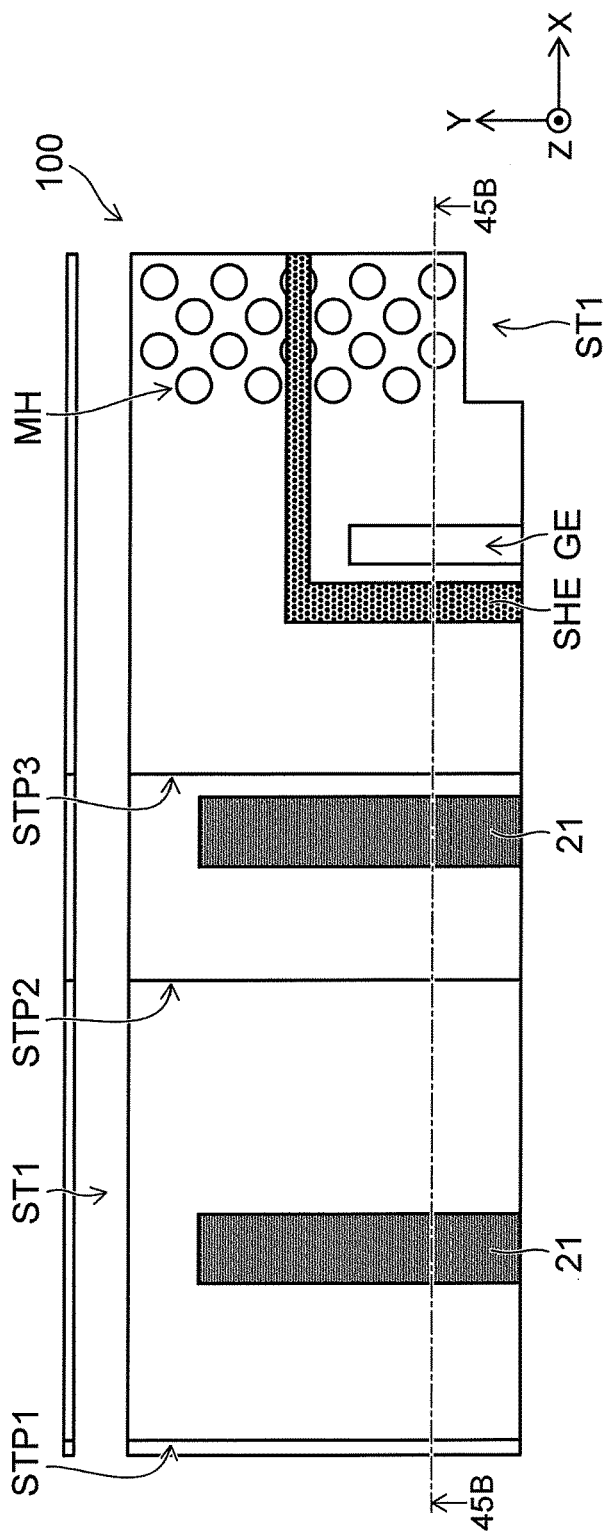
Figure 45B:
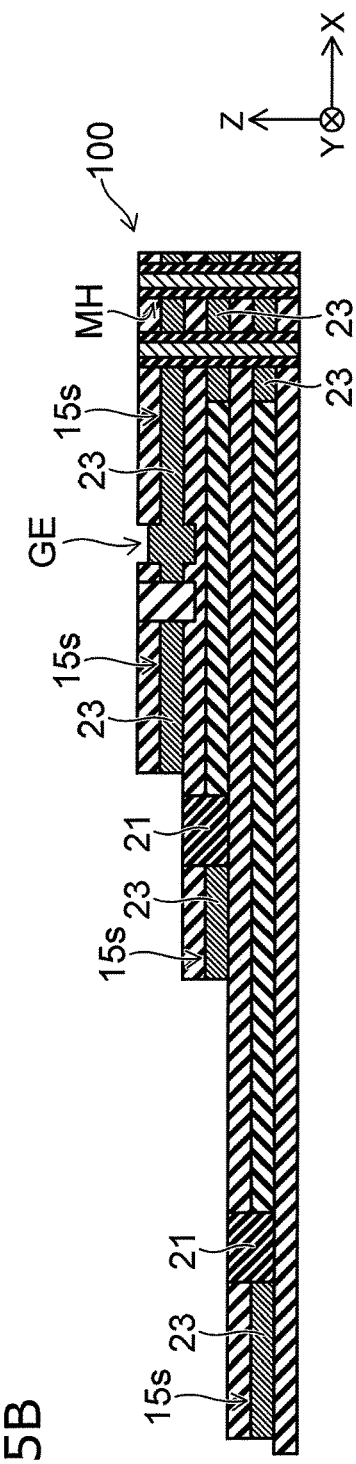

As shown in FIGS. 45A and 45B, the metal film 23 that covers the upper surface of the stacked body 100 and the inner surface of the slit ST1 is removed while causing the portion filled into the space 15s to remain. For example, the metal film 23 is removed using anisotropic RIE.

As shown in FIGS. 46A and 46B, the slit ST2 is formed; and the metal films 23 in the draw-out region HUR are divided. The slit ST2 extends in the X-direction and is formed to communicate with the slit ST1b. Thereby, the word line WL and the selection gates SGS, SGD1, and SGD2 are formed in which the metal films 23 are subdivided. The end portion WLE of the word line WL, the end portion SGSE of the selection gate SGS, and the selection gate SGD1 are formed respectively at the level differences STP1 to STP3.

As shown in FIG. 47, in the draw-out region HUR, the slit ST2 divides the portions of the metal films 23 positioned between the slits ST1a. Before forming the slit ST2, the metal films 23 in the memory cell region MCR are divided into the portions used to form the first regions WLP1 of the word lines WL; but in the draw-out region HUR, the portions used to form the word lines WL remain linked as-is. Therefore, the insulating films 15 can remain in the portions used to form the recesses RP of the word lines WL. Then, after forming the metal film 23 in the space 15s where the insulating films 15 are removed, the word lines WL that have the recesses RP can be formed by forming the slit ST2.

Figure 48A:
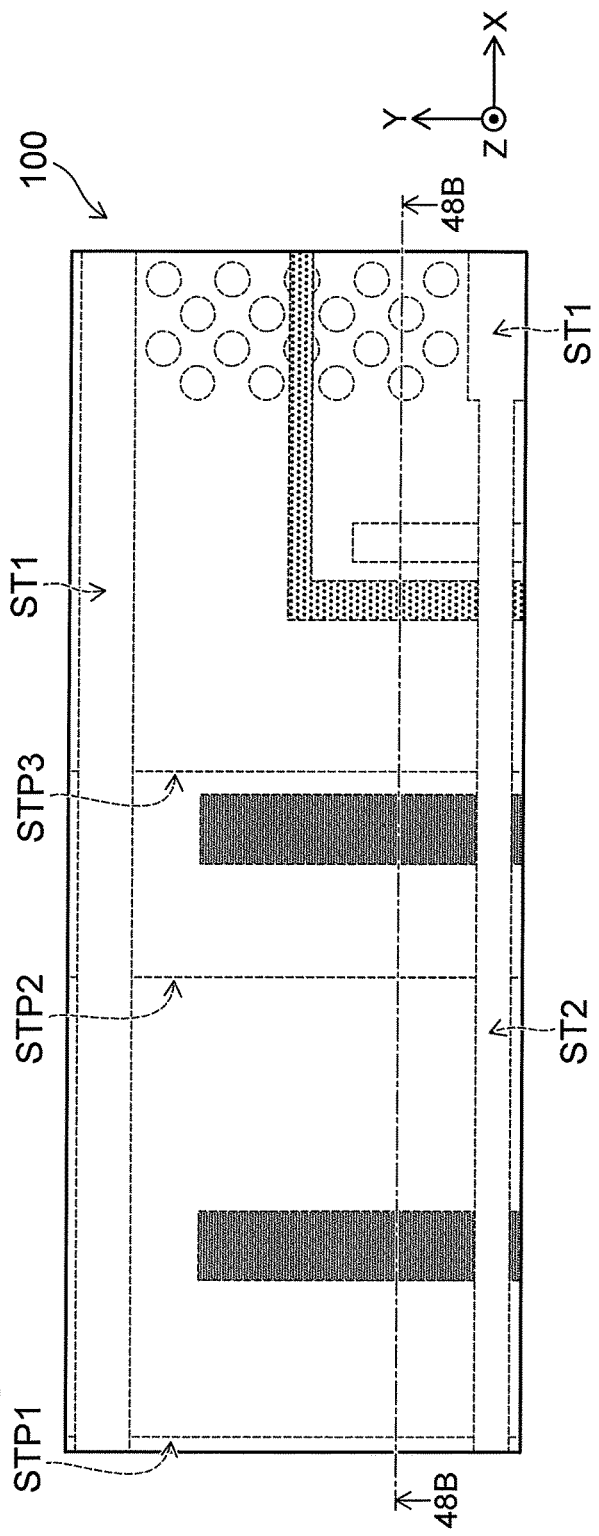
Figure 48B:
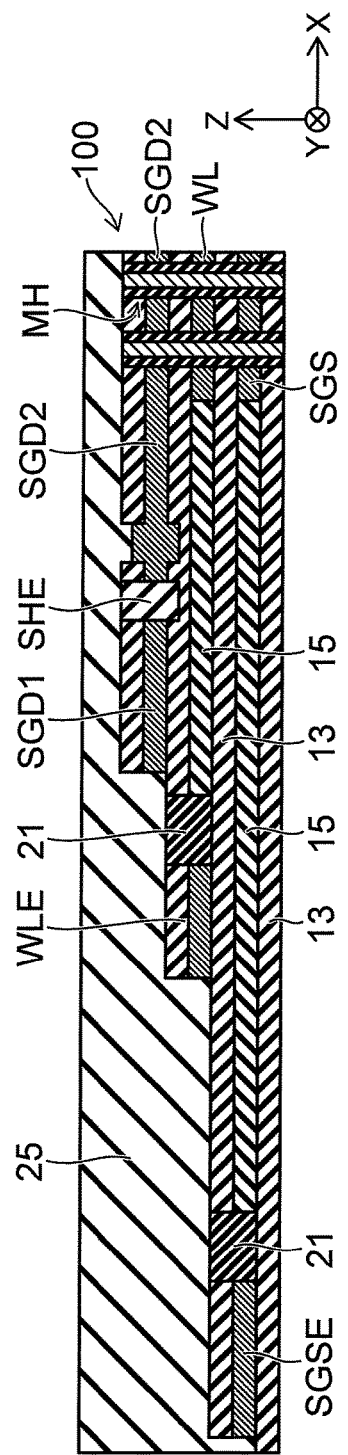

As shown in FIGS. 48A and 48B, the insulating film 25 that covers the upper surface of the stacked body 100 and fills the interiors of the slits ST1 and ST2 is formed. The insulating film 25 is, for example, a silicon oxide film formed using TEOS-CVD. The insulating film 25 buries the level differences STP1 to STP3 and has an upper surface planarized using, for example, CMP (Chemical Mechanical Polishing).

Figure 49A:
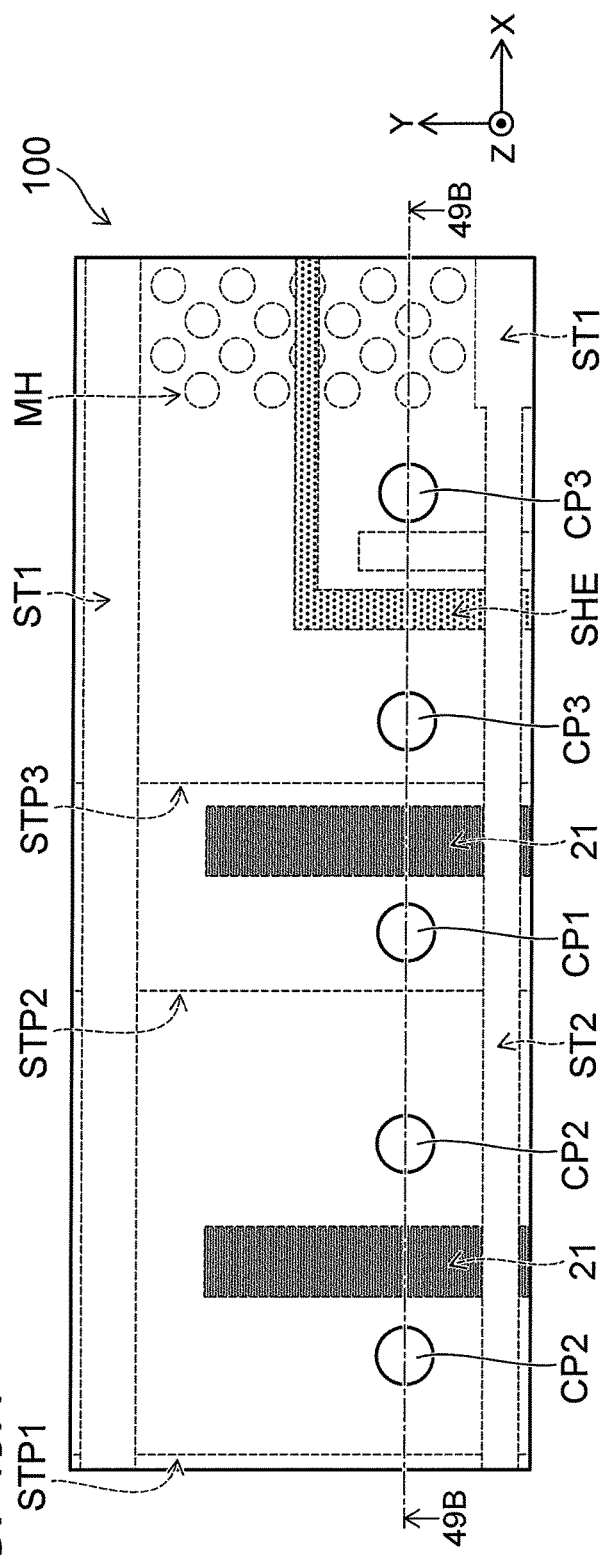
Figure 49B:
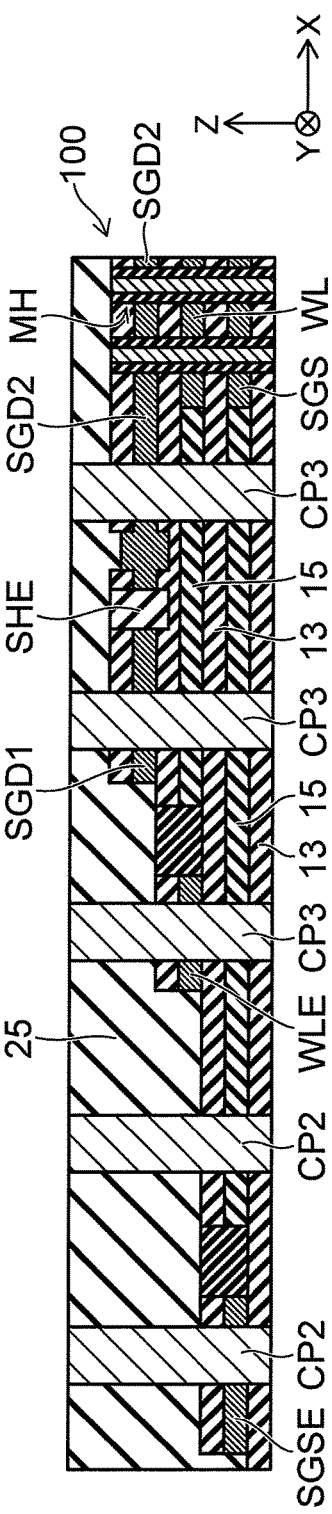

As shown in FIGS. 49A and 49B, the contact plugs CP that extend in the Z-direction and pierce the stacked body 100 and the insulating film 25 are formed. The contact plugs CP include the contact plug CP1 connected to the word line WL, the contact plug CP2 connected to the selection gate SGS, and the contact plug CP3 connected to the selection gate SGD.

Figure 50:
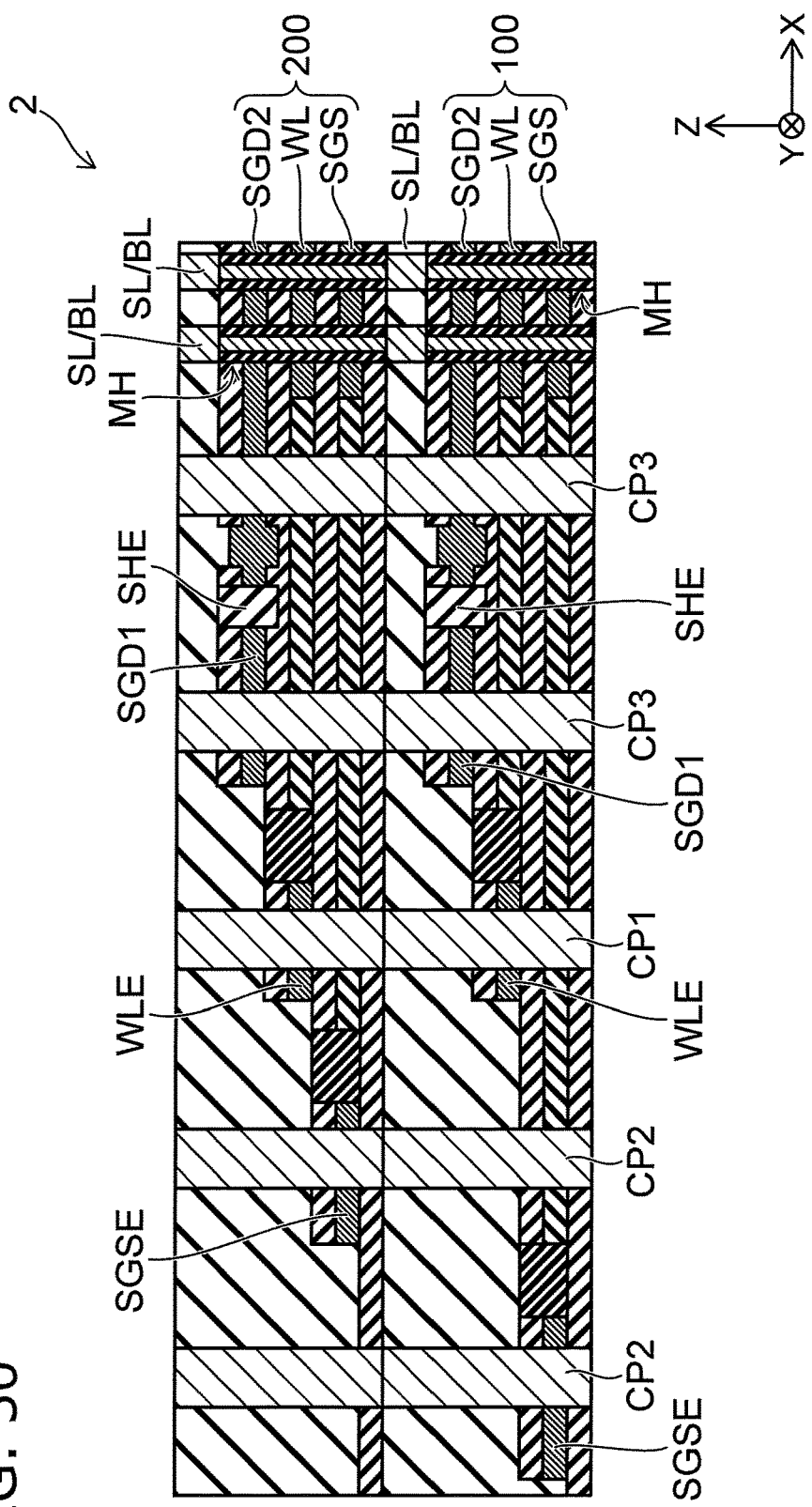

As shown in FIG. 50, the stacked body 200 is formed on the stacked body 100. The stacked body 200 can be formed by repeating the processes shown in FIG. 31A to FIG. 49B.

The memory device 2 is formed by stacking any number of stacked bodies by repeating the processes shown in FIG. 31A to FIG. 49B. Here, each stacked body corresponds to the memory cell array MCA shown in FIG. 1A.

In the embodiment, in addition to the multiple word lines WL sharing the contact plug CP1, a configuration is used in which the contact plug CP3 is shared by the selection gates SGD of each memory cell array MCA. In such a case, the data can be programmed to and read from the selected memory cell MC by appropriately controlling the potential of the interconnect SL/BL provided between the memory cell arrays MCA.

Figure 51:
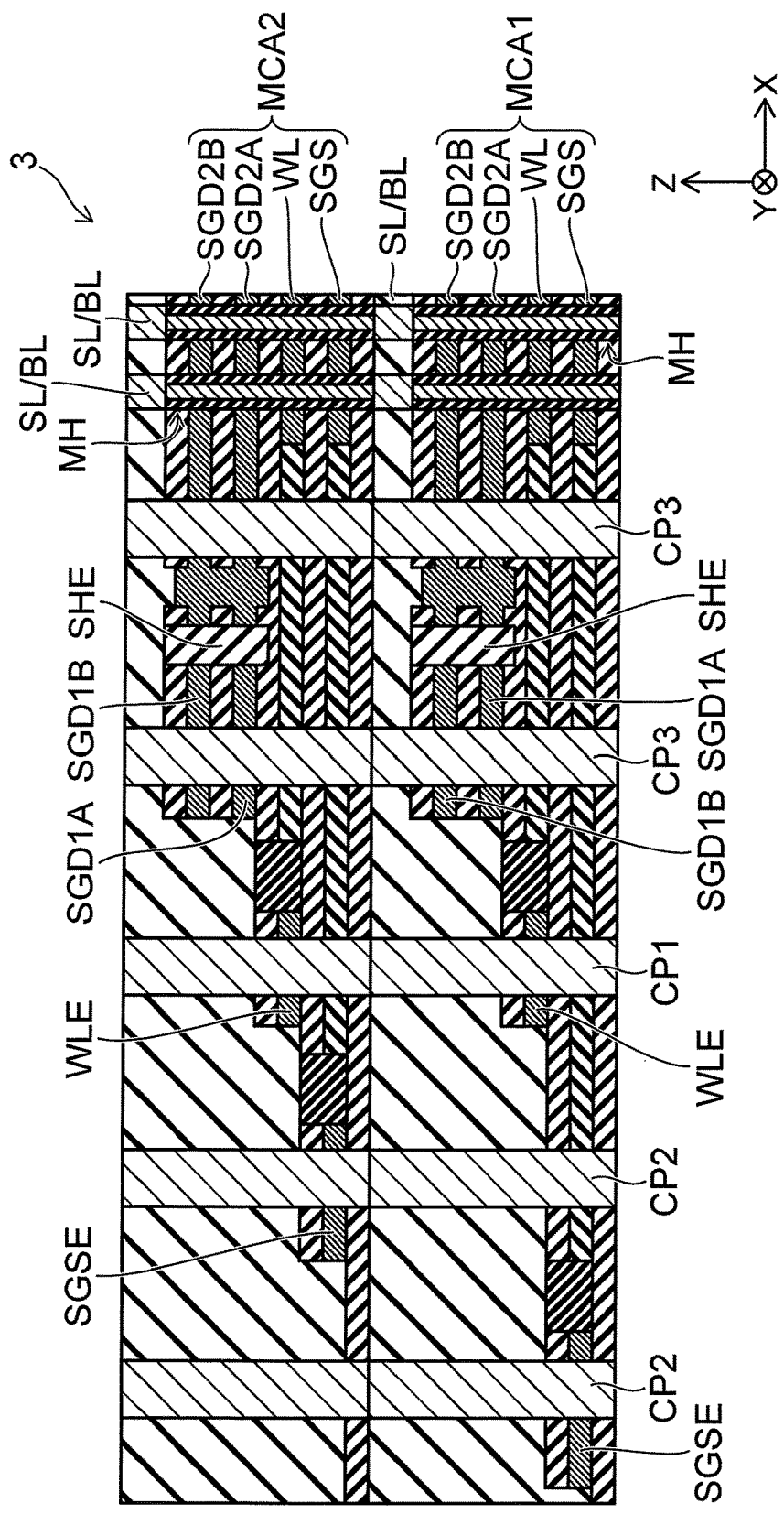
FIG. 51 is a schematic view showing a memory device according to a variation of the second embodiment.

FIG. 51 is a schematic view showing a memory device 3 according to a variation of the second embodiment. The memory device 3 includes the memory cell arrays MCA1 and MCA2 stacked in the Z-direction. The number of stacks of the memory cell arrays MCA is arbitrary and can be formed by, for example, repeating the processes of FIG. 31A to FIG. 49B.

Each of the memory cell arrays MCA includes multiple selection gates SGD stacked in the Z-direction. In the example, each of the memory cell arrays MCA includes a pair of selection gates SGD1A and SGD1B and a pair of selection gates SGD2A and SGD2B; and each pair is stacked in the Z-direction. The number of stacks of the selection gates SGD is arbitrary and may be three or more. The selection gates SGD that are stacked in the Z-direction are electrically connected by the contact plug CP3.

In the embodiment as well, the size of the draw-out region HUR can be reduced because the contact plug CP1 that extends in the Z-direction in the draw-out region HUR is shared by one of the word lines WL included in each memory cell array MCA. Thereby, for the memory devices 2 and 3, it is possible to increase the surface area of the memory cell region MCR in the chip surface; and the memory capacity can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
   a plurality of first electrode layers stacked in a first direction;
   a first semiconductor pillar extending in the first direction and piercing the first electrode layers;
   a plurality of second electrode layers stacked in the first direction
   a second semiconductor pillar extending in the first direction and piercing the second electrode layers;
   an interconnect provided between the first electrode layers and the second electrode layers in the first direction, a second electrode layer positioned at the bottom of the second electrode layers being stacked above a first electrode layer positioned at the top of the first electrode layers with the interconnect interposed, the interconnect being electrically connected to the first semiconductor pillar and the second semiconductor pillar; and
   a first connecting conductor connected to one of the first electrode layers and one of the second electrode layers, the first connecting conductor extending in the first direction, and crossing at least one of the second electrode layers.

2. The device according to claim 1, wherein the first connecting conductor contacts the one of the second electrode layers at a portion where the first connecting conductor pierces the second electrode layers.

3. The device according to claim 1, wherein
   the first electrode layers include first end portions provided in a staircase configuration,
   the second electrode layers include second end portions provided in a staircase configuration, and
   the first connecting conductor is connected to one of the first end portions and one of the second end portions.

4. The device according to claim 3, wherein the one of the second end portions is provided to overlap the one of the first end portions in the first direction.

5. The device according to claim 1, wherein the first connecting conductor is connected to an end portion of the one of the first electrode layers, and pierces in the first direction an end portion of the one of the second electrode layers.

6. The device according to claim 1, further comprising a second connecting conductor electrically connected to another one of the first electrode layers and another one of the second electrode layers, the one of the second electrode layers including a first region, an end portion, and a second region, the first region crossing the second semiconductor pillar, the end portion being separated from the first region, the second region linking the first region and the end portion, the one of the second electrode layers having a recess between the first region and the end portion, the second region being recessed in a direction crossing the first direction at the recess, the second connecting conductor extending in the first direction and passing through the recess without contacting the one of the second electrode layers.

7. The device according to claim 1, wherein the first connecting conductor includes a first portion and a second portion, the first portion piercing the one of the first electrode layers, the second portion piercing the one of the second electrode layers.

8. The device according to claim 1, further comprising:

a third connecting conductor connected to a first electrode layer positioned at an end in the first direction of the first electrode layers, the third connecting conductor not being connected to any of the first electrode layers other than the first electrode layer positioned at the end in the first direction, and the third connecting conductor not being connected to any of the second electrode layers; and a fourth connecting conductor connected to a second electrode layer positioned at an end in the first direction of the second electrode layers, the fourth connecting conductor not being connected to any of the first electrode layers, and the fourth connecting conductor not being connected to any of the second electrode layers other than the second electrode layer positioned at the end in the first direction.

9. The device according to claim 8, wherein the first electrode layers each include a first region, a first end portion, and a second region, the first region crossing the first semiconductor pillar, the first end portion being separated from the first region, and the second region linking the first region and the first end portion, the first electrode layers each have a first recess between the first region and the first end portion, the second region being recessed in a direction crossing the first direction at the first recess, the second electrode layers each include a third region, a second end portion, and a fourth region, the third region crossing the second semiconductor pillar, the second end portion being separated from the third region, and the fourth region linking the third region and the second end portion, the second electrode layers each have a second recess between the third region and the second end portion, the fourth region being recessed in a direction crossing the first direction at the second recess, the third connecting conductor extends in the first direction, passes through the first recesses of the first electrode layers other than the first electrode layer positioned at the end in the first direction, and passes through the second recesses of the second electrode layers, and the fourth connecting conductor extends in the first direction, passes through the first recesses of the first electrode layers, and passes through the second recesses of the second electrode layers other than the second electrode layer positioned at the end in the first direction.

10. The device according to claim 9, wherein the first connecting conductor, the third connecting conductor, and the fourth connecting conductor are arranged in a direction from the first end portion toward the first region.

11. The device according to claim 9, further comprising:

first insulating films each provided between the adjacent first electrode layers in the first direction; and second insulating films each provided in the first recess, the first connecting conductor, the second connecting conductor, and the third connecting conductor extending in the first direction and piercing the first insulating films and the second insulating films, the first insulating films and the second insulating films being arranged alternately.

12. The device according to claim 1, wherein a first electrode layer positioned at an end in the first direction is divided into two portions by a first trench, and a second electrode layer positioned at an end in the first direction is divided into two portions by a second trench.

13. The device according to claim 12, further comprising:

fifth connecting conductors connected respectively to the two portions of the first electrode layer positioned at the end in the first direction divided by the first trench, and two portions of the second electrode layer positioned at the end in the first direction divided by the second trench.

\* \* \* \* \*